(12) United States Patent
Tanaka

(10) Patent No.: US 11,444,079 B2
(45) Date of Patent: Sep. 13, 2022

(54) SEMICONDUCTOR DEVICE

(71) Applicant: SOCIONEXT INC., Kanagawa (JP)

(72) Inventor: Hidetoshi Tanaka, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 17/002,392

(22) Filed: Aug. 25, 2020

(65) Prior Publication Data

US 2020/0388615 A1 Dec. 10, 2020

Related U.S. Application Data

(63) Continuation of application No. PCT/JP2018/007725, filed on Mar. 1, 2018.

(51) Int. Cl.
| | |
|---|---|
| *H01L 27/088* | (2006.01) |
| *H01L 29/78* | (2006.01) |
| *H01L 23/535* | (2006.01) |
| *H01L 29/06* | (2006.01) |

(52) U.S. Cl.
CPC .......... *H01L 27/088* (2013.01); *H01L 23/535* (2013.01); *H01L 29/0676* (2013.01); *H01L 29/7827* (2013.01)

(58) Field of Classification Search
CPC ........... H01L 21/768; H01L 21/823481; H01L 21/823871; H01L 21/823885; H01L 23/52; H01L 23/535; H01L 27/0207; H01L 27/0617; H01L 27/0629; H01L 27/088;

(Continued)

(56) References Cited

U.S. PATENT DOCUMENTS 9,177,924 B2  11/2015 Colinge et al.
9,515,077 B1 * 12/2016 Liaw .................. H01L 29/1095
9,646,973 B2   5/2017 Liaw
(Continued)

FOREIGN PATENT DOCUMENTS

| JP | 2016-054183 A | 4/2016 |
|---|---|---|
| WO | 2015/019470 A1 | 2/2015 |

OTHER PUBLICATIONS

International Search Report and Written Opinion issued in International Patent Applciation No. PCT/JP2018/007725, dated May 22, 2018; with partial English translation.

(Continued)

*Primary Examiner* — David C Spalla
(74) *Attorney, Agent, or Firm* — McDermott Will & Emery LLP

(57) ABSTRACT

A semiconductor device includes: a semiconductor substrate; a VNW transistor being a functional element provided with a first projection formed on the semiconductor substrate, having a semiconductor material, and having a lower end and an upper end; a dummy functional element provided with a second projection formed on the semiconductor substrate, having a semiconductor material, having a lower end and an upper end, and arranged side by side with the first projection; and a first wiring formed above the first projection and above the second projection, electrically connected to the upper end of the first projection, and electrically isolated from the upper end of the second projection. Consequently, the semiconductor device capable of suppressing variation in characteristics of the VNW transistors is realized.

17 Claims, 42 Drawing Sheets

(58) Field of Classification Search
CPC ........... H01L 27/11807; H01L 29/0676; H01L 29/66666; H01L 29/7827; H01L 29/78642
See application file for complete search history.

(56) References Cited

U.S. PATENT DOCUMENTS

| | | | |
|---|---|---|---|
| 9,653,585 B2 | 5/2017 | Zhang | |
| 10,361,293 B1* | 7/2019 | Tsai | ................... H01L 27/0629 |
| 2010/0219483 A1* | 9/2010 | Masuoka | ............ H01L 27/1104 |
| | | | 257/369 |
| 2015/0370951 A1 | 12/2015 | Kawa et al. | |
| 2016/0005763 A1* | 1/2016 | Masuoka | ............ H01L 27/1203 |
| | | | 257/329 |
| 2016/0005764 A1 | 1/2016 | Masuoka et al. | |
| 2017/0222045 A1 | 8/2017 | Leobandung | |
| 2019/0206736 A1* | 7/2019 | Sills | ................... H01L 23/5226 |

OTHER PUBLICATIONS

Notice of Reasons for Refusal dated Apr. 26, 2022 issued in the corresponding Japanese Patent Application No. 2020-503201, with English translation.

* cited by examiner

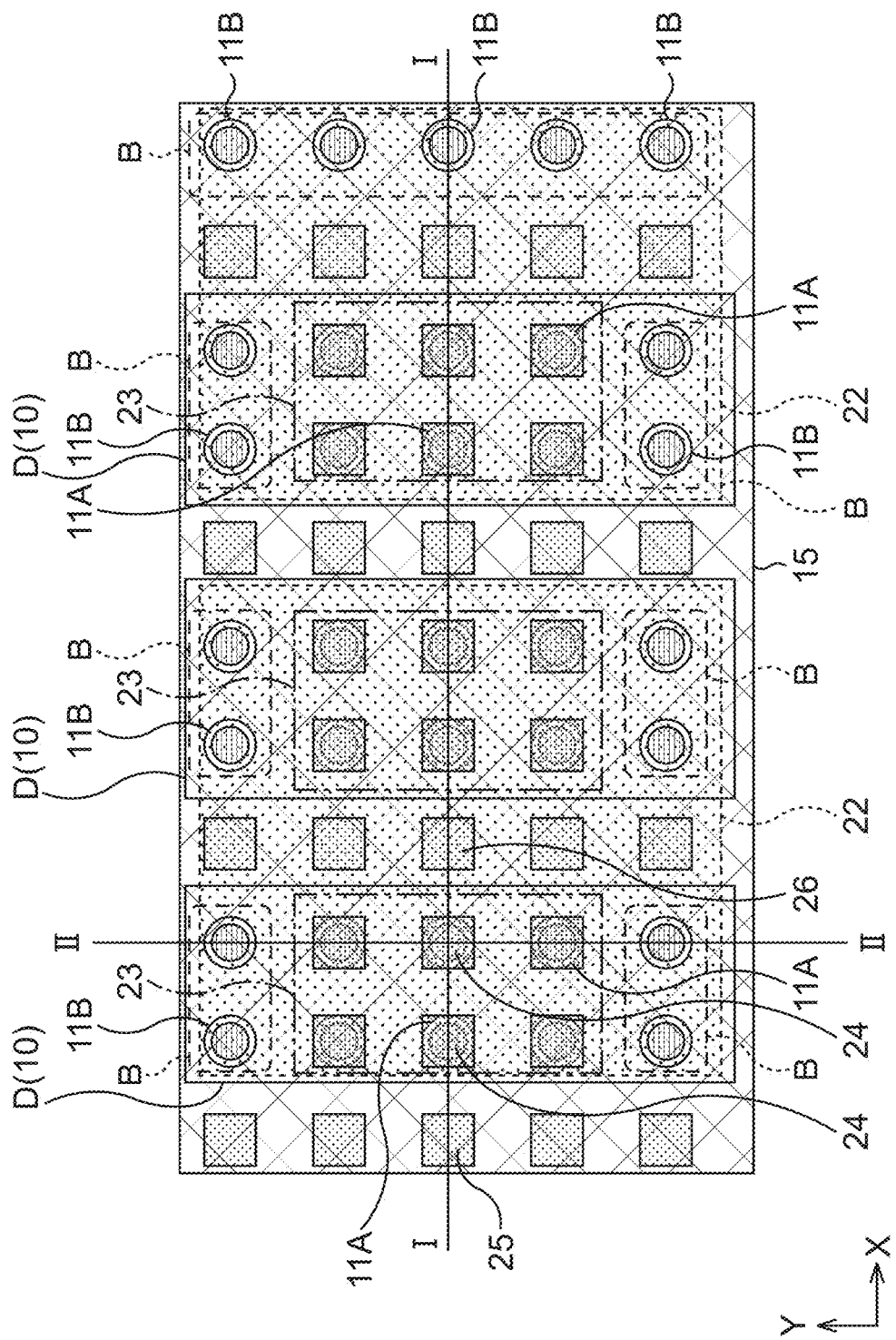

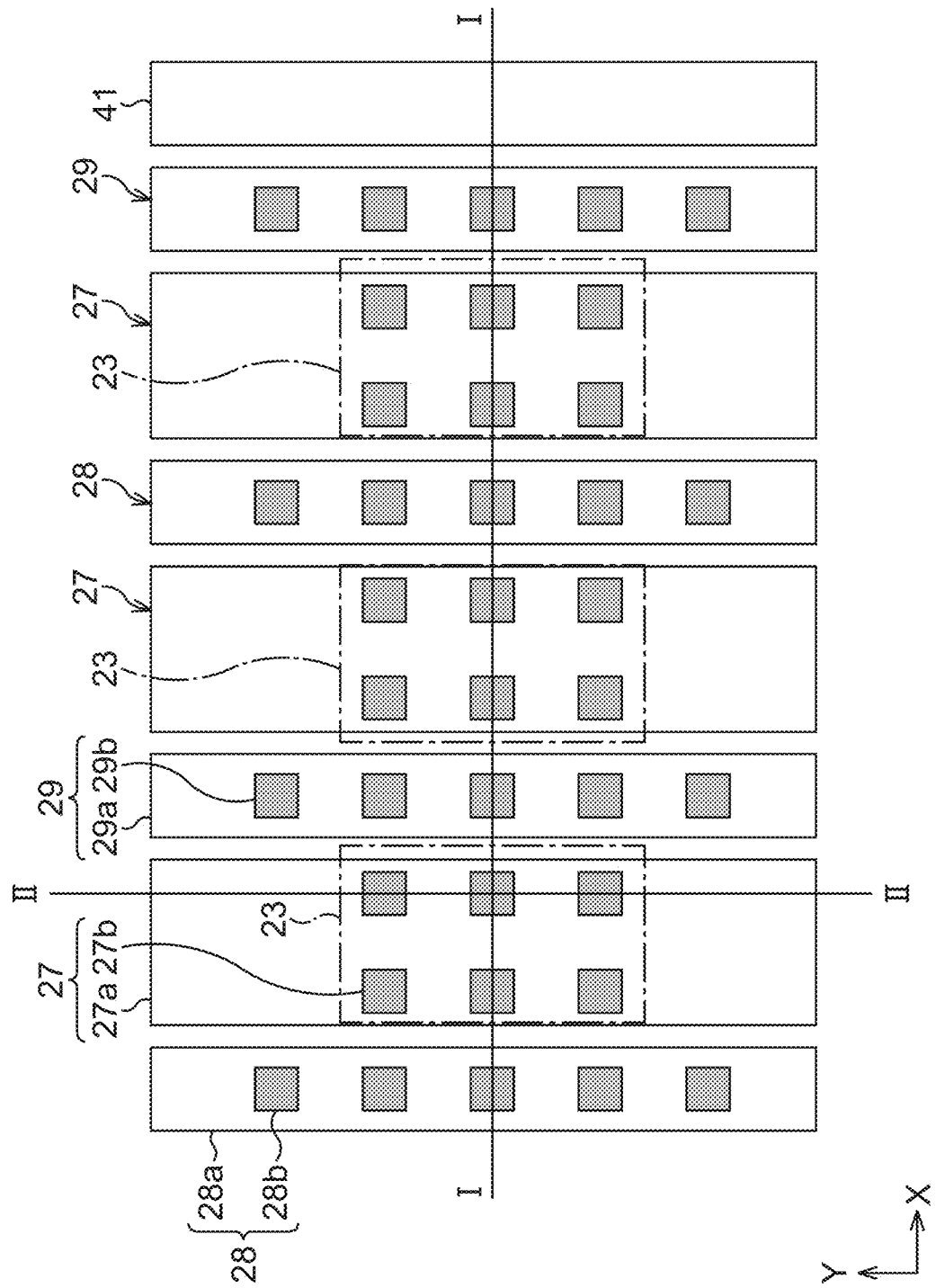

SEMICONDUCTOR DEVICE

CROSS-REFERENCE TO RELATED APPLICATION

This application is a continuation application of International Application PCT/JP2018/007725 filed on Mar. 1, 2018, and designated the U.S., the entire contents of which are incorporated herein by reference.

FIELD

The embodiments discussed herein are directed to a semiconductor device.

BACKGROUND

Recently, in order to deal with an increasing demand for microfabrication and downsizing of a semiconductor device, a functional element (VNW element) using a projecting nanowire (Vertical Nano Wire: VNW) having a semiconductor material and provided in a standing manner in a vertical direction on a semiconductor substrate, has been devised. The VNW elements include a VNW diode, a VNW transistor, a VNW resistor element, and so on.

Patent Document 1: Description of U.S. Pat. No. 9,653,585
Patent Document 2: Description of U.S. Pat. No. 9,646,973
Patent Document 3: Description of U.S. Pat. No. 9,177,924

When forming plural VNW elements (VNW element group), VNW elements positioned at a peripheral part of the VNW element group sometimes have different dimensions, different impurity profiles, and the like due to a manufacturing variation when compared to VNW elements positioned on the inner side of the VNW element group. Accordingly, there is a problem that various characteristics such as a resistance value of the VNW elements vary in the VNW element group.

SUMMARY

One example of a semiconductor device includes: a semiconductor substrate; a functional element provided with a first projection formed on the semiconductor substrate, having a semiconductor material, and having a lower end and an upper end; a dummy functional element provided with a second projection formed on the semiconductor substrate, having a semiconductor material, having a lower end and an upper end, and arranged side by side with the first projection in a plane view; and a first wiring formed above the first projection and above the second projection, electrically connected to the upper end of the first projection, and electrically isolated from the upper end of the second projection.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 9 is a plan view illustrating, regarding the semiconductor device including the VNW transistors according to the modified example 3 of the first embodiment, a schematic configuration as a result of removing a wiring structure on contact plugs from FIG. 8;

FIG. 10 is a plan view illustrating, regarding the semiconductor device including the VNW transistors according to the modified example 3 of the first embodiment, a schematic configuration of only top plates and wirings above the top plates in FIG. 8;

DESCRIPTION OF EMBODIMENTS

Figure 1:
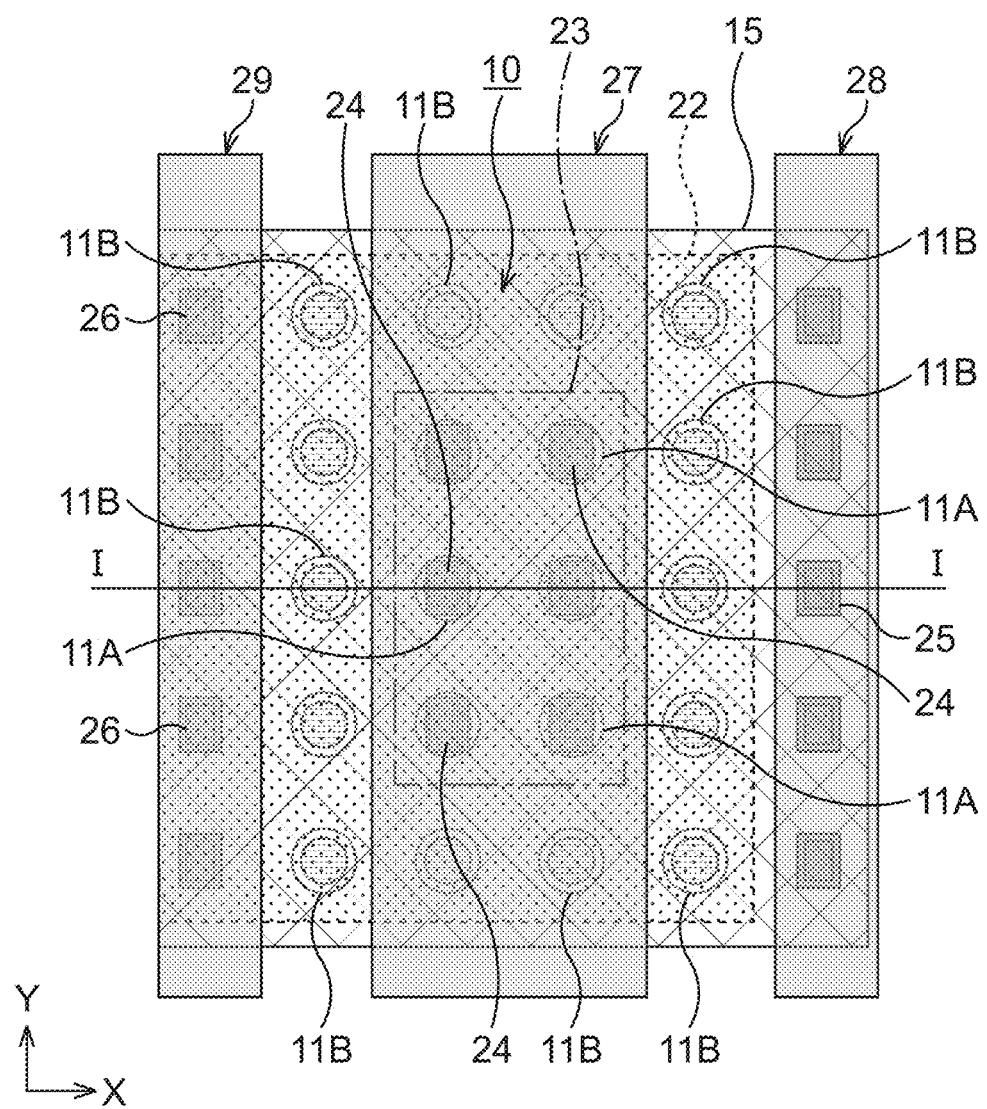
FIG. 1 is a plan view illustrating a schematic configuration of a semiconductor device including VNW transistors according to a first embodiment.

Hereinafter, various embodiments of a semiconductor device including VNW elements will be described in detail while referring to the drawings.

First Embodiment

Figure 2:
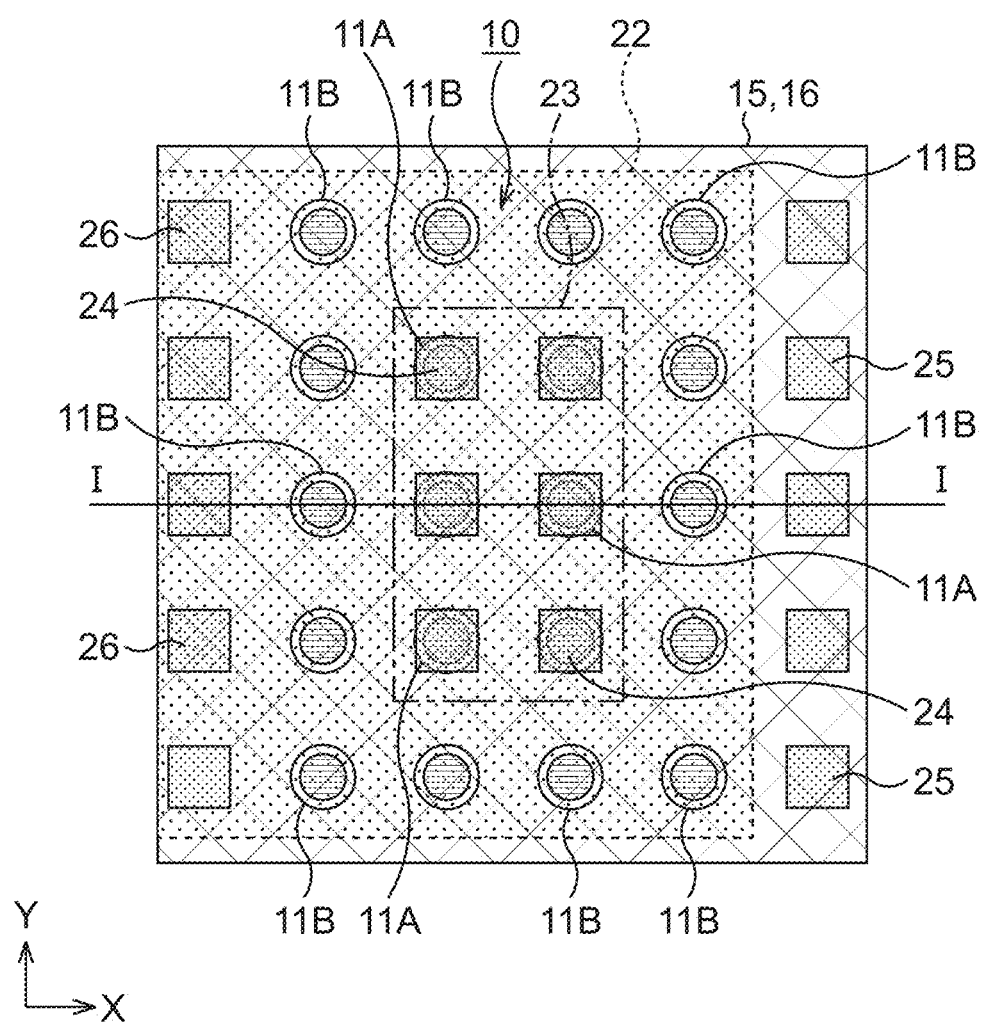
FIG. 2 is a plan view illustrating, regarding the semiconductor device including the VNW transistors according to the first embodiment, a schematic configuration as a result of removing a wiring structure on contact plugs from FIG. 1.
Figure 3:
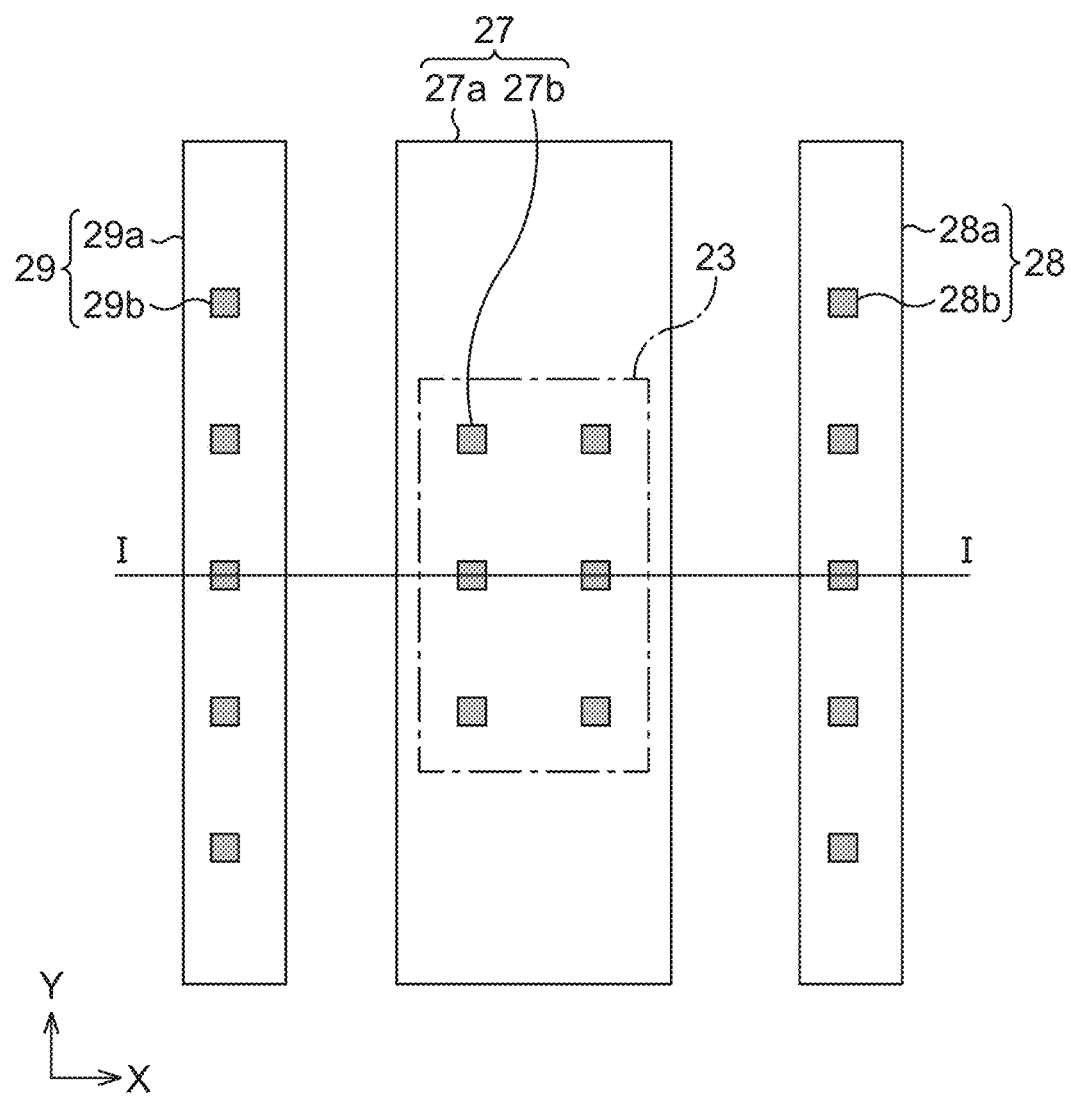
FIG. 3 is a plan view illustrating, regarding the semiconductor device including the VNW transistors according to the first embodiment, a schematic configuration of only a top plate and wirings above the top plate in FIG. 1.
Figure 4:
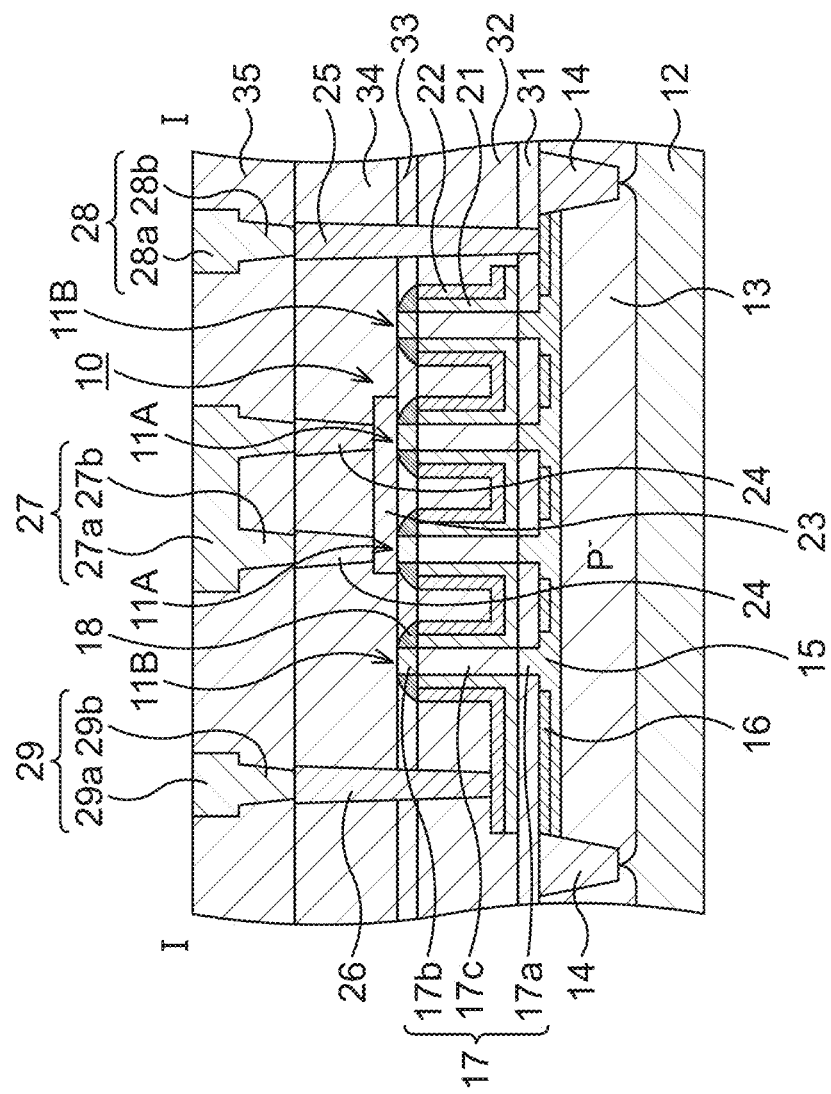
FIG. 4 is a sectional view illustrating a cross section taken along a line segment I-I in FIG. 1.

The present embodiment discloses a semiconductor device including VNW transistors as VNW elements. FIG. 1 is a plan view illustrating a schematic configuration of a semiconductor device including VNW transistors according to a first embodiment. FIG. 2 is a plan view illustrating, regarding the semiconductor device including the VNW transistors according to the first embodiment, a schematic configuration as a result of removing a wiring structure on contact plugs from FIG. 1. FIG. 3 is a plan view illustrating, regarding the semiconductor device including the VNW transistors according to the first embodiment, a schematic configuration of only a top plate and wirings above the top plate in FIG. 1. FIG. 4 is a sectional view illustrating a cross section taken along a line segment I-I in FIG. 1.

This semiconductor device has VNW transistors arranged in a VNW transistor arrangement region 10, for example, arranged in an aggregated manner in a matrix form in a plane view. In the VNW transistor arrangement region 10, four VNW transistors in an X direction and five VNW transistors in a Y direction, namely, twenty VNW transistors in total, are arranged in a matrix form, for example, in FIG. 1 and FIG. 2. The VNW transistor arrangement region 10 is, for example, a rectangular region in a plane view having a side along the X direction and a side along the Y direction. In the VNW transistor arrangement region 10, six VNW transistors aggregated on the inner side in a plane view are VNW transistors 11A which are electrically connected to a wiring structure above the VNW transistors, to thereby function as transistors. Fourteen VNW transistors provided at the periphery of these VNW transistors 11A (at an outermost part of the VNW transistor arrangement region 10) in a plane view, are dummy VNW transistors 11B which are not electrically connected to (which are electrically isolated from) a wiring structure above the VNW transistors. Note that the VNW transistors 11A and the dummy VNW transistors 11B at the periphery of the VNW transistors 11A may also be arranged in a form other than the matrix form in a plane view. The number of the VNW transistors 11A and the dummy VNW transistors 11B to be arranged may also be different from the above-described number. Note that the "side" in the present application means, in a virtual region having a rectangular shape in a plane view (the VNW transistor arrangement region 10 or the like), one side of the rectangular shape. In the virtual region, a configuration of the VNW transistors 11A, the dummy VNW transistors 11B, and so on is arranged. Note that the shape of the region in a plane view is not limited to the rectangular shape, and, for example, a triangular shape, other polygonal shapes, and the like may also be employed.

As illustrated in FIG. 4, in a region of a semiconductor substrate 12 demarcated by an STI element isolation region 14, a well 13 having a conductivity type of P-type, for example, is formed. On an upper part of the well 13, a bottom region 15 having a conductivity type of N-type is formed. On the surface of the semiconductor substrate 12, which is also an upper part of the bottom region 15, a silicide layer 16 is formed.

The substrate 12 is, for example, a substrate composed of bulk Si, germanium (Ge), a chemical compound or an alloy of Si or Ge, and in addition to that, it is a substrate composed of one kind selected from SiC, SiP, SiPC, GaAs, GaP, InP, InAs, In, Sb, SiGe, GaAcP, AlInAs, GaInAs, GaInP, and GaInAsP, or a combination thereof, and the like. It is also possible to use an SOI substrate.

The P-type well 13 is formed in a manner that a P-type impurity is ion-implanted into the substrate 12. As the P-type impurity, one kind or plural kinds selected from B, $BF_2$, In, and N is/are used.

The STI element isolation region 14 is formed in a manner that an insulating material is filled in an opening formed on the substrate 12. As the insulating material, it is possible to use, for example, SiO, PSG (phosphorus silicate glass), BSG (boron silicate glass), BPSG (boron-phosphorus silicate glass), USG (undoped silicate glass), or a combination thereof.

The bottom region 15 is formed in a manner that an N-type impurity is ion-implanted into the substrate 12. As the N-type impurity, one kind or plural kinds selected from As, P, Sb, and N is/are used. The silicide layer 16 is formed in a manner that a metal film is formed on a surface of the bottom region 15, and heat treatment is performed to turn the surface of the bottom region 15 into silicide. As a material of the metal film, for example, Ni, Co, Mo, W, Pt, Ti, or the like is used.

On the semiconductor substrate 12, plural projecting semiconductor nanowires 17 are vertically formed from the surface of the semiconductor substrate 12. As illustrated in FIG. 1 and FIG. 2, the plural semiconductor nanowires 17 are arranged in a matrix form in a plane view. Each of the plural semiconductor nanowires 17 is formed with a VNW transistor having a lower end portion 17a, an upper end portion 17b, and a middle portion 17c between the lower end portion 17a and the upper end portion 17b. The plural VNW transistors are made as the VNW transistors 11A and the dummy VNW transistors 11B at the periphery of the VNW transistors 11A, as described above. The lower end portion 17a has a conductivity type of N-type, and is electrically connected to the bottom region 15. The upper end portion 17b has a conductivity type of N-type. The middle portion 17c has a conductivity type of P-type, and it becomes a channel region. One of the lower end portion 17a and the upper end portion 17b becomes a source electrode, and the other becomes a drain electrode. On side surfaces of the upper end portion 17b, a sidewall 18 of an insulating film is formed. The lower end portions 17a of the VNW transistors 11A and the dummy VNW transistors 11B are electrically connected to each other by the bottom region 15. Note that it is also possible that the lower end portion 17a and the upper end portion 17b are formed to have the conductivity type of N-type, and the middle portion 17c is formed to have the conductivity type of P-type. Further, when the semiconductor substrate 12 is a P-type substrate, the formation of the P-well 13 may be omitted. A planar shape of the semiconductor nanowire 17 may be, for example, a circular shape, an elliptical shape, a quadrangular shape, or a shape extending in one direction. Further, the channel region of the middle portion 17c may also be a non-doped channel region in which an impurity is not implanted.

Regarding the semiconductor nanowire 17, the lower end portion 17a and the upper end portion 17b thereof are formed by ion implantation of the N-type impurity, and the middle portion 17c thereof is formed by ion implantation of the P-type impurity. As the P-type impurity, one kind or plural kinds selected from B, $BF_2$, In, and N is/are used. As the N-type impurity, one kind or plural kinds selected from As, P, Sb, and N is/are used.

The sidewall 18 is formed by using, as a material, an insulating material such as $SiO_2$, SiN, SiON, SiC, SiCN, or SiOCN.

On side surfaces of the semiconductor nanowire 17, a gate electrode 22 is formed via a gate insulating film 21. In the present embodiment, the gate electrode 22 for the plural semiconductor nanowires 17 is formed as a conductive film of one layer as a whole.

The gate insulating film 21 is formed by using, as a material, an insulating material having a dielectric constant k of 7 or more, for example, such as SiN, $Ta_2O_5$, $Al_2O_3$, or $HfO_2$, for example. The gate electrode 22 is formed by using, as a material, TiN, TaN, TiAl, TaAl, Ti-containing metal, Al-containing metal, W-containing metal, TiSi, NiSi, PtSi, polycrystalline silicon having silicide, or the like.

On the plural VNW transistors 11A, a top plate 23 of one layer being a conductive film of silicide, metal, or the like, is formed. The upper end portions 17b of the semiconductor nanowires 17 of the respective VNW transistors 11A are electrically connected to each other via the top plate 23. The top plate 23 is conducted to the respective VNW transistors 11A as a conductive film of one layer as a whole, for example. Note that in place of the top plate 23 of one layer connected to the plural VNW transistors 11A, it is also possible to provide plural top plates each connected to each of the VNW transistors 11A by corresponding to the individual VNW transistors 11A.

On the other hand, a top plate which is connected to the upper end portion 17b is not formed on the dummy VNW transistor 11B, and there is no electrical connection between the upper end portion 17b and another contact plug, wiring, or the like. Since the dummy VNW transistor 11B has the upper end portion 17b which is not connected to the electric conductor as described above and thus is in an electrically isolated state, the dummy VNW transistor 11B is in an electrically floating state and does not function as a transistor.

The top plate 23 is formed in a manner as follows, for example. FIG. 5A to FIG. 5D are schematic sectional views illustrating a method of forming the top plate 23 in order of processes.

Figure 5A:
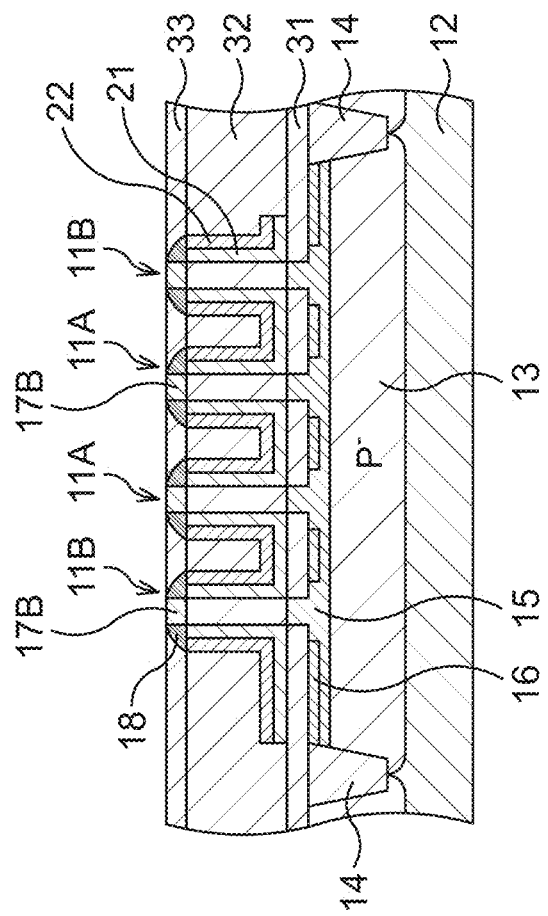
FIG. 5A is a schematic sectional view illustrating a method of forming a top plate in order of processes.

As illustrated in FIG. 5A, in an insulating film 31 and interlayer insulating films 32, 33, the VNW transistors 11A and the dummy VNW transistors 11B are formed. A surface of the interlayer insulating film 33 is desirably flattened, and from the surface, upper surfaces of the upper end portions 17b of the VNW transistors 11A and the dummy VNW transistors 11B are exposed.

Figure 5B:
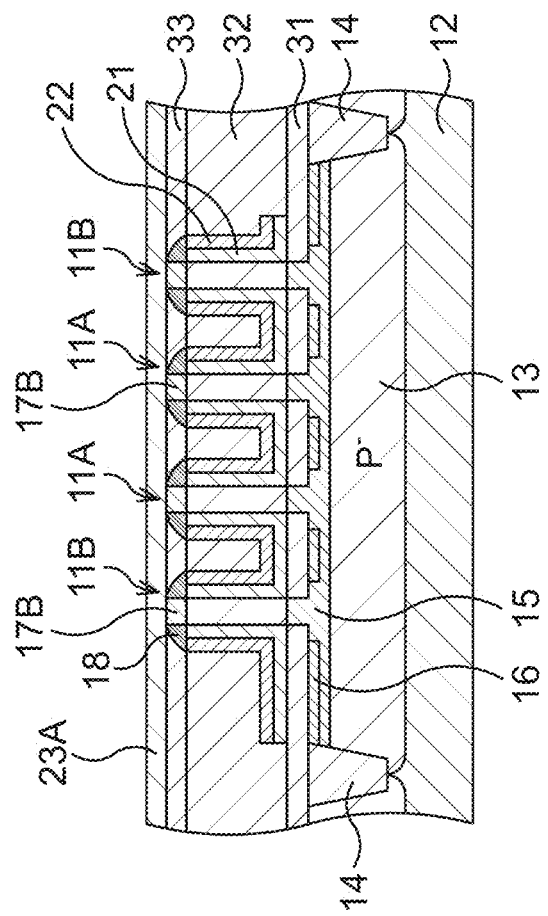
FIG. 5B is a schematic sectional view illustrating the method of forming the top plate in order of processes, continued from FIG. 5A.

Following the state of FIG. 5A, a semiconductor film 23A is formed on the interlayer insulating film 33, as illustrated in FIG. 5B. As a material of the semiconductor film 23A, a semiconductor of polycrystalline silicon, amorphous silicon, or the like, for example, is used.

Figure 5C:
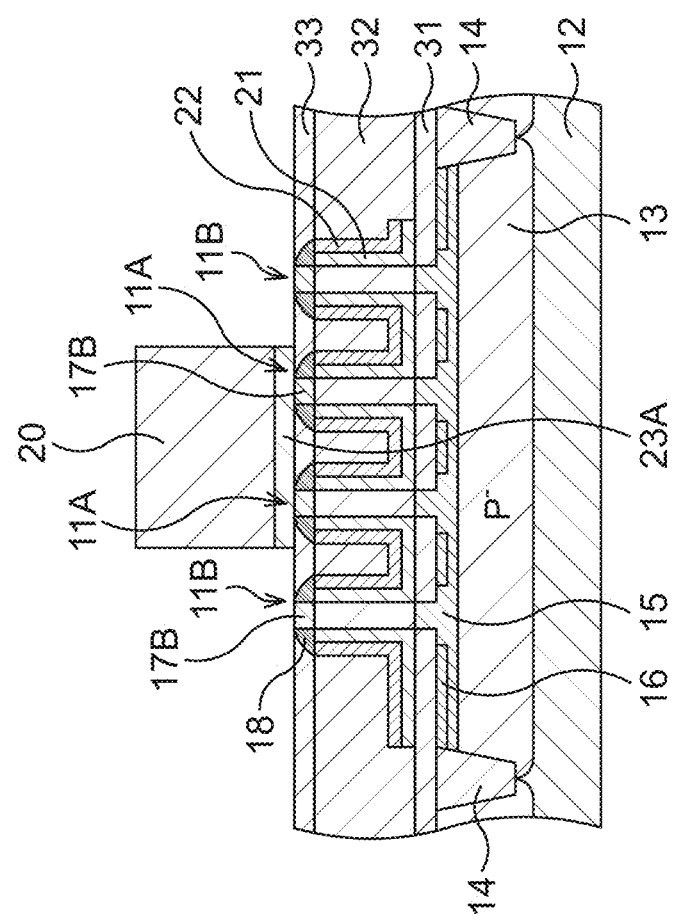
FIG. 5C is a schematic sectional view illustrating the method of forming the top plate in order of processes, continued from FIG. 5B.

Subsequently, as illustrated in FIG. 5C, a resist is coated on the entire surface of the semiconductor film 23A, and the resist is subjected to patterning through lithography, to thereby form a resist mask 20. The resist mask 20 is formed of the resist that remains on a part on the semiconductor film 23A and which is positioned above the plural VNW transistors 11A. The semiconductor film 23A is etched by using the resist mask 20 so that the semiconductor film 23A is remained on the plural VNW transistors 11A.

Figure 5D:
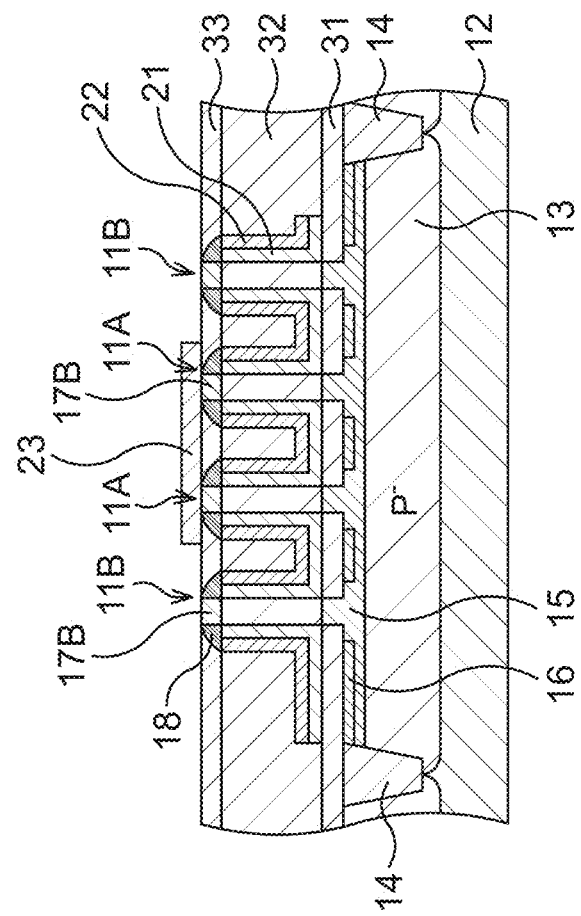
FIG. 5D is a schematic sectional view illustrating the method of forming the top plate in order of processes, continued from FIG. 5C.

Subsequently, as illustrated in FIG. 5D, the semiconductor film 23A is silicided. Specifically, a metal film is formed on the entire surface on the interlayer insulating film 33 so as to cover the semiconductor film 23A. As a material of the metal film, Ni, Co, Mo, W, Pt, Ti, or the like is used. As the metal film, it is also possible to form a conductive film of a semiconductor in which conductive nitride such as TiN or TaN or the like, or an impurity is introduced, or the like. By performing heat treatment, for example, the semiconductor film 23A and the metal film are made to react with each other, to cause silicidation. The unsilicided metal film is removed through predetermined wetting or the like. By performing the above, the top plate 23 of one layer on the plural VNW transistors 11A, that is electrically connected to the plural VNW transistors 11A, is formed.

On the top plate 23, plural contact plugs 24 are arranged in a matrix form in a plane view, and the respective contact plugs 24 are electrically connected to the top plate 23. The respective contact plugs 24 are arranged by being overlapped with the respective semiconductor nanowires 17 positioned below in a plane view. Note that the arrangement in the overlapped manner includes a case where the arrangement is displaced due to a manufacturing variation, a positional displacement, or the like. The same applies to the other embodiments and various modified examples. Note that there is a case where the respective contact plugs 24 are arranged by being displaced with respect to the positions of the respective semiconductor nanowires 17 positioned below in a plane view.

At the periphery of the VNW transistor arrangement region 10, plural contact plugs 25 are arranged in a line in a plane view along one side extending in the Y direction of the region, and plural contact plugs 26 are arranged in a line in a plane view along one side facing the aforementioned one side. The contact plug 25 is brought into contact with the silicide layer 16, and is electrically connected to the lower end portion 17a via the silicide layer 16 and the bottom region 15. The contact plug 26 is electrically connected to the gate electrode 22.

On the contact plugs 24, 25, 26, wirings 27, 28, 29 are formed. Each of the wirings 27, 28, 29 may be arranged in a linear form (band form) in a manner that they are arranged to be parallel to each other in a plane view, for example (parallel in the Y direction in FIG. 1 and FIG. 3, for example). Each of the wirings 27, 28, 29 may also be arranged in a manner that, for example, they wind in a plane view or a part thereof intersects in a plane view via a different wiring layer.

Each of the contact plugs 24, 25, 26 is formed of a base film formed so as to cover an inner wall surface of each opening, and a conductive material that fills inside of each opening via the base film. As a material of the base film, for example, Ti, TiN, Ta, TaN, or the like is used. As the conductive material, for example, Cu, a Cu alloy, W, Ag, Au, Ni, Al, Co, Ru, or the like is used. Note that when the conductive material is Co or Ru, the formation of the base film may be omitted.

The wiring 27 is electrically connected to the respective contact plugs 24. The wiring 27 includes a wiring portion 27a and via portions 27b which are integrally formed, and has a dual damascene structure. The via portion 27b is brought into contact with the contact plug 24. The wiring 28 is electrically connected to the respective contact plugs 25. The wiring 28 includes a wiring portion 28a and via portions 28b which are integrally formed, and has a dual damascene structure. The via portion 28b is brought into contact with the contact plug 25. The wiring 29 is electrically connected to the respective contact plugs 26. The wiring 29 includes a wiring portion 29a and via portions 29b which are integrally formed, and has a dual damascene structure. The via portion 29b is brought into contact with the contact plug 26. Note that it is also possible to employ a single damascene structure in a manner that the respective wiring portion 27a and via portions 27b are separately formed. In this case, the wiring portion 27a and the via portions 27b may be formed with mutually different materials. Besides, the wiring portion 28a and the via portions 28b, and the wiring portion 29a and the via portions 29b, may also employ a single damascene structure, and may also be formed with different materials, respectively, in a similar manner. These are not limited only to the present embodiment, and also in the other embodiments and modified examples, it is possible to form wirings based on the single damascene structure.

Each of the wirings 27, 28, 29 is formed in a manner that via holes and a wiring groove which are communicated with each other in an interlayer insulating film 35 are formed by a dual damascene method, and the via holes and the wiring groove are filled with a conductive material by using a plating method. As the conductive material, Cu, a Cu alloy, Co, Ru, or the like is used.

The VNW transistors 11A, 11B, and a part of the contact plugs 25, 26 are formed in the insulating film 31 and the interlayer insulating films 32, 33. The top plate 23, the contact plugs 24, and another part of the contact plugs 25, 26 are formed in an interlayer insulating film 34. The wirings 27, 28, 29 are formed in the interlayer insulating film 35.

The insulating film 31 is formed by using, as a material, an insulating material such as, for example, $SiO_2$, SiN, SiON, SiC, SiCN, or SiOCN. Each of the interlayer insulating films 32, 33, 34, 35 is formed by using, as a material, an insulating material such as $SiO_2$, TEOS, PSG, BPSG, FSG, SiOC, SOG, SOP (Spin on Polymers), or SiC.

In the present embodiment, the plural VNW transistors 11A which actually function as transistors are provided on the inner side of the VNW transistor arrangement region 10, and the dummy VNW transistors 11B are provided on the outer side of the region so as to surround these VNW transistors 11A. In the VNW transistor group in which the plural VNW transistors are aggregated, the VNW transistors positioned at a peripheral part of the group may have different dimensions, different impurity profiles, and the like due to a manufacturing variation when compared to the VNW transistors positioned on the inner side of the VNW transistor group. Accordingly, there is a possibility that various characteristics of the VNW transistors vary. In the present embodiment, the dummy VNW transistors 11B are arranged on the outer side part of the VNW transistor arrangement region 10. The variation in dimensions, impurity profiles, and the like during a manufacturing process is highly likely to occur in the dummy VNW transistors 11B. Because of the presence of the dummy VNW transistors 11B, the variation in dimensions, impurity profiles, and the like of the VNW transistors 11A positioned on the inner side relative to the dummy VNW transistors 11B, during a manufacturing process, is suppressed. Consequently, the variation in characteristics of the VNW transistors 11A is suppressed.

Note that in the present embodiment, the conductivity types of the bottom region 15, the lower end portion 17a, and the upper end portion 17b are set to the N-type, and the conductivity type of the middle portion 17c is set to the P-type, to thereby form the N-type transistor, but, it is also possible to form the P-type transistor by reversing the respective conductivity types. This is not limited to the present embodiment, and the same applies to the other embodiments and various modified examples.

MODIFIED EXAMPLES

Hereinafter, various modified examples of the semiconductor device of the first embodiment will be described.

Modified Example 1

Figure 6:
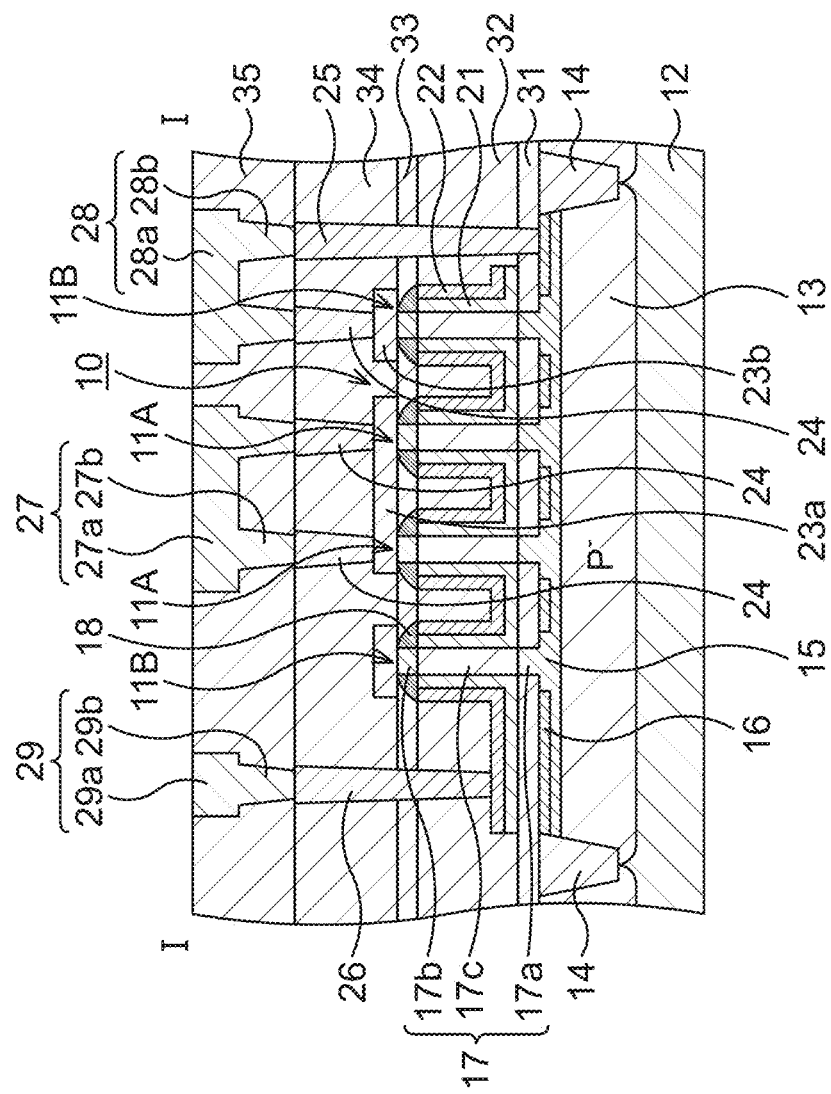
FIG. 6 is a schematic sectional view illustrating a schematic configuration of a semiconductor device including VNW transistors according to a modified example 1 of the first embodiment.

FIG. 6 is a schematic sectional view illustrating a schematic configuration of a semiconductor device including VNW transistors according to a modified example 1 of the first embodiment.

In the present example, a top plate 23a of one layer being a conductive film of silicide, metal, or the like is formed on the VNW transistors 11A, and a top plate 23b of one layer being a conductive film of silicide, metal, or the like is formed on the dummy VNW transistors 11B. The wiring 27 is formed on the top plate 23a via the contact plugs 24, and the upper end portions 17b of the VNW transistors 11A and the wiring 27 are electrically connected.

In the present example, regarding the dummy VNW transistor 11B at the left end in FIG. 6, an electric conductor such as a contact plug is not provided on the top plate 23b connected to the upper end portion 17b. Since the top plate 23b which is brought into contact with the upper end portion 17b is not connected to the electric conductor as described above and thus is in an electrically isolated state, the dummy VNW transistor 11B at the left end is in an electrically floating state and does not function as a transistor.

Further, in the present example, regarding the dummy VNW transistor 11B at the right end in FIG. 6, the contact plug 24 is formed on the top plate 23b connected to the upper end portion 17b, and the wiring portion 28a of the wiring 28 is brought into contact with the contact plug 24. The wiring 28 is electrically connected to the lower end portion 17a of the dummy VNW transistor 11B at the right end via the contact plug 25, the silicide layer 16, and the bottom region 15. Because of this configuration, the lower end portion 17a and the upper end portion 17b of the dummy VNW transistor 11B at the right end are electrically connected to be short-circuited, resulting in that the dummy VNW transistor 11B at the right end does not function as a transistor.

In the semiconductor device of the present example, the configuration other than the above is similar to that of the first embodiment.

In the present example, the top plate 23b is formed also on the dummy VNW transistor 11B, by taking commonness of formation process with respect to the formation process of the top plate 23a on the VNW transistors 11A into consideration. Because of the presence of the dummy VNW transistors 11B, the variation in dimensions, impurity profiles, and the like of the VNW transistors 11A during a manufacturing process, is suppressed. Consequently, the variation in characteristics of the VNW transistors 11A is suppressed.

Note that in the present example, it is also possible to employ a configuration such that regarding each of the dummy VNW transistors 11B at the left end and the right end, the electric conductor such as the contact plug is not provided on the top plate 23b connected to the upper end portion 17b. Further, it is also possible to design such that regarding each of the dummy VNW transistors 11B at the left end and the right end, the lower end portion 17a and the upper end portion 17b are electrically connected to be short-circuited. Further, FIG. 6 is illustrated as an example, and the arrangement positions of the dummy VNW transistors 11B are not limited to the left end and the right end. For example, the dummy VNW transistors 11B may also be arranged at various end positions of the VNW transistors 11A in a plane view.

Modified Example 2

Figure 7:
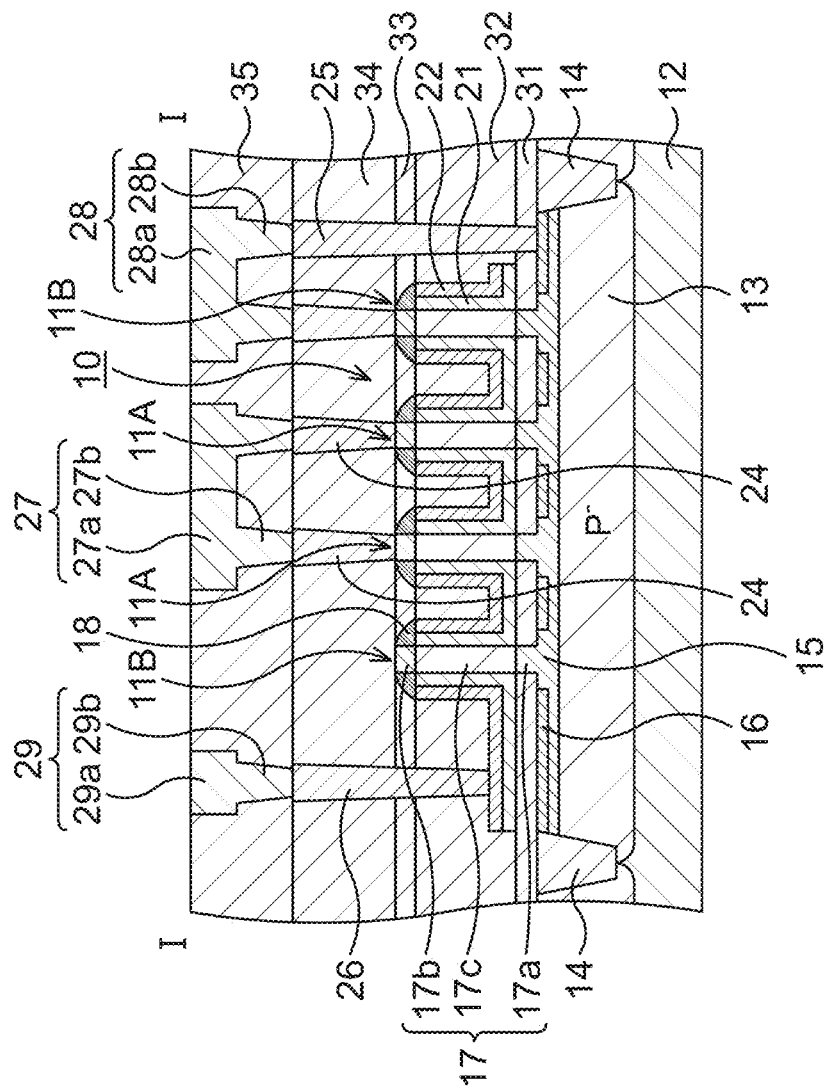
FIG. 7 is a schematic sectional view illustrating a schematic configuration of a semiconductor device including VNW transistors according to a modified example 2 of the first embodiment.

FIG. 7 is a schematic sectional view illustrating a schematic configuration of a semiconductor device including VNW transistors according to a modified example 2 of the first embodiment.

In the present example, the top plate is not provided with respect to both the VNW transistors 11A and the dummy VNW transistors 11B.

In the present example, regarding the VNW transistors 11A, the wiring 27 is formed on the upper end portions 17b via the contact plugs 24, and the upper end portions 17b of the VNW transistors 11A and the wiring 27 are electrically connected.

Regarding the dummy VNW transistor 11B at the left end in FIG. 7, an electric conductor such as a contact plug is not provided on the upper end portion 17b. Since the dummy VNW transistor 11B at the left end has the upper end portion 17b which is not connected to the electric conductor as described above and thus is in an electrically isolated state, the dummy VNW transistor 11B at the left end does not function as a transistor.

Further, in the present example, regarding the dummy VNW transistor 11B at the right end in FIG. 7, the contact plug 24 is formed on the upper end portion 17b, and the wiring portion 28a of the wiring 28 is brought into contact with the contact plug 24. The wiring 28 is electrically connected to the lower end portion 17a of the dummy VNW transistor 11B at the right end via the contact plug 25, the silicide layer 16, and the bottom region 15. Because of this configuration, the lower end portion 17a and the upper end portion 17b of the dummy VNW transistor 11B at the right end are electrically connected to be short-circuited, resulting in that the dummy VNW transistor 11B at the right end does not function as a transistor.

In the semiconductor device of the present example, the configuration other than the above is similar to that of the modified example 1 of the first embodiment.

In the present example, the contact plugs 24 are directly connected to the VNW transistors 11A without forming the top plate, to thereby reduce the number of processes. Because of the presence of the dummy VNW transistors 11B, the variation in dimensions, impurity profiles, and the like of the VNW transistors 11A during a manufacturing process, is suppressed. Consequently, the variation in characteristics of the VNW transistors 11A is suppressed.

Note that in the present example, it is also possible to employ a configuration such that regarding each of the dummy VNW transistors 11B at the left end and the right end, the electric conductor such as the contact plug is not provided on the upper end portion 17b. Further, it is also possible to design such that regarding each of the dummy VNW transistors 11B at the left end and the right end, the lower end portion 17a and the upper end portion 17b are electrically connected to be short-circuited. Further, FIG. 7 is illustrated as an example, and the arrangement positions of the dummy VNW transistors 11B are not limited to the left end and the right end. For example, the dummy VNW transistors 11B may also be arranged at various end positions of the VNW transistors 11A in a plane view.

Modified Example 3

Figure 8:
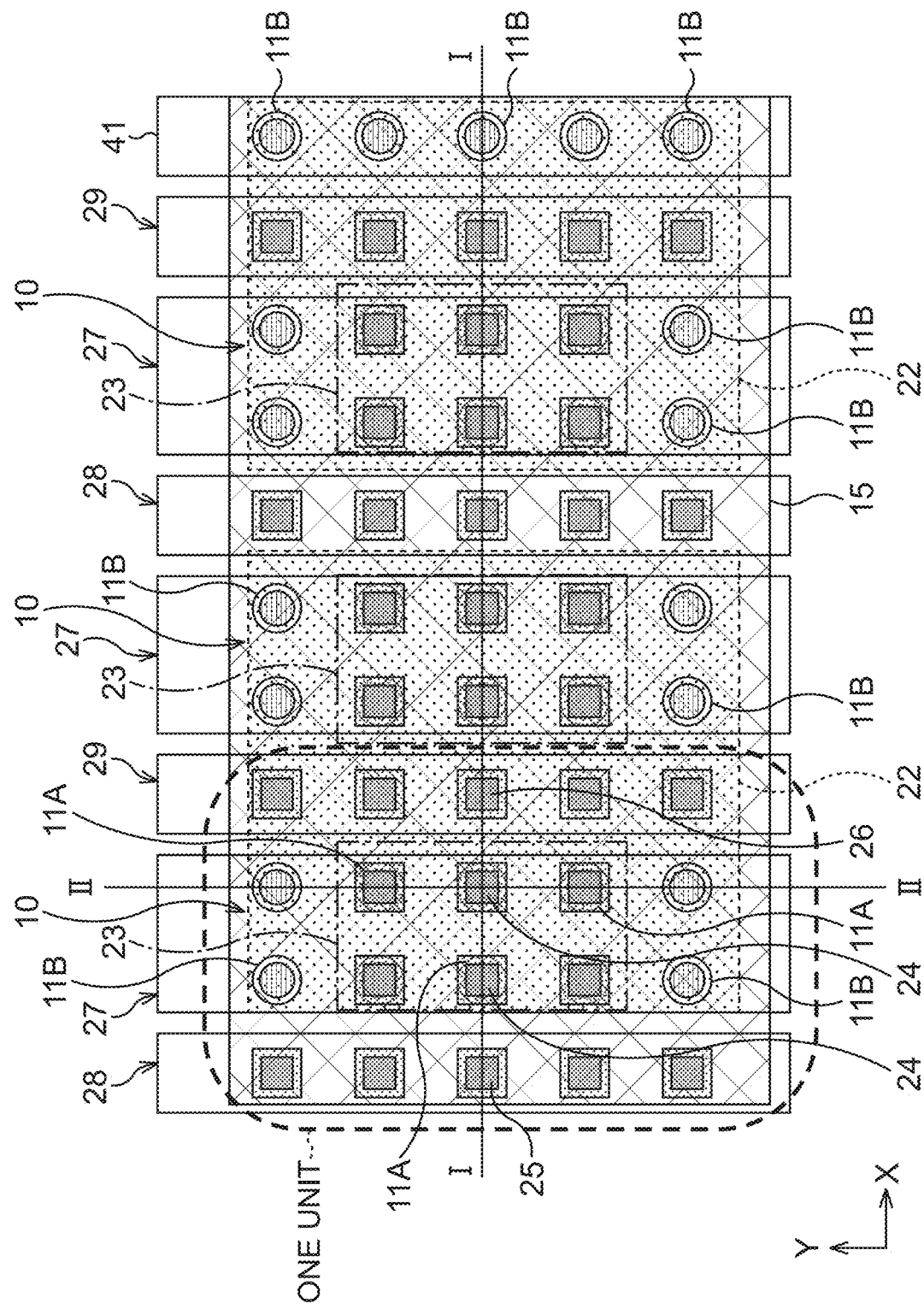
FIG. 8 is a plan view illustrating a schematic configuration of a semiconductor device including VNW transistors according to a modified example 3 of the first embodiment.
Figure 11A:
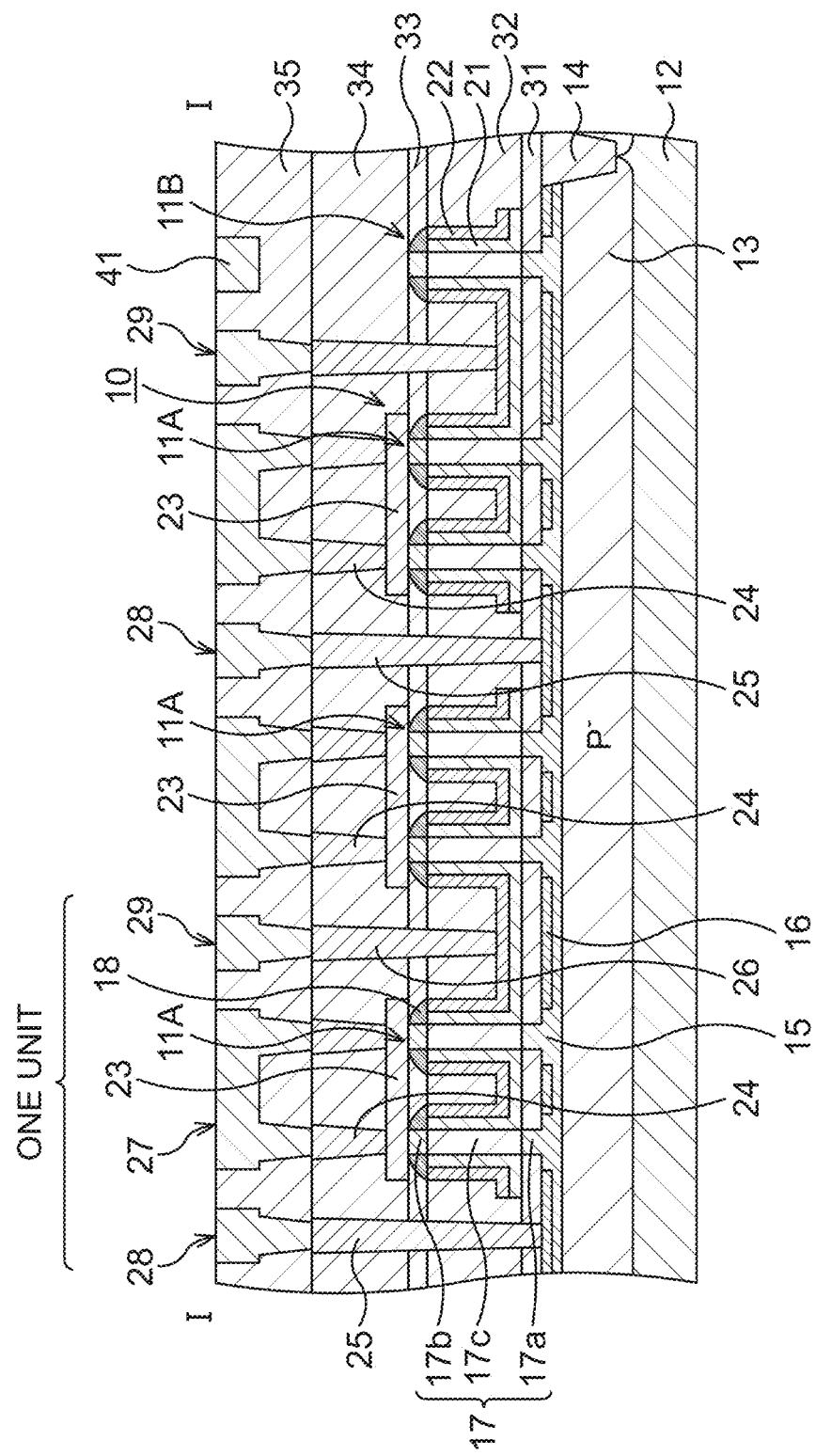
FIG. 11A is a sectional view illustrating a cross section taken along a line segment I-I in FIG. 8.
Figure 11B:
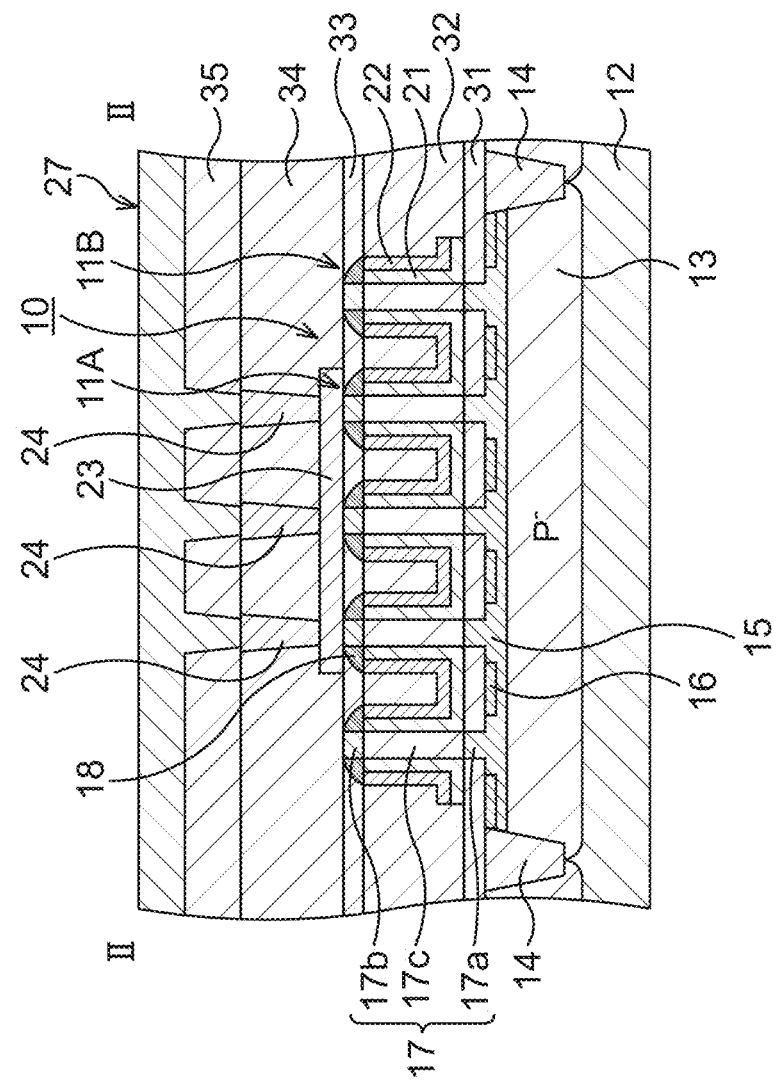
FIG. 11B is a sectional view illustrating a cross section taken along a line segment II-II in FIG. 8.
Figure 12:
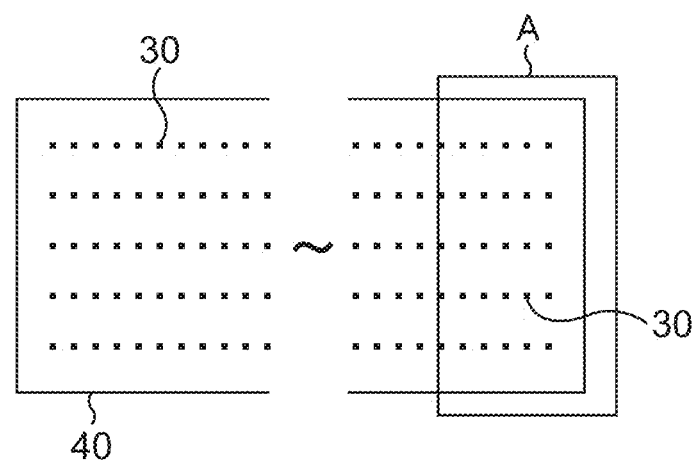
FIG. 12 is a plan view schematically illustrating a circuit arrangement region of the semiconductor device including the VNW transistors according to the modified example 3 of the first embodiment.

FIG. 8 is a plan view illustrating a schematic configuration of a semiconductor device including VNW transistors according to a modified example 3 of the first embodiment. FIG. 9 is a plan view illustrating, regarding the semiconductor device including the VNW transistors according to the modified example 3 of the first embodiment, a schematic configuration as a result of removing a wiring structure on contact plugs from FIG. 8. FIG. 10 is a plan view illustrating, regarding the semiconductor device including the VNW transistors according to the modified example 3 of the first embodiment, a schematic configuration of only top plates and wirings above the top plates in FIG. 8. FIG. 11A is a sectional view illustrating a cross section taken along a line segment I-I in FIG. 8. FIG. 11B is a sectional view illustrating a cross section taken along a line segment II-II in FIG. 8. FIG. 12 is a plan view schematically illustrating a circuit arrangement region of the semiconductor device including the VNW transistors according to the modified example 3 of the first embodiment.

In the present example, plural VNW transistor arrangement regions 10 are arranged in parallel. Each of the VNW transistor arrangement regions 10 is a rectangular region having a side extending in the X direction and a side extending in the Y direction in a plane view. The VNW transistor arrangement region 10 is indicated by a solid line frame D in FIG. 9, for example. In the VNW transistor arrangement region 10, plural (two in the X direction and three in the Y direction, namely, six in total, for example) VNW transistors 11A are arranged. Further, two dummy VNW transistors 11B are arranged along upper and lower sides, respectively, of the VNW transistor arrangement region 10. The VNW transistors 11A are arranged by being sandwiched by the dummy VNW transistors 11B arranged on the upper and lower sides in a plane view. In FIG. 9, a part in which the dummy VNW transistors 11B are arranged side by side is illustrated by being surrounded by a dotted line frame B. In one VNW transistor arrangement region 10, the VNW transistors 11A and the dummy VNW transistors 11B are commonly formed with the gate insulating film 21 of one layer and the gate electrode 22. Further, the contact plugs 25 electrically connected to the bottom region 15 of the plural VNW transistors 11A are formed by being adjacent to the plural VNW transistors 11A and dummy VNW transistors 11B in a plane view. Further, the contact plugs 26 which are connected to the gate electrode 22 are formed by being adjacent to the plural VNW transistors 11A and dummy VNW transistors 11B at positions on the opposite side of the contact plugs 25, for example, in a plane view. For example, a configuration including the VNW transistors 11A and the dummy VNW transistors 11B in one VNW transistor arrangement region 10, the contact plugs 25, and the contact plugs 26 (indicated by a dotted line frame in FIG. 8), is set as one unit. In the circuit arrangement region, it is also possible that the one unit is arranged by being reversed in a plane view, for example. In the example of FIG. 8, on the right side of the one unit at the left end (indicated by the dotted line frame in FIG. 8), a unit as a result of reversing the aforementioned one unit in the X direction is arranged. The contact plugs 26 of one unit reversed in the X direction and the contact plugs 26 of the one unit at the left end are shared. Further, the gate electrode 22 of one unit reversed in the X direction is integrated with the gate electrode 22 of the one unit at the left end. Further, a predetermined number of the one unit which is not illustrated may also be arranged in parallel on the left side relative to the left end.

In each of the plan views of FIG. 8 to FIG. 10, a right end part of a circuit arrangement region 40 of the semiconductor device is illustrated in an enlarged manner, as illustrated in FIG. 12. The right end part is, for example, a part indicated by a rectangular frame A, and dots 30 schematically illustrate the VNW transistors 11A and the dummy VNW transistors 11B. Note that, although not illustrated here, a left end part of the circuit arrangement region 40 may also be configured similarly to the right end part.

In each of the VNW transistor arrangement regions 10, the plural VNW transistors 11A are arranged. In the present example, the plural VNW transistor arrangement regions 10 are arranged in parallel in the X direction. In the vicinity in the X direction of the VNW transistors 11A of one VNW transistor arrangement region 10, other VNW transistors 11A of another adjacent VNW transistor arrangement region 10 are arranged. For this reason, because of the presence of the other VNW transistors 11A, the variation in dimensions, impurity profiles, and the like of the respective VNW transistors 11A during a manufacturing process, is suppressed. This makes it possible to omit the arrangement of the dummy VNW transistors 11B between the respective plural VNW transistor arrangement regions 10 (however, the dummy VNW transistors 11B may also be arranged).

Meanwhile, there is a case where other VNW transistors are not arranged in the vicinity in the Y direction of the VNW transistor arrangement region 10, and the variation in dimensions and so on are sometimes caused only by the VNW transistors arranged on the upper and lower ends in the VNW transistor arrangement region 10 in a plane view. In the present example, the dummy VNW transistors 11B are arranged along the upper and lower sides, respectively, in a plane view in each of the VNW transistor arrangement regions 10. In this case, in each of the VNW transistor arrangement regions 10, the dummy VNW transistors 11B are arranged in the vicinity of the respective VNW transistors 11A positioned on the upper and lower ends in a plane view. For this reason, because of the presence of the dummy VNW transistors 11B arranged in the vicinity of the VNW transistors 11A positioned on the upper and lower ends, the variation in dimensions, impurity profiles, and the like of the VNW transistors 11A during a manufacturing process, is suppressed.

Note that in the example of FIG. 8 and FIG. 9, two dummy VNW transistors 11B are respectively arranged side by side in the X direction, but, the number of arrangement may be respectively one or three or more, and further, the number of arrangement may also be different between the upper side and the lower side. Further, the dummy VNW transistors 11B may also be arranged in plural lines along the Y direction, for example. Further, it is also possible to design such that in a case where other VNW transistors are arranged on one of the upper and lower sides of the VNW transistor arrangement region 10, and the like, the dummy VNW transistors 11B are arranged only on one of the upper and lower sides in a plane view. Further, the arrangement and the number of the VNW transistors 11A can be changed appropriately, and it is also possible to arrange the VNW transistors 11A of one or three or more in the X direction and two or less or four or more in the Y direction, for example. Further, the arrangement of the VNW transistors 11A in a plane view may also be set to one in a form other than the matrix form. These changes in the arrangement, the number, and so on are not limited to the present example, and they may also be applied to the other embodiments and various modified examples.

Further, in FIG. 8 to FIG. 10, in the vicinity of the right side of the VNW transistor arrangement region 10 at the right end, the plural dummy VNW transistors 11B are arranged side by side along the Y direction with the contact plugs 24 sandwiched between the region and the transistors. For this reason, because of the presence of the dummy VNW transistors 11B arranged in the Y direction, the variation in dimensions, impurity profiles, and the like of the VNW transistors 11A positioned at the right end of the VNW transistor arrangement region 10 at the right end during a manufacturing process, is suppressed. In the present example, five dummy VNW transistors 11B are arranged in the Y direction, but, the number of arrangement may be four or less, or six or more. Further, it is also possible that the dummy VNW transistors 11B arranged in the Y direction are arranged in plural lines in the X direction, for example. These changes in the arrangement, the number, and so on are not limited to the present example, and they may also be applied to the other embodiments and various modified examples. Note that the "arrangement" in the "vicinity" in the present application includes a configuration in which, for example, one VNW transistor is set as a starting point, and another VNW transistor is arranged with a contact plug or the like sandwiched therebetween in a plane view.

At the right end in FIG. 11A, a dummy wiring 41 is arranged in the interlayer insulating film 35 above the dummy VNW transistor 11B. The dummy wiring 41 is separated from the upper end portion 17b of the dummy VNW transistor 11B. The dummy wiring 41 is not connected to the dummy VNW transistor 11B and the other electric conductors. By providing the dummy wiring 41 to the end part of the circuit arrangement region (although the dummy wiring 41 is provided at the right end in the illustrated example, it may also be provided at the left end), it is possible to suppress the variation in dimensions due to an influence of a manufacturing process of the wirings 27 to 29 and the like adjacent to the dummy wiring 41.

In the present example, each of the top plates 23 each being one layer is connected only onto the plural VNW transistors 11A in each of the VNW transistor arrangement regions 10. The electric conductor such as the top plate is not connected to the upper end portion 17b of each of the dummy VNW transistors 11B, and thus each of the dummy VNW transistors 11B does not function as a transistor. Note that it is also possible to design such that the top plate is arranged also on the upper end portion 17b of the dummy VNW transistor 11B as in the modified example 1 of the first embodiment, or the top plate is not arranged on both the VNW transistor 11A and the dummy VNW transistor 11B as in the modified example 2.

In the present example, in the configuration in which the plural VNW transistor arrangement regions 10 are arranged in parallel, the dummy VNW transistors 11B are appropriately arranged on facing two sides (two sides extending in the X direction in the above-described example) at the periphery of the plural VNW transistors 11A, and the end part of the circuit arrangement region. Because of the presence of the dummy VNW transistors 11B, the variation in dimensions, impurity profiles, and the like of the VNW transistors 11A during a manufacturing process, is suppressed. Consequently, the variation in characteristics of the VNW transistors 11A is suppressed.

Modified Example 4

Figure 13:
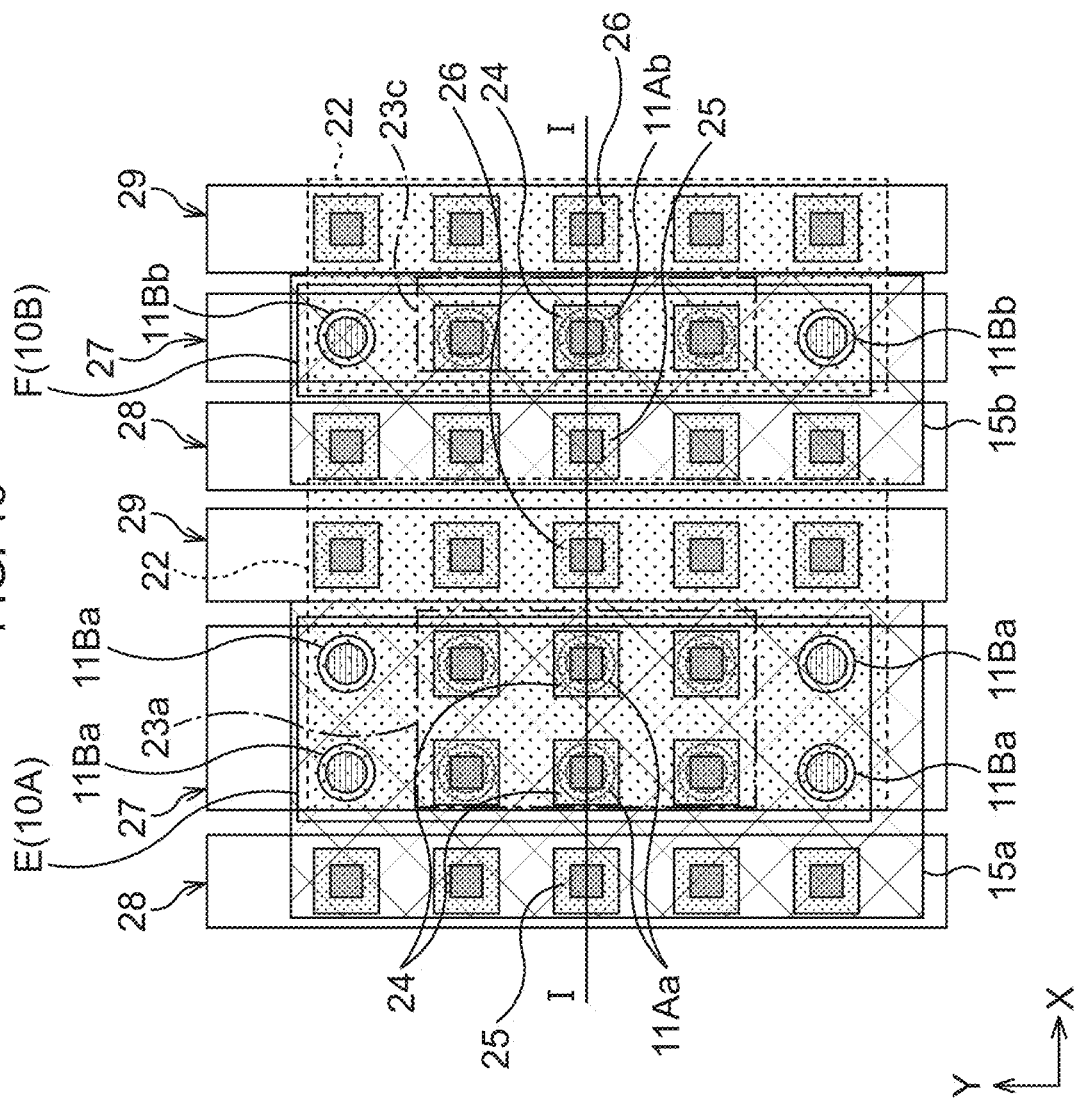
FIG. 13 is a plan view illustrating a schematic configuration of a semiconductor device including VNW transistors according to a modified example 4 of the first embodiment.
Figure 14:
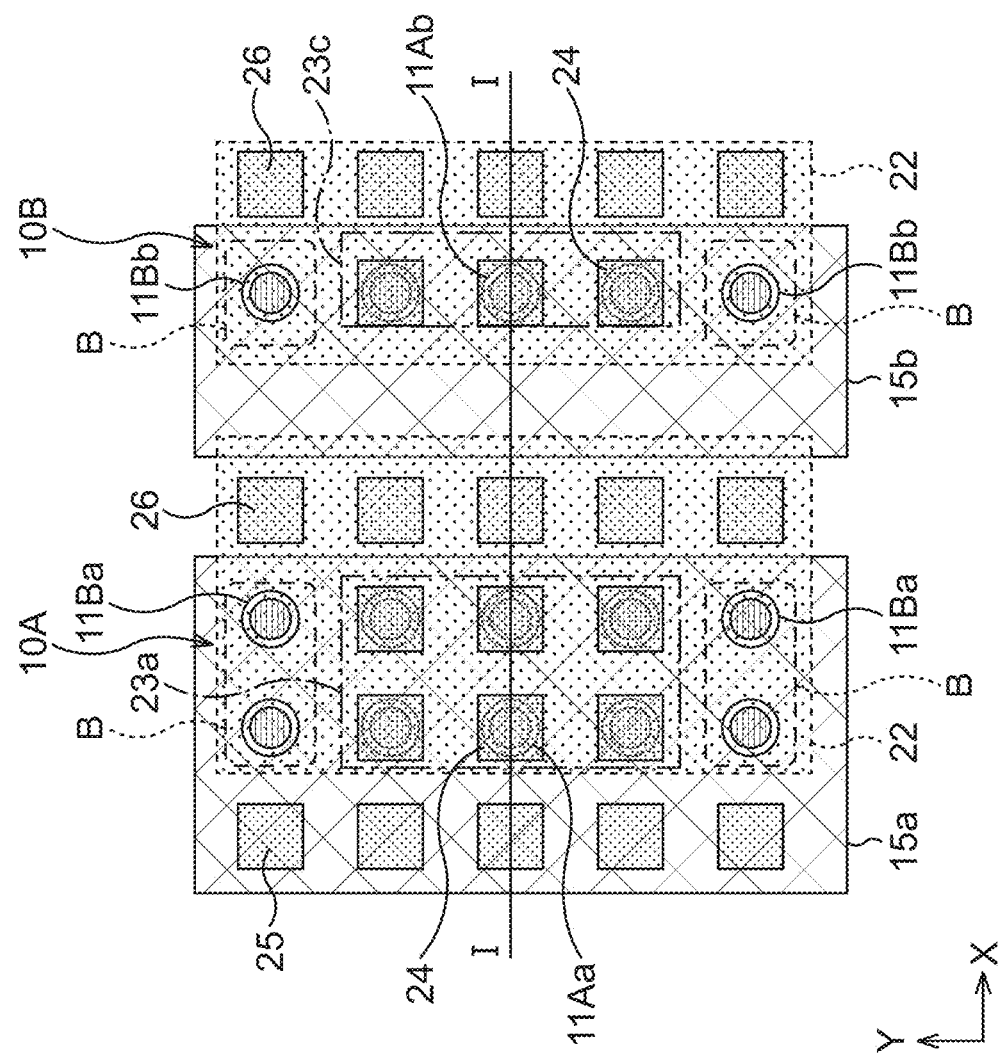
FIG. 14 is a plan view illustrating, regarding the semiconductor device including the VNW transistors according to the modified example 4 of the first embodiment, a schematic configuration as a result of removing a wiring structure on contact plugs from FIG. 13.
Figure 15:
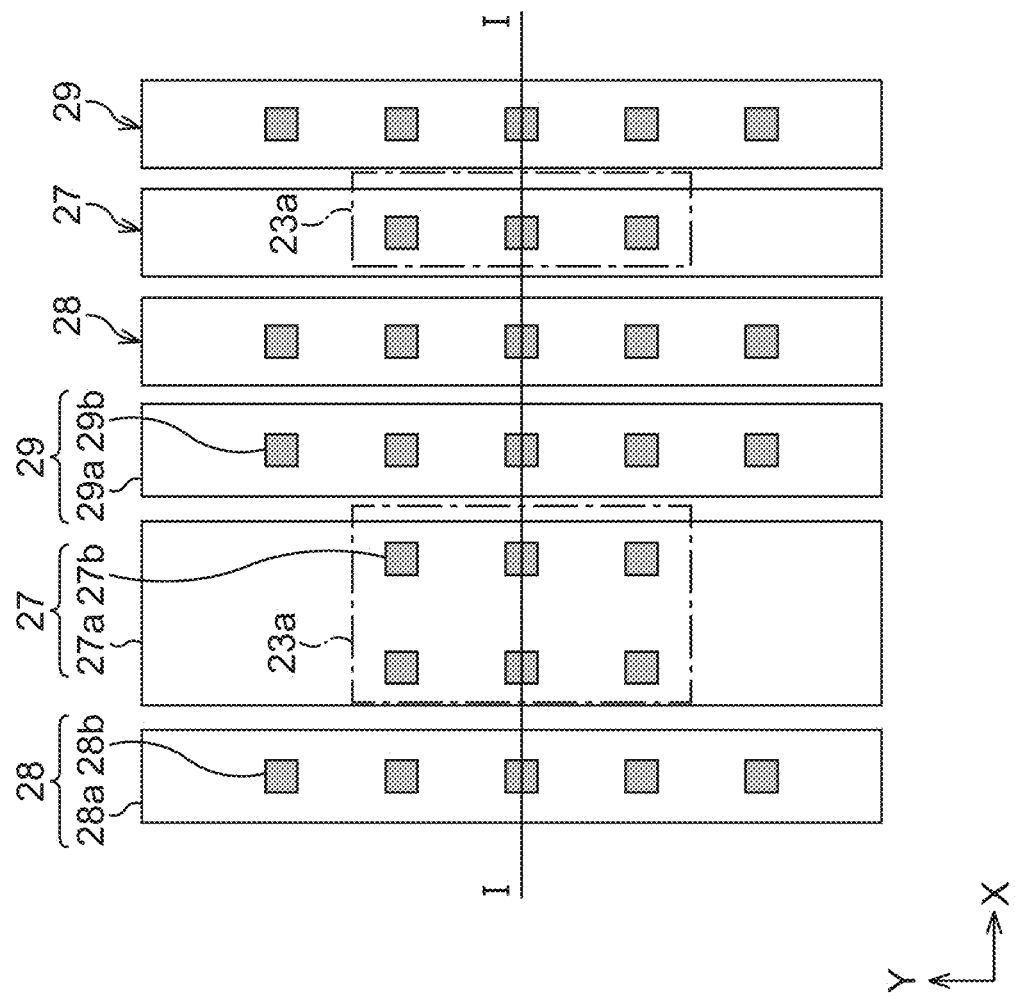
FIG. 15 is a plan view illustrating, regarding the semiconductor device including the VNW transistors according to the modified example 4 of the first embodiment, a schematic configuration of only top plates and wirings above the top plates in FIG. 13.
Figure 16:
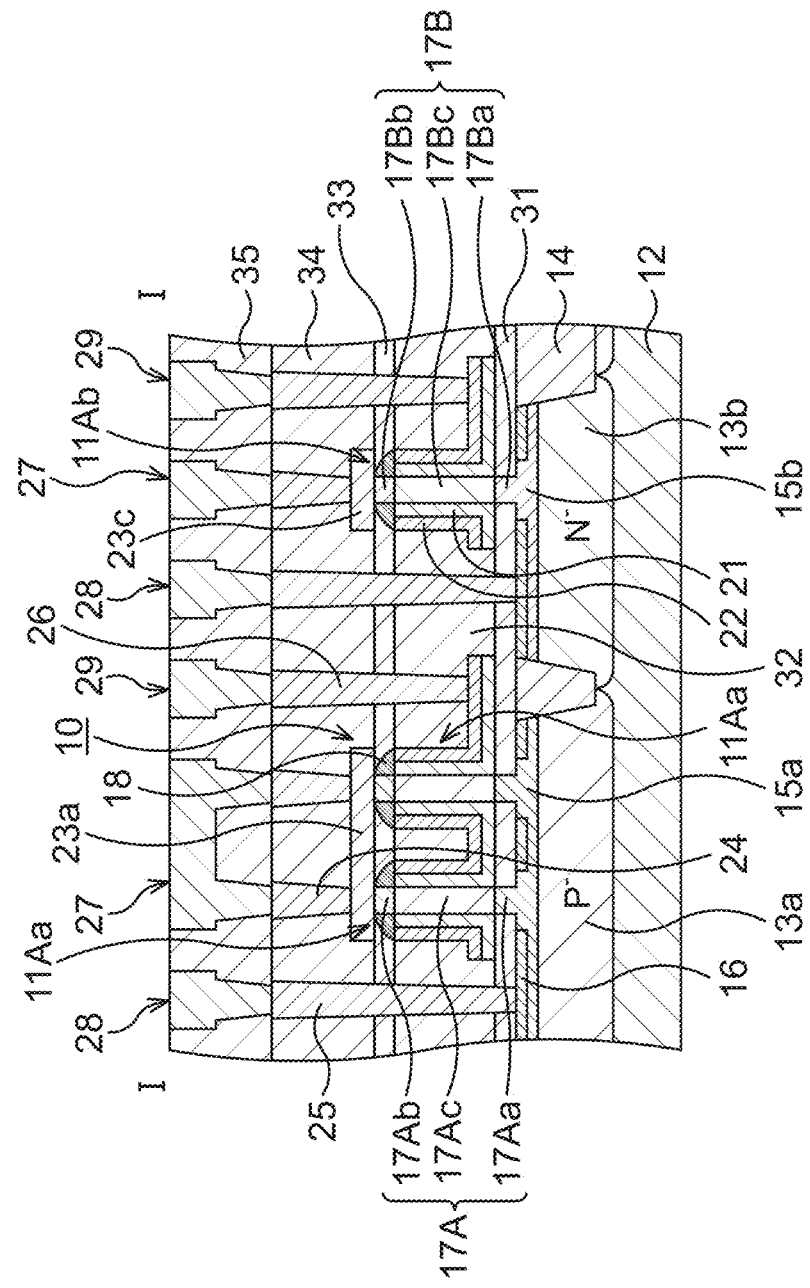
FIG. 16 is a sectional view illustrating a cross section taken along a line segment I-I in FIG. 13.

FIG. 13 is a plan view illustrating a schematic configuration of a semiconductor device including VNW transistors according to a modified example 4 of the first embodiment. FIG. 14 is a plan view illustrating, regarding the semiconductor device including the VNW transistors according to the modified example 4 of the first embodiment, a schematic configuration as a result of removing a wiring structure on contact plugs from FIG. 13. FIG. 15 is a plan view illustrating, regarding the semiconductor device including the VNW transistors according to the modified example 4 of the first embodiment, a schematic configuration of only top plates and wirings above the top plates in FIG. 13. FIG. 16 is a sectional view illustrating a cross section taken along a line segment I-I in FIG. 13.

In the present example, a VNW transistor arrangement region 10A and a VNW transistor arrangement region 10B are arranged by being adjacent to each other, as illustrated in FIG. 13 and FIG. 14, for example. Each of the VNW transistor arrangement regions 10A and 10B is a rectangular region having a side extending in the X direction and a side extending in the Y direction. The VNW transistor arrangement region 10A is indicated by a solid line frame E in FIG. 13, for example, and the VNW transistor arrangement region 10B is indicated by a solid line frame F in FIG. 13, for example. Note that although not illustrated, the VNW transistor arrangement region 10B may be arranged adjacent to the left side of the VNW transistor arrangement region 10A.

In the VNW transistor arrangement region 10A, VNW transistors 11Aa and dummy VNW transistors 11Ba are commonly formed with the gate insulating film 21 of one layer and the gate electrode 22. Further, in the VNW transistor arrangement region 10B, VNW transistors 11Ab and dummy VNW transistors 11Bb are commonly formed with the gate insulating film 21 of one layer and the gate electrode 22. Note that only one of each of the VNW transistor arrangement regions 10A and 10B may be arranged, or one or both of the VNW transistor arrangement regions 10A and 10B may be arranged repeatedly in a parallel manner as in the modified example 3. Further, the VNW transistor arrangement regions 10A and 10B may also be arranged in an alternate manner.

Regarding each of the VNW transistor 11Aa and the dummy VNW transistor 11Ba, an N-type bottom region 15a is formed on a P-type well 13a, and on the bottom region 15a, a semiconductor nanowire 17A is formed. The VNW transistor 11Aa is an N-type transistor similar to the VNW transistor 11A in the first embodiment. The dummy VNW transistor 11Ba is an N-type dummy transistor similar to the dummy VNW transistor 11B in the first embodiment. In the semiconductor nanowire 17A of each of the VNW transistor 11Aa and the dummy VNW transistor 11Ba, an N-type lower end portion 17Aa, an N-type upper end portion 17Ab, and a P-type middle portion 17Ac between the lower end portion 17Aa and the upper end portion 17Ab are formed.

In the VNW transistor arrangement region 10B, the VNW transistors 11Ab and the dummy VNW transistors 11Bb are commonly formed with the gate insulating film 21 of one layer and the gate electrode 22.

Regarding each of the VNW transistor 11Ab and the dummy VNW transistor 11Bb, a P-type bottom region 15b is formed on an N-type well 13b, and on the bottom region 15b, a semiconductor nanowire 17B is formed. The VNW transistor 11Ab is a P-type transistor whose conductivity type is different from that of the VNW transistor 11Aa. The dummy VNW transistor 11Bb is a P-type dummy transistor whose conductivity type is different from that of the dummy VNW transistor 11Ba. In the semiconductor nanowire 17B of each of the VNW transistor 11Ab and the dummy VNW transistor 11Bb, a P-type lower end portion 17Ba, an N-type upper end portion 17Bb, and an N-type middle portion 17Bc between the lower end portion 17Ba and the upper end portion 17Bb are formed.

As illustrated in FIG. 13 and FIG. 14, in the VNW transistor arrangement region 10A, plural (two in the X direction and three in the Y direction, namely, six in total, for example) VNW transistors 11Aa are arranged. Further, in the VNW transistor arrangement region 10B, plural (one in the X direction and three in the Y direction, namely, three in total, for example) VNW transistors 11Ab are arranged. In this case, the VNW transistors 11Ab are arranged in the vicinity of the right side of the plural VNW transistors 11Aa. Consequently, because of the mutual presence of the VNW transistors 11Aa and the VNW transistors 11Ab, the variation in dimensions, impurity profiles, and the like during a manufacturing process is suppressed. For this reason, there is no need to arrange the dummy VNW transistors between the plural VNW transistors 11Aa and 11Ab (however, the dummy VNW transistors may also be arranged). The VNW transistors 11Aa are arranged by being sandwiched by the dummy VNW transistors 11Ba which are arranged on the upper and lower sides in a plane view. In FIG. 14, a part in which the dummy VNW transistors 11Ba are formed side by side is indicated by being surrounded by a dotted line frame B. The VNW transistors 11Ab are arranged by being sandwiched by the dummy VNW transistors 11Bb which are arranged on the upper and lower sides in a plane view. In FIG. 14, a part in which the dummy VNW transistor 11Bb is formed is indicated by being surrounded by a dotted line frame B.

In the present example, the top plate 23a of one layer is connected only onto the plural VNW transistors 11Aa in each of the VNW transistor arrangement regions 10A. Each of the dummy VNW transistors 11Ba has the upper end portion 17Ab which is not connected to the electric conductor such as the top plate, so that it is in an electrically floating state and does not function as a transistor. In the VNW transistor arrangement region 10B, a top plate 23c of one layer is connected only onto the plural VNW transistors 11Ab. Each of the dummy VNW transistors 11Bb has the upper end portion 17Bb which is not connected to the electric conductor such as the top plate, so that it is in an electrically floating state and does not function as a transistor.

Note that it is also possible that the top plate is arranged also on the upper end portion 17Ab of the dummy VNW transistor 11Ba and the upper end portion 17Bb of the dummy VNW transistor 11Bb, similarly to the modified example 1 of the first embodiment, and it is also possible that the top plate is not arranged on both the VNW transistors 11Aa, 11Ab and the dummy VNW transistors 11Ba, 11Bb, similarly to the modified example 2.

Further, the present example exemplifies a case where the contact plugs 26 and the wiring 29 connected to one end of the gate electrode 22 of each of the VNW transistor arrangement regions 10A, 10B, are positioned above the STI element isolation region 14. With the use of this configuration, a region above the STI element isolation region 14 is effectively utilized, and further downsizing and microfabrication of the semiconductor device are realized.

In the present example, in the configuration in which the VNW transistor arrangement regions 10A, 10B are arranged in parallel, the dummy VNW transistors 11Ba, 11Bb are appropriately arranged in the vicinity of the plural VNW transistors 11Aa, 11Ab, respectively. Because of the presence of the dummy VNW transistors 11Ba, 11Bb, the variation in dimensions, impurity profiles, and the like of the VNW transistors 11Aa, 11Ab during a manufacturing process, is suppressed. Consequently, the variation in characteristics of the VNW transistors 11Aa, 11Ab is suppressed.

Modified Example 5

Figure 17:
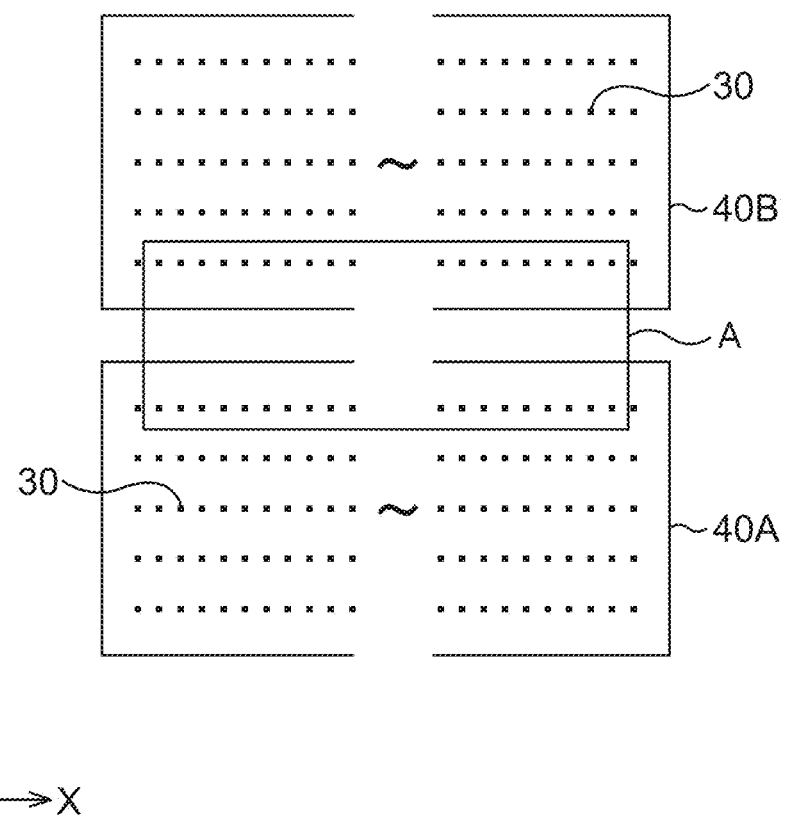
FIG. 17 is a plan view schematically illustrating a circuit arrangement region of a semiconductor device including VNW transistors according to a modified example 5 of the first embodiment.

FIG. 17 is a plan view schematically illustrating a circuit arrangement region of a semiconductor device including VNW transistors according to a modified example 5 of the first embodiment.

In the present example, circuit arrangement regions 40A, 40B of a semiconductor device are arranged by being adjacent to each other along the Y direction, for example. In the circuit arrangement regions 40A, 40B, dots 30 schematically illustrate the VNW transistors 11A and the dummy VNW transistors 11B. In this case, in the circuit arrangement region 40A, plural VNW transistors 11A are arranged in a matrix form in a plane view, for example. In an outer periphery of these VNW transistors 11A, along both sides extending in the Y direction and one side which is further distant from the circuit arrangement region 40B in the X direction, plural dummy VNW transistors 11B are arranged. In the circuit arrangement region 40B, plural VNW transistors 11A are arranged in a matrix form, for example, and in an outer periphery of these VNW transistors 11A, along both sides in the Y direction and one side which is further distant from the circuit arrangement region 40A in the X direction, plural dummy VNW transistors 11B are arranged.

In an adjacent region between the circuit arrangement regions 40A and 40B indicated by a rectangular frame A, the dots 30 at the end part of the circuit arrangement region 40A and the dots 30 at the end part of the circuit arrangement region 40B are arranged relatively close to each other. For this reason, as the dots 30 at the end parts of the regions, not the dummy VNW transistors 11B but the VNW transistors 11A may be arranged.

Note that the circuit arrangement regions 40A, 40B of the semiconductor device may also be arranged by being adjacent to each other along the X direction. Also in this case, in the adjacent region between the circuit arrangement regions 40A and 40B, not the dummy VNW transistors 11B but the VNW transistors 11A may be arranged as the dots 30 at the end parts of the regions.

In the present example, by arranging the VNW transistors 11A in the adjacent region between the circuit arrangement regions 40A and 40B, it is possible to reduce the number of arrangement of the dummy VNW transistors, to thereby effectively utilize the VNW transistors as much as possible. Because of the presence of the dummy VNW transistors 11B, the variation in dimensions, impurity profiles, and the like of the VNW transistors 11A during a manufacturing process, is suppressed. Consequently, the variation in characteristics of the VNW transistors 11A is suppressed.

Second Embodiment

Figure 18:
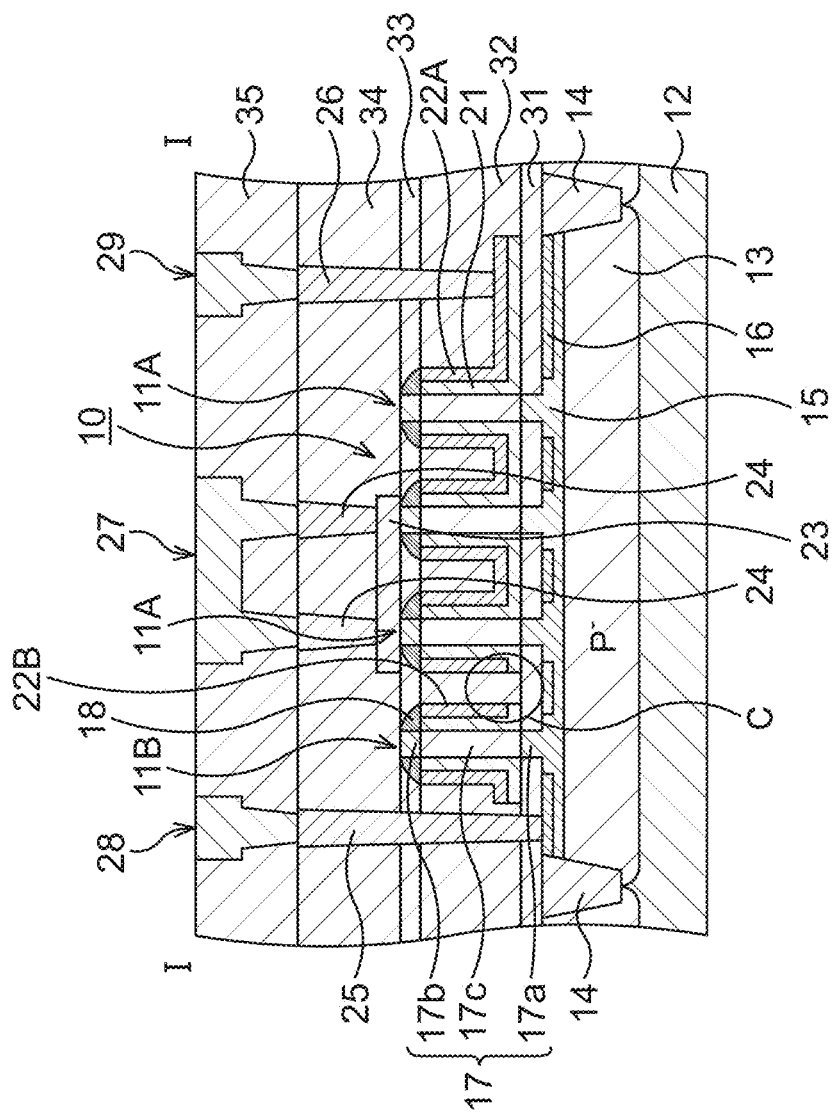
FIG. 18 is a schematic sectional view illustrating a schematic configuration of a semiconductor device including VNW transistors according to the second embodiment.

In the present embodiment, a semiconductor device including VNW transistors as VNW elements will be disclosed similarly to the first embodiment, but, the present embodiment is different from the first embodiment in a form of a gate electrode. FIG. 18 is a schematic sectional view illustrating a schematic configuration of a semiconductor device including VNW transistors according to the second embodiment.

Similarly to the first embodiment, there is provided a VNW transistor arrangement region 10 having plural VNW transistors 11A and plural dummy VNW transistors 11B at the periphery of the plural VNW transistors 11A. In the present embodiment, as indicated in a circle C in FIG. 18, a gate electrode of the VNW transistor arrangement region 10 is divided, together with the gate insulating film 21, between the plural VNW transistors 11A and the plural dummy VNW transistors 11B, resulting in that the gate electrodes are electrically isolated from each other. The gate electrode of the VNW transistor 11A is set to a gate electrode 22A, and the gate electrode of the dummy VNW transistor 11B is set to a gate electrode 22B.

On the dummy VNW transistor 11B, a top plate which is connected to the upper end portion 17b is not formed, and there is no electrical connection between the upper end portion 17b and another contact plug, wiring, or the like. Besides, the gate electrode 22B of the dummy VNW transistor 11B is electrically isolated from the gate electrode 22A of the VNW transistor 11A, and thus a voltage which is applied to the gate electrode 22A, is not applied to the gate electrode 22B. Because of these configurations, the dummy VNW transistor 11B is in a state where it does not function as a transistor.

In the semiconductor device of the present embodiment, the configuration other than the above is similar to that of the first embodiment.

Note that in the present embodiment, it is also possible to provide the top plate also on the upper end portion 17b of the dummy VNW transistor 11B. Further, it is also possible to design such that the top plate is not provided also on the upper end portion 17b of the VNW transistor 11A, and the contact plug 24 is directly connected onto the upper end portion 17b.

In the present embodiment, the gate electrode 22B of the dummy VNW transistor 11B is electrically isolated from the gate electrode 22A of the VNW transistor 11A, so that the dummy VNW transistor 11B is securely in an electrically floating state. Because of the presence of the dummy VNW transistors 11B, the variation in dimensions, impurity profiles, and the like of the VNW transistors 11A during a manufacturing process, is suppressed. Consequently, the variation in characteristics of the VNW transistors 11A is suppressed.

MODIFIED EXAMPLES

Hereinafter, various modified examples of the semiconductor device of the second embodiment will be described.

Modified Example 1

Figure 19:
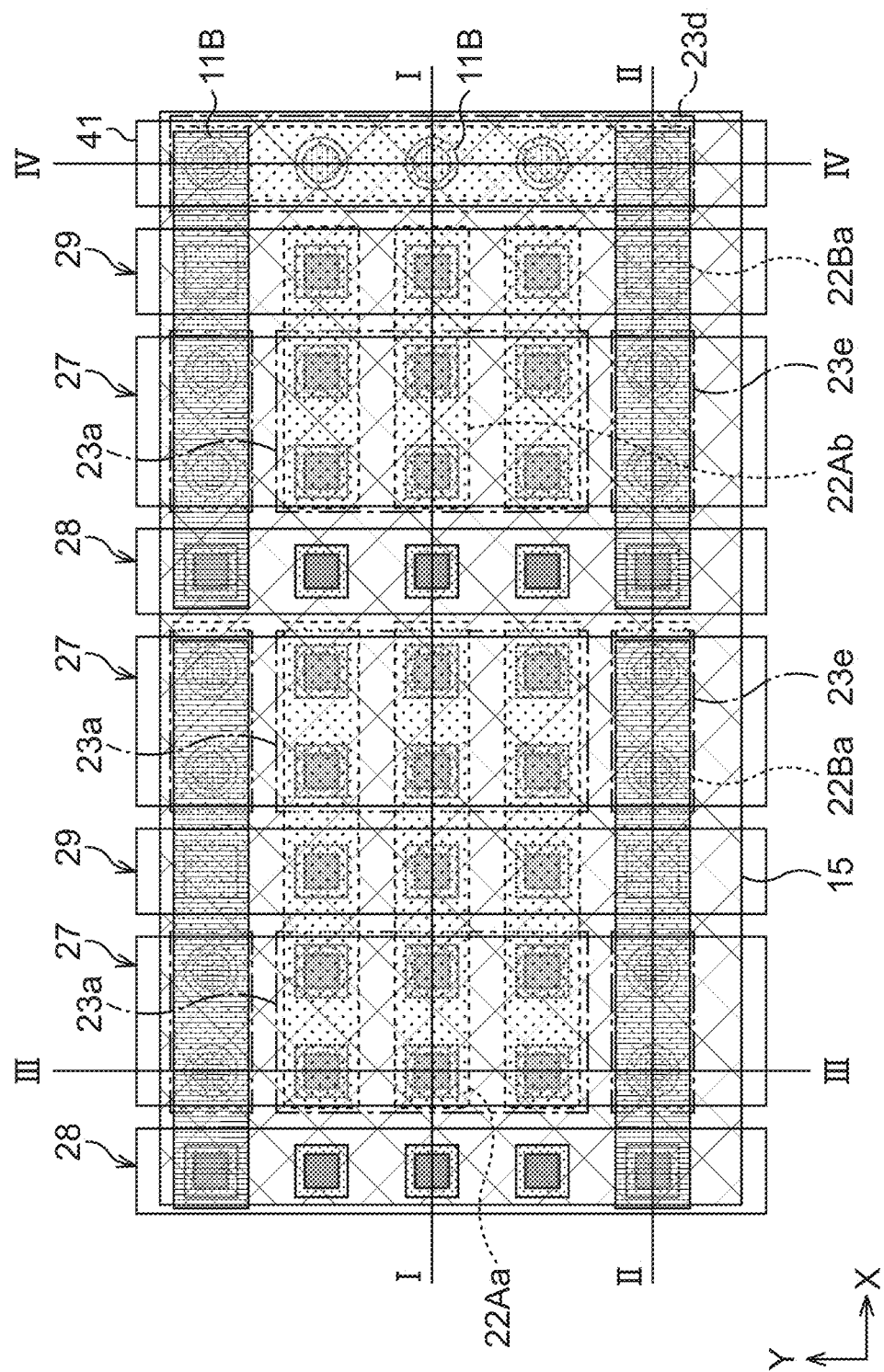
FIG. 19 is a plan view illustrating a schematic configuration of a semiconductor device including VNW transistors according to a modified example 1 of a second embodiment.
Figure 20:
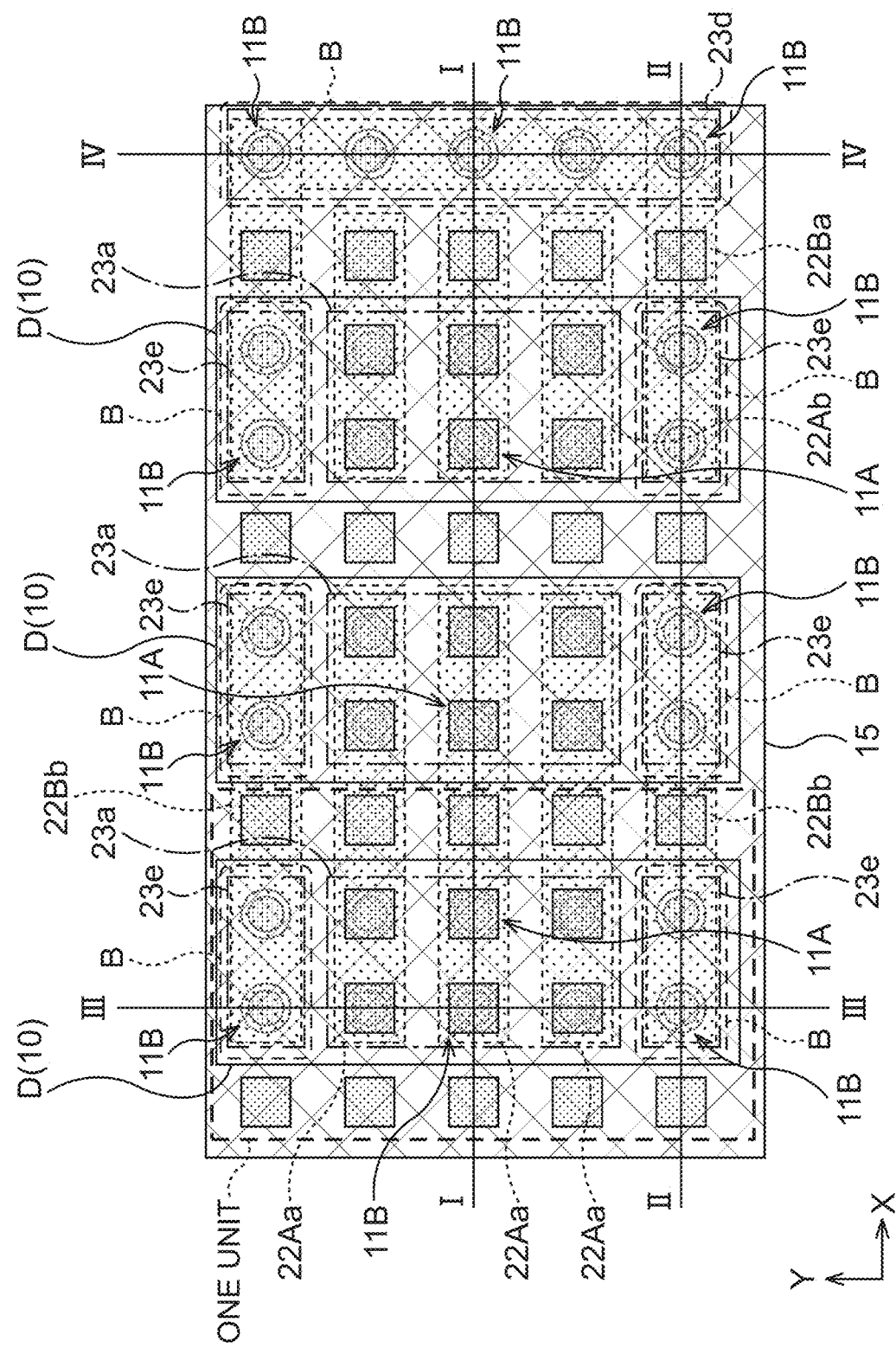
FIG. 20 is a plan view illustrating, regarding the semiconductor device including the VNW transistors according to the modified example 1 of the second embodiment, a schematic configuration as a result of removing a wiring structure on contact plugs from FIG. 19.
Figure 21:
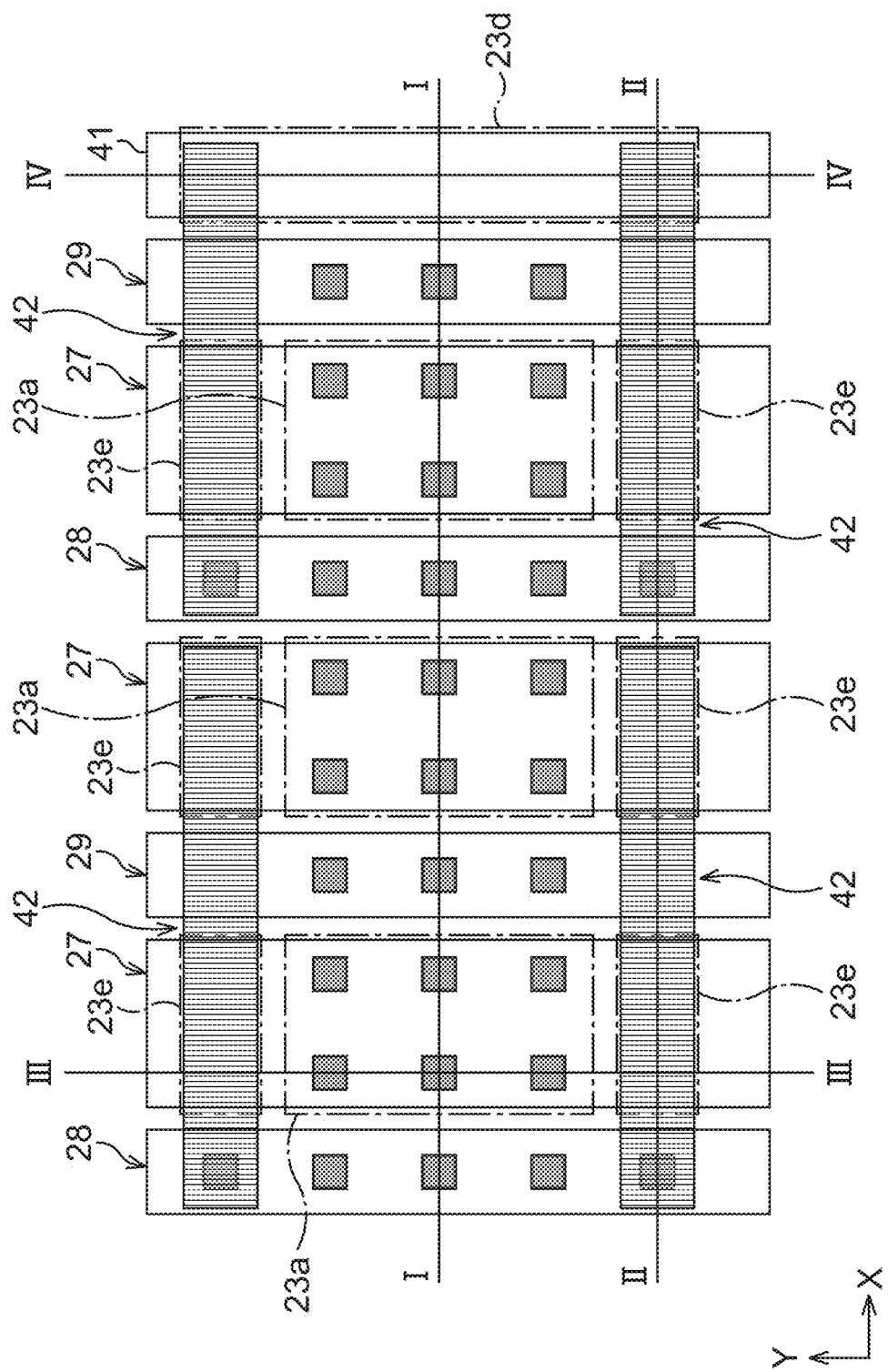
FIG. 21 is a plan view illustrating, regarding the semiconductor device including the VNW transistors according to the modified example 1 of the second embodiment, a schematic configuration of only top plates and wirings above the top plates in FIG. 19.
Figure 22:
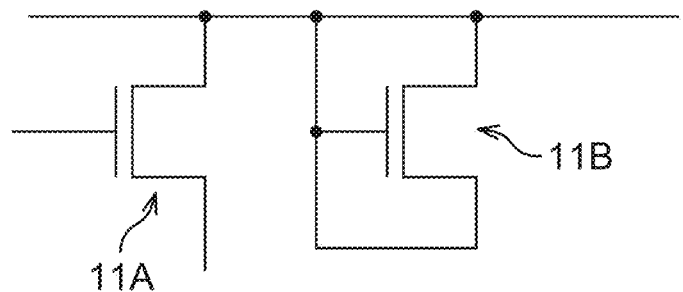
FIG. 22 is a connection diagram illustrating a connection state between a VNW transistor and a dummy VNW transistor below a local interconnector.
Figure 23A:
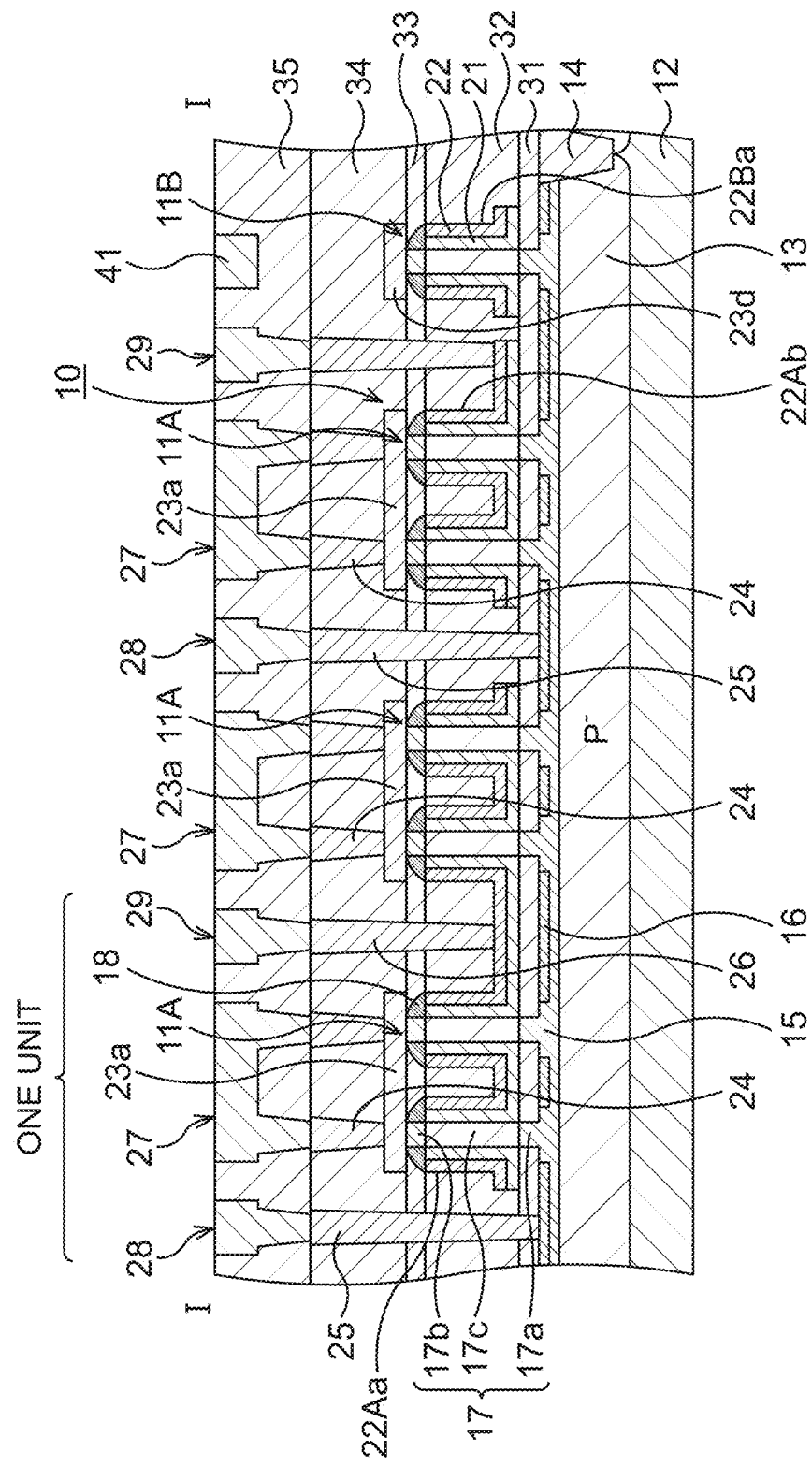
FIG. 23A is a sectional view illustrating a cross section taken along a line segment I-I in FIG. 19.
Figure 23B:
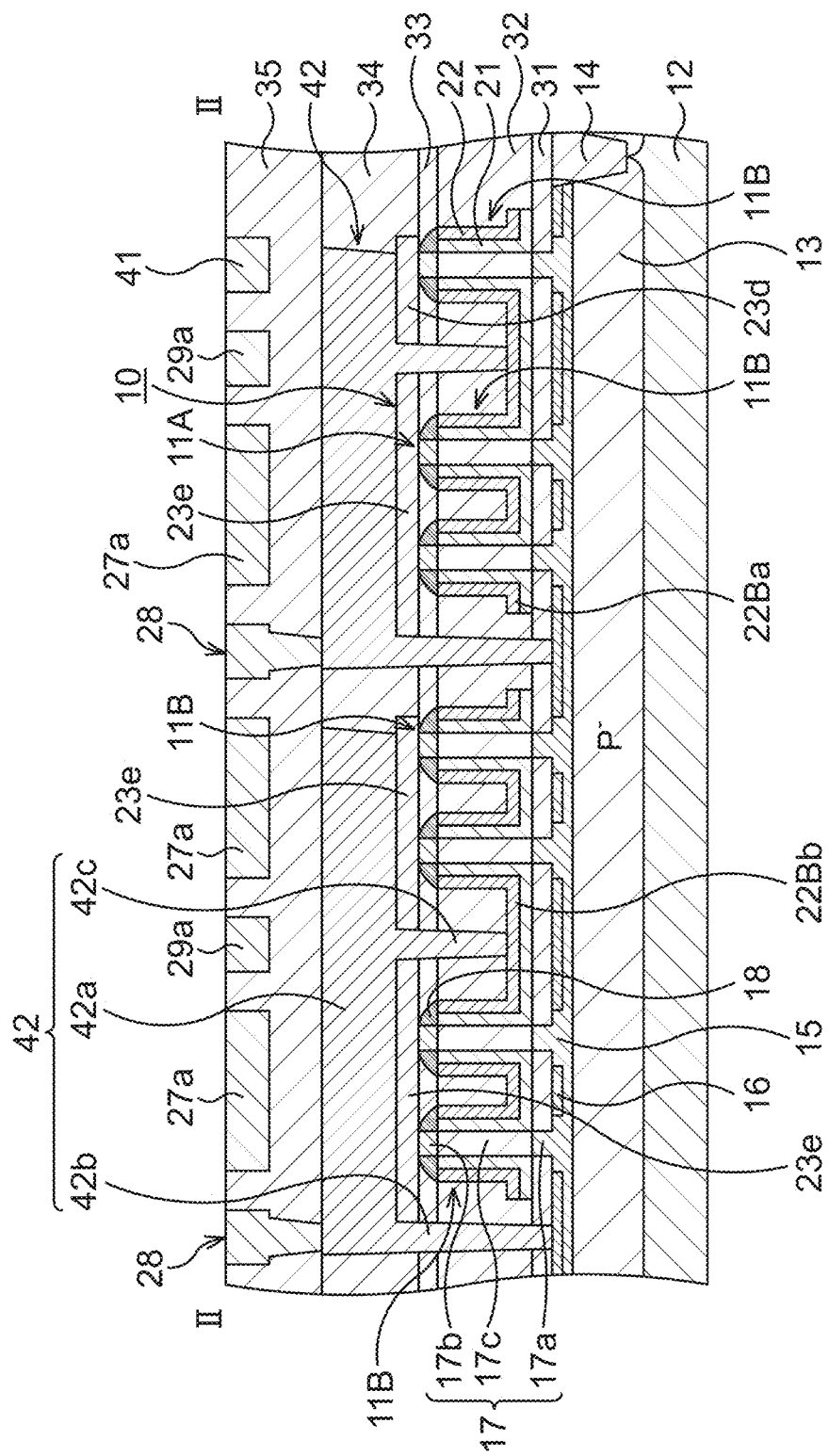
FIG. 23B is a sectional view illustrating a cross section taken along a line segment II-II in FIG. 19.
Figure 23C:
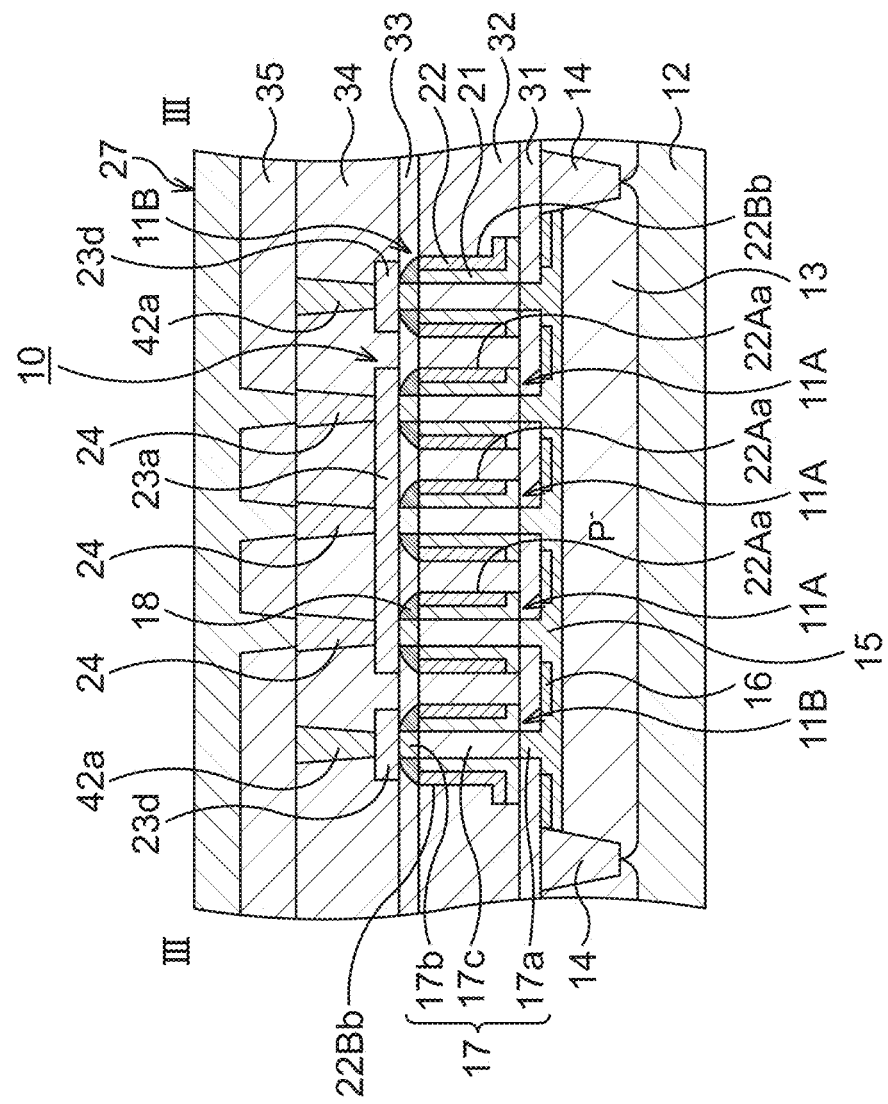
FIG. 23C is a sectional view illustrating a cross section taken along a line segment III-III in FIG. 19.
Figure 23D:
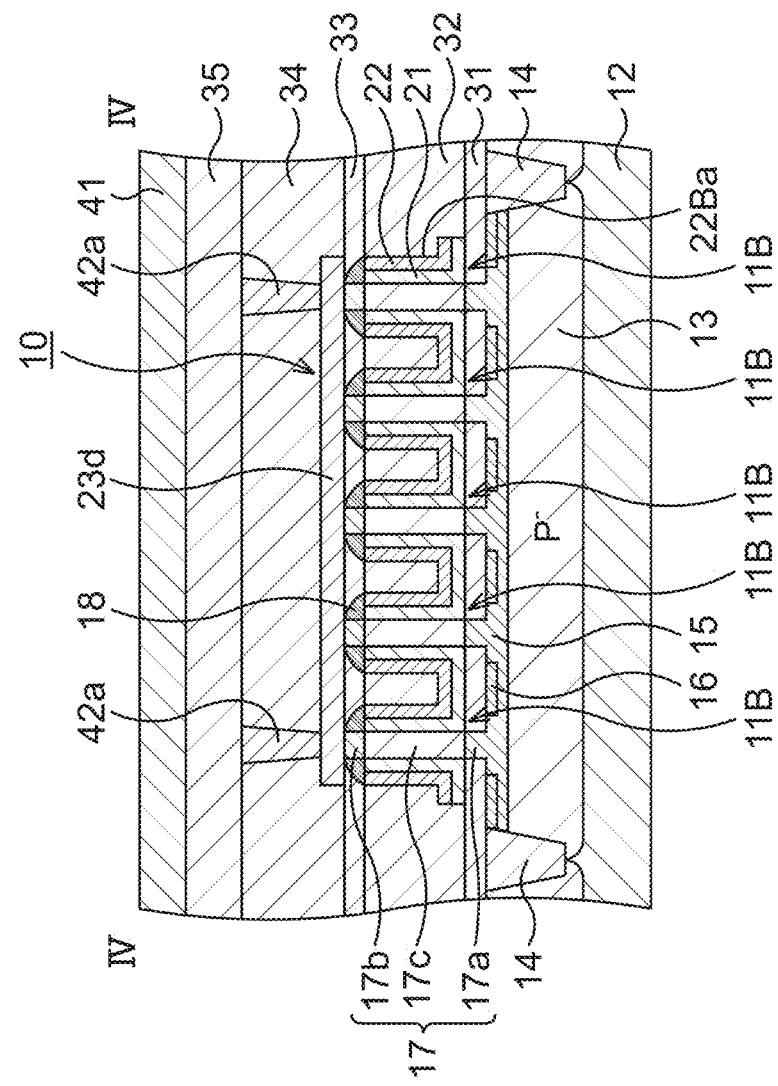
FIG. 23D is a sectional view illustrating a cross section taken along a line segment IV-IV in FIG. 19.

FIG. 19 is a plan view illustrating a schematic configuration of a semiconductor device including VNW transistors according to a modified example 1 of the second embodiment. FIG. 20 is a plan view illustrating, regarding the semiconductor device including the VNW transistors according to the modified example 1 of the second embodiment, a schematic configuration as a result of removing a wiring structure on contact plugs from FIG. 19. FIG. 21 is a plan view illustrating, regarding the semiconductor device including the VNW transistors according to the modified example 1 of the second embodiment, a schematic configuration of only top plates and wirings above the top plates in FIG. 19. FIG. 22 is a connection diagram illustrating a connection state between a VNW transistor and a dummy VNW transistor below a local interconnector. FIG. 23A is a sectional view illustrating a cross section taken along a line segment I-I in FIG. 19. FIG. 23B is a sectional view illustrating a cross section taken along a line segment II-II in FIG. 19. FIG. 23C is a sectional view illustrating a cross section taken along a line segment III-III in FIG. 19. FIG. 23D is a sectional view illustrating a cross section taken along a line segment IV-IV in FIG. 19. Note that each of the plan views of FIG. 19 to FIG. 21, is a view illustrating, for example, a right end part of the circuit arrangement region 40 in FIG. 12 or a right end part of the circuit arrangement region 40A or 40B in FIG. 17 in an enlarged manner.

In the present example, plural VNW transistor arrangement regions 10 are arranged in parallel. Each VNW transistor arrangement region 10 is indicated by a solid line frame D in FIG. 20, for example. The VNW transistor arrangement region 10 is a rectangular region having a side extending in the X direction and a side extending in the Y direction in a plane view. In the VNW transistor arrangement region 10, plural (two in the X direction and three in the Y direction, namely, six in total, for example) VNW transistors 11A are arranged. Further, two dummy VNW transistors 11B are arranged along upper and lower sides, respectively, of the VNW transistor arrangement region 10. The VNW transistors 11A are arranged by being sandwiched by the dummy VNW transistors 11B arranged on the upper and lower sides in a plane view. In FIG. 20, a part in which the dummy VNW transistors 11B are arranged side by side is illustrated by being surrounded by a dotted line frame B.

In the VNW transistor arrangement region 10, a gate electrode 22Aa of one layer is formed, together with the gate insulating film 21, for every plural VNW transistors 11A arranged in a line in the X direction. In the above-described VNW transistor arrangement region 10, a gate electrode 22Bb of one layer is formed, together with the gate insulating film 21, with respect to the plural dummy VNW transistors 11B arranged in a line in the X direction. Further, as illustrated in FIG. 19 and FIG. 20, in adjacent two VNW transistor arrangement regions 10, for example, the gate electrodes 22Aa may be integrally formed, and the gate electrodes 22Bb may be integrally formed. Similarly to the modified example 3 of the first embodiment, it is also possible that, for example, a configuration including the VNW transistors 11A and the dummy VNW transistors 11B in one VNW transistor arrangement region 10, the contact plugs 25, and the contact plugs 24 (indicated by a dotted line frame in FIG. 20), is set as one unit. Further, a plurality of the one unit may be arranged in parallel, the one unit may be arranged by being reversed, or the one unit may be arranged while sharing a part of configuration with different one unit in a plane view. The gate electrode 22Aa and the gate electrode 22Bb are divided, and are electrically isolated.

In the VNW transistor arrangement region 10 at each of a right end part and a left end part of the circuit arrangement region, a gate electrode 22Ab of one layer is formed together with the gate insulating film 21 for every plural VNW transistors 11A arranged in a line in the X direction. With respect to plural dummy VNW transistors 11B arranged at positions along upper and lower sides of the VNW transistor arrangement region 10 at each of the right end part and the left end part and positions extending in the Y direction at each of the rightmost end and the leftmost end, the gate insulating film 21 and the gate electrode 22Ba are commonly formed.

The gate electrode 22Ab and the gate electrode 22Bb are divided, and are electrically isolated.

In each of the VNW transistor arrangement regions 10, a common top plate 23a of one layer is connected onto the plural VNW transistors 11A, and a common top plate 23e of one layer is connected onto the plural dummy VNW transistors 11B. Onto the plural dummy VNW transistors 11B arranged in a line along the Y direction at each of the rightmost end and the leftmost end, a common top plate 23d of one layer is connected.

As illustrated in FIG. 19 and FIG. 23A, on the top plate 23a, plural contact plugs 24 are arranged in a line in the X direction, and the respective contact plugs 24 are electrically connected to the top plate 23. At the periphery of the plural VNW transistors 11A, plural contact plugs 25 are arranged in a line in the Y direction along one side extending in the Y direction, and plural contact plugs 26 are arranged in a line in the Y direction along one side facing the aforementioned one side. The contact plug 25 is brought into contact with the silicide layer 16 at a bottom surface, and is electrically connected to the lower end portion 17a via the silicide layer 16 and the bottom region 15. The contact plug 26 is electrically connected to the gate electrode 22.

On the contact plugs 24, 25, 26, wirings 27, 28, 29 are formed. Above a contact plug 43 on the top plate 23d, a dummy wiring 41 that is separated from the contact plug 43 via a part of the interlayer insulating film 35 is formed. By providing the dummy wiring 41 to an end part of the circuit arrangement region (although the dummy wiring 41 is provided to the right end in the illustrated example, it is also possible to be provided to the left end), it is possible to suppress the variation in dimensions due to an influence of a manufacturing process of wirings adjacent to the dummy wiring 41, such as the wirings 27 to 29. Each of the wirings 27, 28, 29, 41 may be arranged in a linear form (band form) in a manner that they are arranged to be parallel to each other in a plane view, for example (parallel in the Y direction in FIG. 19, for example). The wirings 27, 28, 29, 41 may also be arranged in a manner that, for example, they wind or a part thereof intersects in a plane view via a different wiring layer.

As illustrated in FIG. 19, FIG. 21, and FIG. 23B, on the two top plates 23e which are adjacent in the X direction, one local interconnector 42 is formed so as to be brought into contact with these top plates 23e. The local interconnector 42 includes a wiring portion 42a, and via portions 42b, 42c, which are integrally formed, in which the via portion 42b is connected to the silicide layer 16, and the via portion 42c is connected to the gate electrode 22Bb. The local interconnector 42 is connected to the wiring 28 positioned thereon.

The VNW transistors 11A, 11B, a part of the contact plugs 25, 26, and a part of the local interconnector 42 are formed in the insulating film 31 and the interlayer insulating films 32, 33. The top plates 23a, 23d, 23e, the contact plugs 24, 43, another part of the contact plugs 25, 26, and another part of the local interconnector 42 are formed in the interlayer insulating film 34. The wirings 27, 28, 29, and the dummy wiring 41 are formed in the interlayer insulating film 35.

In the semiconductor device of the present example, the configuration other than the above is similar to that of the second embodiment.

Note that as illustrated in FIG. 23A and FIG. 23D, there is no contact plug or the like arranged between the top plate 23d and the dummy wiring 41, except for a part of the local interconnect 42a. However, it is also possible to arrange a dummy contact plug between two local interconnects 42a in a plane view. In this case, it is possible to suppress the variation in dimensions and so on in a manufacturing process of the contact plugs 24, 25, 26 arranged in the vicinity.

Regarding the dummy VNW transistor 11B, the lower end portion 17a, the upper end portion 17b, and the gate electrode 22Bb are electrically connected via the bottom region 15, the silicide layer 16, the local interconnector 42, and the top plate 23e. In like manner, the gate electrode 22Ba is also electrically connected to the lower end portion 17a and the upper end portion 17b via the local interconnector 42, the top plate 23e, the silicide layer 16, and the bottom region 15. Specifically, in the dummy VNW transistor 11B, a gate, a source, and a drain are set to have the same electric potential. Consequently, the dummy VNW transistor 11B does not function as a transistor. Further, a predetermined electric potential is supplied from the wiring 28 to the bottom region 15 via the local interconnector 42 or the like, so that the electric potential of the bottom region 15 is supplied to both the lower end portion 17a and the upper end portion 17b of the dummy VNW transistor 11B. Consequently, occurrence of adverse effect due to an unexpected operation of the dummy VNW transistor 11B is suppressed. Note that the wiring 28 may be either a Vdd power supply wiring or a Vss power supply wiring.

In the present example, because of the presence of the dummy VNW transistors 11B, the variation in dimensions, impurity profiles, and the like of the VNW transistors 11A during a manufacturing process, is suppressed. Consequently, the variation in characteristics of the VNW transistors 11A is suppressed.

Modified Example 2

Figure 24:
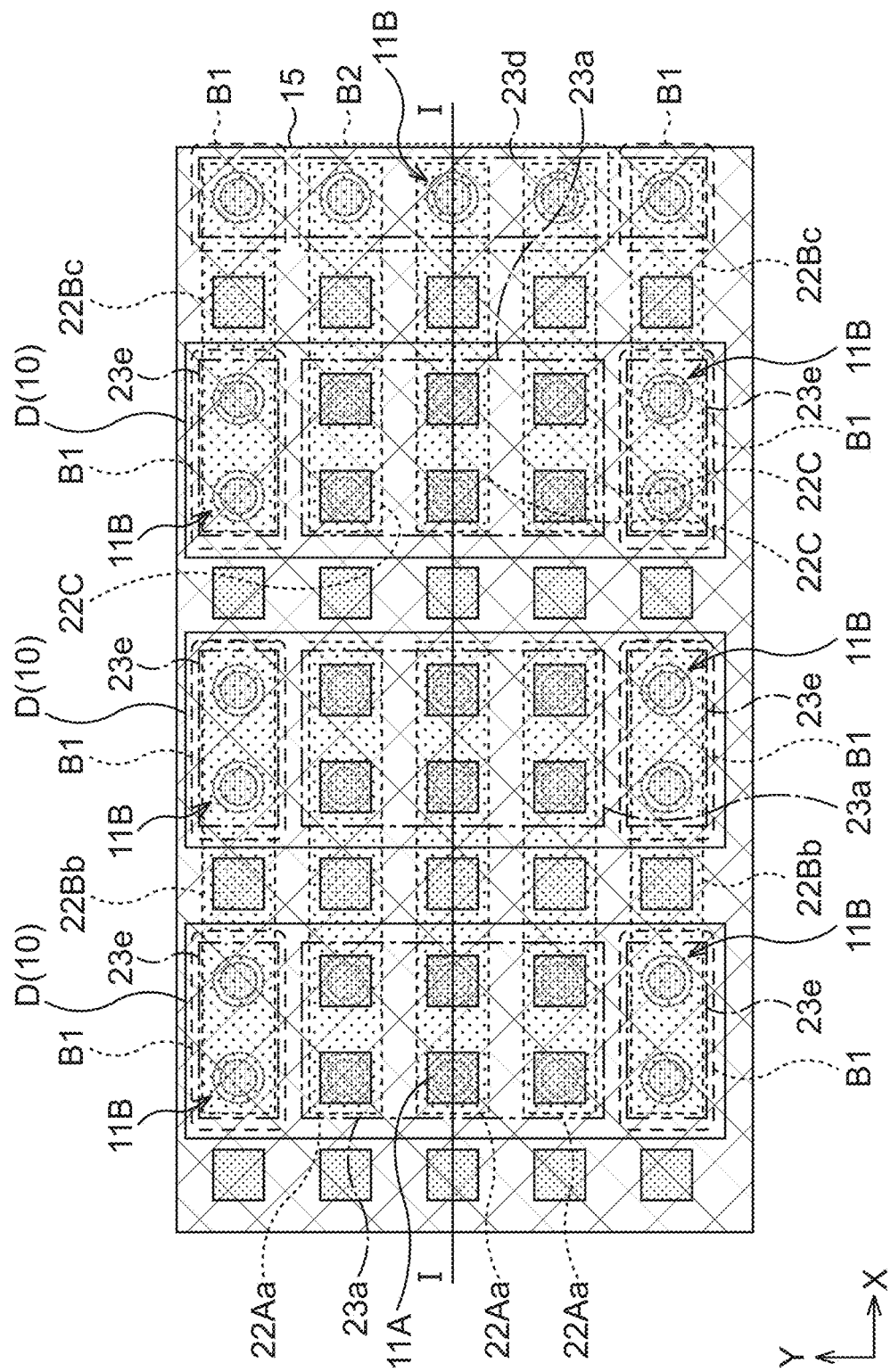
FIG. 24 is a plan view illustrating a schematic configuration of a semiconductor device including VNW transistors according to a modified example 2 of the second embodiment.
Figure 25:
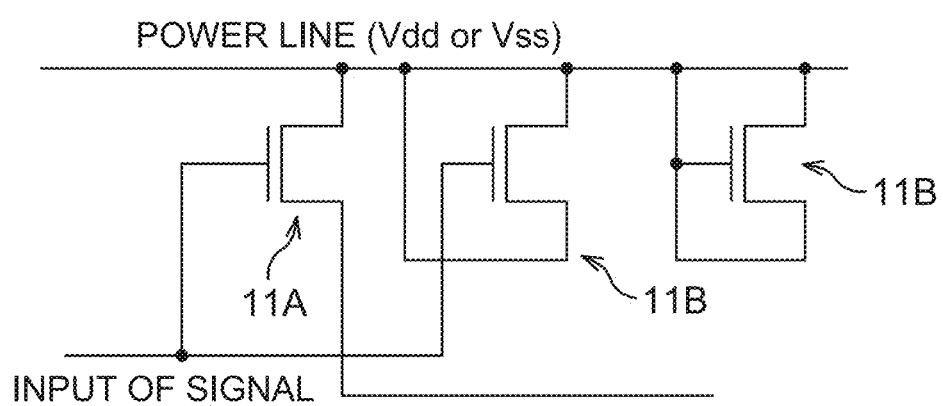
FIG. 25 is a connection diagram illustrating a connection state between a VNW transistor and respective dummy VNW transistors.

FIG. 24 is a plan view illustrating a schematic configuration of a semiconductor device including VNW transistors according to a modified example 2 of the second embodiment. FIG. 25 is a connection diagram illustrating a connection state between a VNW transistor and respective dummy VNW transistors. Note that the plan view of FIG. 24 is a view illustrating, for example, a right end part of the circuit arrangement region 40 in FIG. 12 or a right end part of the circuit arrangement region 40A or 40B in FIG. 17 in an enlarged manner.

In the present example, plural VNW transistor arrangement regions 10 are arranged in parallel, similarly to the modified example 1. The VNW transistor arrangement region 10 is a rectangular region having a side extending in the X direction and a side extending in the Y direction in a plane view. The VNW transistor arrangement region 10 is indicated by a solid line frame D in FIG. 24, for example. In each of the VNW transistor arrangement regions 10, for example, plural VNW transistors 11A in a matrix form are arranged, and plural (two in the illustrated example) dummy VNW transistors 11B are arranged along the X direction, on each of two sides extending in the X direction and sandwiching the VNW transistors 11A. At the rightmost end and the leftmost end (only the rightmost end is illustrated in the illustrated example), plural (five in the illustrated example) dummy VNW transistors 11B are arranged in a line along the Y direction. The number of the VNW transistors 11A and the dummy VNW transistors 11B to be arranged, may be different from the above-described number.

In the VNW transistor arrangement region 10, a gate electrode 22Aa of one layer is formed, together with the gate insulating film 21, for every plural VNW transistors 11A arranged in a line in the X direction. In the above-described VNW transistor arrangement region 10, a gate electrode 22Bb of one layer is formed, together with the gate insulating film 21, with respect to the plural dummy VNW transistors 11B arranged in a line in the X direction. Further, as illustrated in FIG. 24, in adjacent two VNW transistor arrangement regions 10, for example, the gate electrodes 22Aa may be integrally formed, and the gate electrodes 22Bb may be integrally formed. The respective gate electrodes 22Aa, 22Bb are respectively divided, and electrically isolated. For example, a configuration including the VNW transistors 11A and the dummy VNW transistors 11B in one VNW transistor arrangement region 10, and the contact plugs 24 to 26, may be set as one unit. Further, a plurality of the one unit may be arranged in parallel, the one unit may be arranged by being reversed, or the one unit may be arranged while sharing a part of configuration with different one unit in a plane view.

With respect to the plural VNW transistors 11A arranged in a line in the X direction in the VNW transistor arrangement region 10 and one dummy VNW transistor 11B arranged at each of the right end part and the left end part of the circuit arrangement region, a gate electrode 22C of one layer is formed together with the gate insulating film 21. A gate electrode 22Bc of one layer is formed together with the gate insulating film 21, for every plural dummy VNW transistors 11B in the VNW transistor arrangement region 10 of each of the right end part and the left end part and the dummy VNW transistor 11B at each of the rightmost end and the leftmost end. In FIG. 24, the dummy VNW transistors 11B each sharing the gate electrode 22C with the VNW transistors 11A are indicated by being surrounded by a dotted line frame B2, and the other dummy VNW transistors 11B are indicated by being surrounded by a dotted line frame B1.

The respective gate electrodes 22Aa and 22Bb are respectively divided and electrically isolated. The respective gate electrodes 22Bc and 22C are respectively divided and electrically isolated. In the present example, all of the gate electrodes 22Aa, 22Bb, 22Bc, 22C are formed in a rectangular shape in which they extend in one direction in the X direction, for example, and it is possible to easily form the gate electrodes 22Aa, 22Bb, 22Bc, 22C.

As illustrated in FIG. 25, in the dummy VNW transistor 11B indicated by the dotted line frame B1, a source and a drain are set to have the same electric potential, and thus the dummy VNW transistor 11B does not function as a transistor. In the dummy VNW transistor 11B indicated by the dotted line frame B2, a gate, a source, and a drain are set to have the same electric potential, and thus the dummy VNW transistor 11B does not function as a transistor. In this case, a predetermined electric potential is supplied from the wiring 28 to the bottom region 15 via the local interconnector 42 or the like, so that the electric potential of the bottom region 15 is supplied to both the lower end portion 17a and the upper end portion 17b of the dummy VNW transistor 11B. Consequently, occurrence of adverse effect due to an unexpected operation of the dummy VNW transistor 11B is suppressed. Note that the wiring which is connected to the dummy VNW transistors 11B indicated by the dotted line frames B1 and B2 may be either a Vdd power supply wiring or a Vss power supply wiring, as illustrated in FIG. 25.

In the semiconductor device of the present example, the configuration other than the above is similar to that of the modified example 1 of the second embodiment.

In the present example, because of the presence of the dummy VNW transistors 11B, the variation in dimensions, impurity profiles, and the like of the VNW transistors 11A during a manufacturing process, is suppressed. Consequently, the variation in characteristics of the VNW transistors 11A is suppressed.

Modified Example 3

Figure 26:
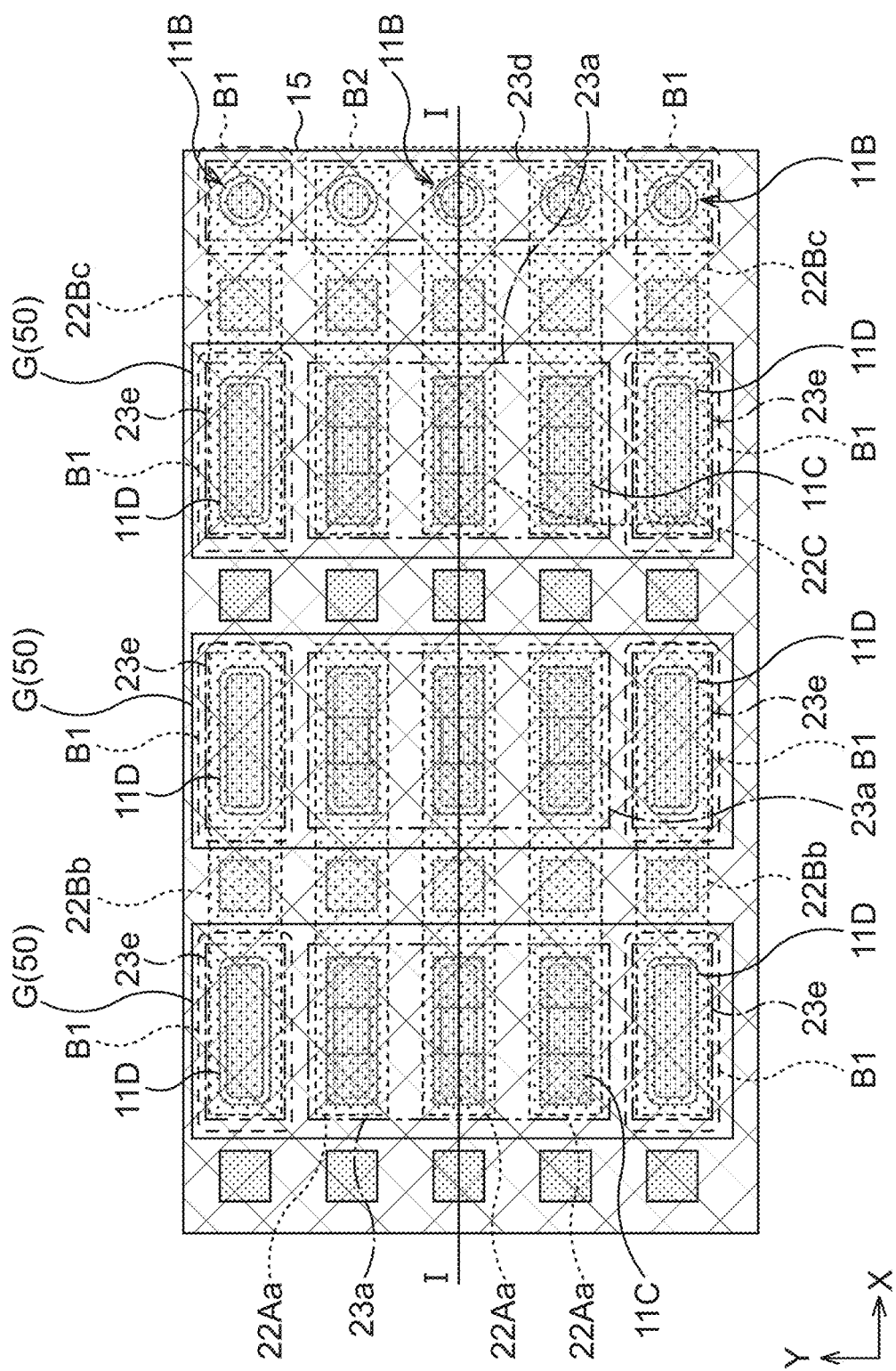
FIG. 26 is a plan view illustrating a schematic configuration of a semiconductor device including VNW transistors according to a modified example 3 of the second embodiment.
Figure 27:
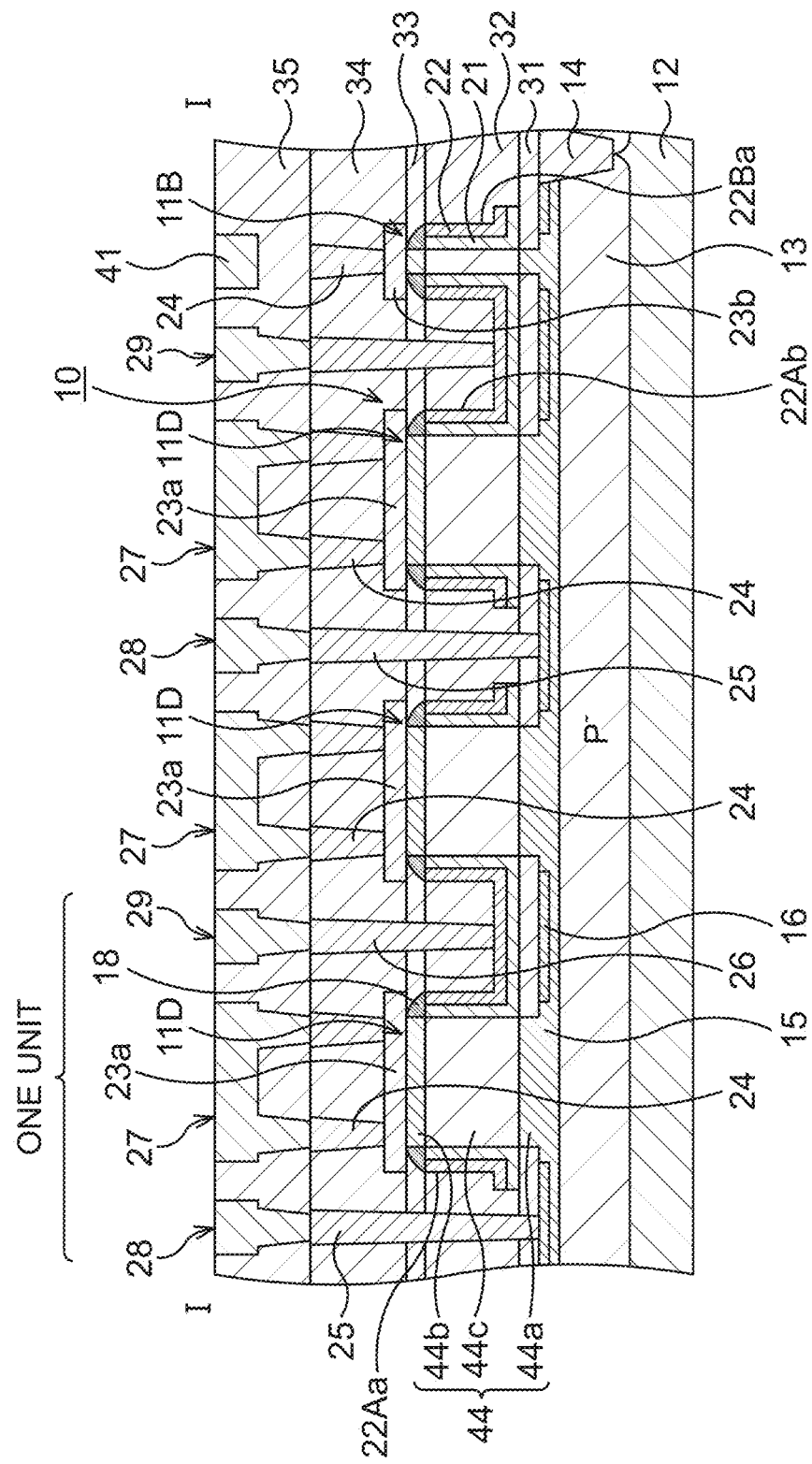
FIG. 27 is a sectional view illustrating a cross section taken along a line segment I-I in FIG. 26.

FIG. 26 is a plan view illustrating a schematic configuration of a semiconductor device including VNW transistors according to a modified example 3 of the second embodiment. FIG. 27 is a sectional view illustrating a cross section taken along a line segment I-I in FIG. 26. Note that the plan view of FIG. 26 may be a view illustrating, for example, a right end part of the circuit arrangement region 40 in FIG. 12 or a right end part of the circuit arrangement region 40A or 40B in FIG. 17 in an enlarged manner.

The present example is different from the modified example 2 of the second embodiment in that it employs a VNS (Vertical Nano Sheet) structure in which at least a part of transistors and dummy transistors has a semiconductor nanosheet being a sheet-shaped projection, in place of the semiconductor nanowire.

In the present example, plural projecting semiconductor nanosheets 44 are formed vertically from the surface of the semiconductor substrate 12. Each of the plural semiconductor nanosheets 44 is formed with a VNS transistor having a lower end portion 44a, an upper end portion 44b, and a middle portion 44c between the lower end portion 44a and the upper end portion 44b. The plural VNS transistors are made as VNS transistors 11C and dummy VNS transistors 11D at the periphery of the VNS transistors 11C. The semiconductor nanosheet 44 of each of the VNS transistors 11C and the dummy VNS transistors 11D is arranged so that a longitudinal direction thereof extends in the X direction, in the example of FIG. 26. The lower end portion 44a has a conductivity type of N-type, and is electrically connected to the bottom region 15. The upper end portion 44b has a conductivity type of N-type. The middle portion 44c has a conductivity type of P-type, and it becomes a channel region. One of the lower end portion 44a and the upper end portion 44b becomes a source electrode, and the other becomes a drain electrode. On side surfaces of the upper end portion 44b, a sidewall 18 of an insulating film is formed. The lower end portions 44a of the VNS transistors 11C and the dummy VNS transistors 11D are electrically connected to each other by the bottom region 15. Note that it is also possible that the lower end portion 44a and the upper end portion 44b are formed to have the conductivity type of P-type, and the middle portion 44c is formed to have the conductivity type of N-type. Further, when the semiconductor substrate 12 is a P-type substrate, the formation of the P-well 13 may be omitted. Further, the channel region of the middle portion 44c may also be a non-doped channel region in which an impurity is not implanted.

In the present example, plural VNS transistor arrangement regions 50 are arranged in parallel.

The VNS transistor arrangement region 50 is a rectangular region having a side extending in the X direction and a side extending in the Y direction in a plane view. The VNS transistor arrangement region 50 is indicated by a solid line frame G in FIG. 26, for example. In each of the VNS transistor arrangement regions 50, for example, plural (three in the illustrated example) VNS transistors 11C are arranged along the Y direction, and a dummy VNS transistor 11D (whose number is one in the illustrated example) is arranged on each of two sides extending in the X direction and sandwiching the VNS transistors 11C. At the rightmost end and the leftmost end (only the rightmost end is illustrated in the illustrated example) of the circuit arrangement region, plural (five in the illustrated example) dummy VNW transistors 11B are arranged in a line along the Y direction. Note that it is also possible to arrange the dummy VNW transistors 11B in place of the dummy VNS transistors 11D. Further, it is also possible to arrange the dummy VNS transistors 11D in place of the dummy VNW transistors 11B at the rightmost end and the leftmost end of the circuit arrangement region.

In the VNS transistor arrangement region 50, a gate electrode 22Aa of one layer is formed, together with the gate insulating film 21, for every two VNS transistors 11C arranged in a line in the X direction. In the VNS transistor arrangement region 50, a gate electrode 22Bb of one layer is formed, together with the gate insulating film 21, with respect to two dummy VNS transistors 11D arranged in a line in the X direction. Further, it is also possible that, as illustrated in FIG. 26, in adjacent two VNS transistor arrangement regions 50, for example, the gate electrodes 22Aa may be integrally formed, and the gate electrodes 22Bb may be integrally formed. The respective gate electrodes 22Aa, 22Bb are respectively divided, and electrically isolated. For example, a configuration including the VNS transistors 11C and the dummy VNS transistors 11D in one VNS transistor arrangement region 50, and the contact plugs 24 to 26, may be set as one unit. Further, a plurality of the one unit may be arranged in parallel, the one unit may be arranged by being reversed, or the one unit may be arranged while sharing a part of configuration with different one unit in a plane view.

For every one VNS transistor 11C arranged in the X direction in the VNS transistor arrangement region 50 and one dummy VNW transistor 11B arranged at each of the right end part and the left end part of the circuit arrangement region, a gate electrode 22C of one layer is formed together with the gate insulating film 21. A gate electrode 22Bc of one layer is formed together with the gate insulating film 21, for every one dummy VNS transistor 11D arranged in the X direction in the VNS transistor arrangement region 50 and one dummy VNW transistor 11B arranged at each of the right end part and the left end part. In FIG. 26, the dummy VNW transistors 11B each sharing the gate electrode 22C with the VNS transistor 11C are indicated by being surrounded by a dotted line frame B2, and the other dummy VNW transistors 11B and dummy VNS transistors 11D are indicated by being surrounded by a dotted line frame B1.

In the dummy VNW transistor 11B and the dummy VNS transistor 11D indicated by the dotted line frame B1, a source and a drain are set to have the same electric potential, and thus the dummy VNW transistor 11B and the dummy VNS transistor 11D do not function as transistors. In the dummy VNW transistor 11B indicated by the dotted line frame B2, a gate, a source, and a drain are set to have the same electric potential, and thus the dummy VNW transistor 11B does not function as a transistor. In this case, a predetermined electric potential is supplied from the wiring 28 to the bottom region 15 via the local interconnector 42 or the like, so that the electric potential of the bottom region 15 is supplied to both the lower end portion 17a and the upper end portion 17b of the dummy VNW transistor 11B. Consequently, occurrence of adverse effect due to an unexpected operation of the dummy VNW transistor 11B is suppressed.

In the semiconductor device of the present example, the configuration other than the above is similar to that of the modified example 2 of the second embodiment.

In the present example, because of the presence of the dummy VNW transistors 11B and the dummy VNS transistors 11D, the variation in dimensions, impurity profiles, and the like of the VNS transistors 11C during a manufacturing process, is suppressed. Consequently, the variation in characteristics of the VNS transistors 11C is suppressed.

Third Embodiment

Figure 28A:
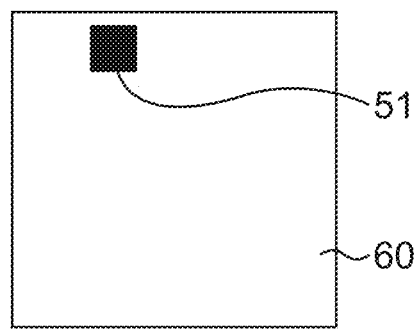
FIG. 28A is a schematic view illustrating a semiconductor chip of a semiconductor device according to a third embodiment.
Figure 28B:
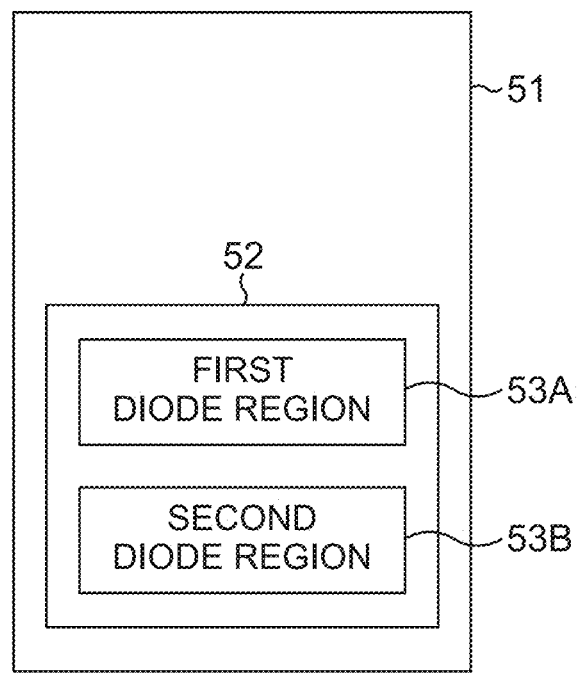
FIG. 28B is a schematic view illustrating an I/O circuit included in the semiconductor device according to the third embodiment.
Figure 28C:
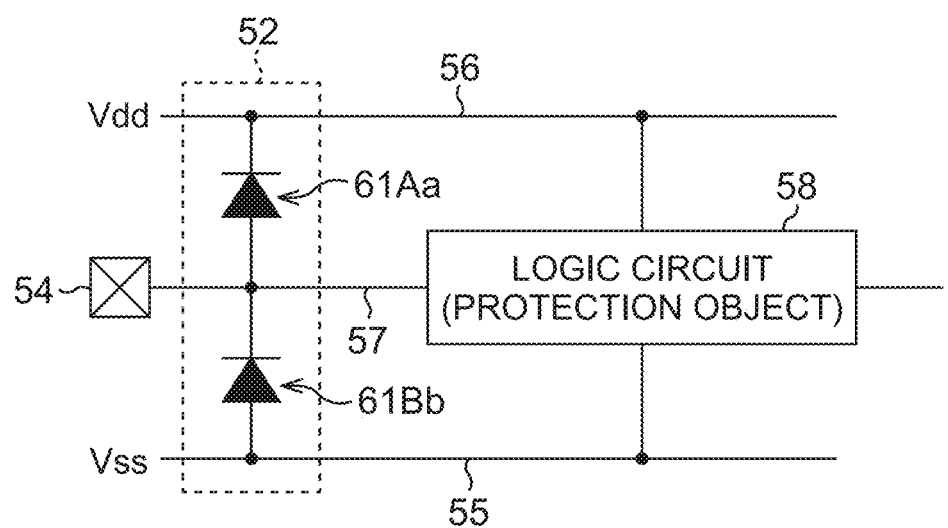
FIG. 28C is an example of a circuit diagram illustrating a schematic configuration of a semiconductor device including VNW diodes as ESD protection diodes in the third embodiment.
Figure 29:
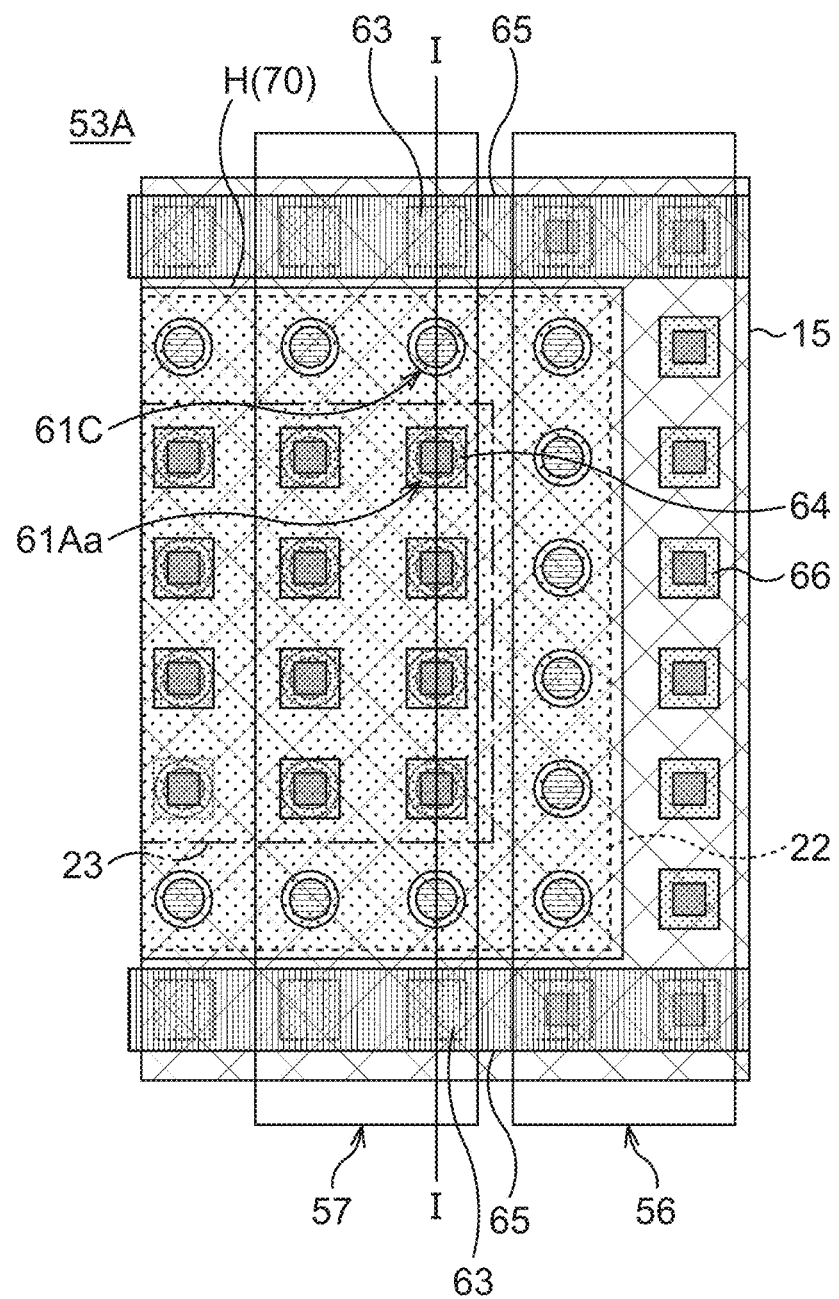
FIG. 29 is a plan view illustrating a part of a schematic configuration of the semiconductor device including the VNW diodes according to the third embodiment.
Figure 30:
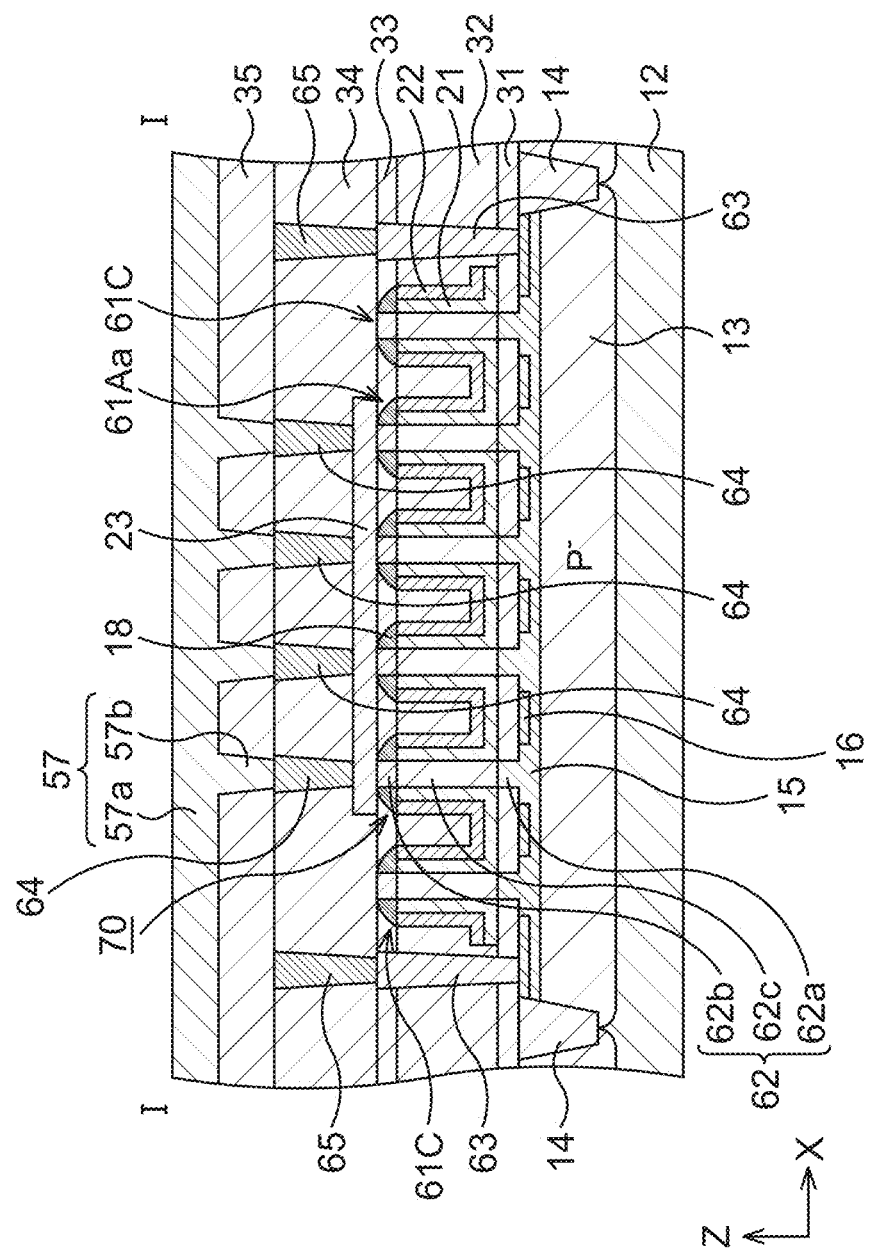
FIG. 30 is a sectional view illustrating a cross section taken along a line segment I-I in FIG. 29.

The present embodiment discloses a semiconductor device including, as VNW elements, VNW diodes as ESD protection diodes. FIG. 28A is a schematic view illustrating a semiconductor chip of a semiconductor device according to the third embodiment. FIG. 28B is a schematic view illustrating an I/O circuit included in the semiconductor device according to the third embodiment. FIG. 28C is an example of a circuit diagram illustrating a schematic configuration of a semiconductor device including VNW diodes as ESD protection diodes in the third embodiment. FIG. 29 is a plan view illustrating a part of a schematic configuration of the semiconductor device including the VNW diodes according to the third embodiment. FIG. 30 is a sectional view illustrating a cross section taken along a line segment I-I in FIG. 29.

In the semiconductor device according to the present embodiment, an I/O circuit 51 is provided at an outer peripheral part, for example, of a semiconductor chip 60, as illustrated in FIG. 28A. Note that the I/O circuit may also be arranged below an external connection terminal (pad). An ESD protection diode of the semiconductor device is provided as a part of protection circuit 52 of the I/O circuit 51, as illustrated in FIG. 28B. The protection circuit 52 includes a first diode region 53A and a second diode region 53B.

The first diode region 53A corresponds to a VNW diode 61Aa in FIG. 28C, and the second diode region 53B corresponds to a VNW diode 61Bb in FIG. 28C.

As illustrated in FIG. 28C, the semiconductor device according to the present embodiment includes a logic circuit 58 and the protection circuit 52. The logic circuit 58 is a semiconductor circuit being an object to be protected from a surge current, and it includes a functional element such as, for example, a transistor or a resistor element. The protection circuit 52 includes plural VNW diodes 61Aa (only one of them is exemplified in FIG. 28C) connected between a node of a Pad wiring 57 which is electrically connected to a signal pad 54 and a node of a Vdd power line 56. Further, the protection circuit 52 includes plural VNW diodes 61Bb (only one of them is exemplified in FIG. 28C) connected between a node of the signal pad 54 and a node of a Vss power line 55. When a surge current is input from the signal pad 54, it is possible to suppress, with the use of the protection circuit 52, breakage of the logic circuit 58 due to the surge current. Note that in FIG. 28C, the ESD protection circuit 52 has the VNW diodes 61Aa and the VNW diodes 61Bb, but, it may also have only either of them.

In FIG. 29 and FIG. 30, the first diode region 53A is illustrated. Note that the second diode region 53B may also be configured similarly to the first diode region 53A.

The first diode region 53A has a VNW diode arrangement region 70 including plural VNW diodes arranged in an aggregated manner in a matrix form in a plane view, for example. For example, the VNW diode arrangement region 70 is a rectangular region having a side extending in the X direction and a side extending in the Y direction in a plane view. The VNW diode arrangement region 70 is indicated by a solid line frame H in FIG. 29. The VNW diode arrangement region 70 has, for example, a side along the X direction and a side along the Y direction, and FIG. 29 illustrates a part, in the VNW diode arrangement region 70, in which four VNW diodes in the X direction and six VNW diodes in the Y direction are arranged in a matrix form, for example. In the VNW diode group 70, plural VNW diodes aggregated on the inner side (only twelve of them are illustrated in the example of FIG. 29) are the VNW diodes 61Aa which are electrically connected to a wiring structure above the VNW diodes, to thereby function as diodes. Plural dummy VNW diodes 61C (only twelve of them are illustrated in the example of FIG. 29) are arranged at the periphery of these VNW diodes 61Aa (at positions along the side in the X direction and the side in the Y direction in the VNW diode arrangement region 70). The dummy VNW diode 61C has an upper end which is not electrically connected to (which is electrically isolated from) an upper end of the VNW diode 61Aa. Note that in the VNW diode arrangement region 70, the VNW diodes 61Aa and the dummy VNW diodes 61C at the periphery of the VNW diodes 61Aa may also be arranged in a form other than the matrix form in a plane view. The number of the VNW diodes 61Aa and the dummy VNW diodes 61C to be arranged may also be different from the above-described number. Further, it is also possible that the VNW diodes 61Aa, the dummy diodes 61C, and the like are arranged on the left side which is not illustrated in FIG. 29.

As illustrated in FIG. 30, in a region of a semiconductor substrate 12 demarcated by an STI element isolation region 14, a well 13 having a conductivity type of P-type, for example, is formed. On an upper part of the well 13, a bottom region 15 having a conductivity type of N-type is formed. On the surface of the semiconductor substrate 12, which is also an upper part of the bottom region 15, a silicide layer 16 is formed.

On the semiconductor substrate 12, plural projecting semiconductor nanowires 62 are formed vertically from the surface of the semiconductor substrate 12. As illustrated in FIG. 29, the plural semiconductor nanowires 62 are arranged in a matrix form in a plane view. Each of the plural semiconductor nanowires 62 is formed with a VNW diode having a lower end portion 62a, an upper end portion 62b, and a middle portion 62c between the lower end portion 62a and the upper end portion 62b. The plural VNW diodes are made as the VNW diodes 61Aa and the dummy VNW diodes 61C at the periphery of the VNW diodes 61Aa, as described above. The lower end portion 62a has a conductivity type of N-type, and is electrically connected to the bottom region 15. The upper end portion 62b has a conductivity type of P-type. The middle portion 62c has a conductivity type of P-type, and it forms a PN junction with the lower end portion 62a. The upper end portion 62b and the middle portion 62c become an anode, and the lower end portion 62a becomes a cathode. On side surfaces of the upper end portion 62b, a sidewall 18 of an insulating film is formed. The lower end portions 62a of the plural semiconductor nanowires 62 are electrically connected to each other by the bottom region 15. Note that a P-type impurity concentration of the middle portion 62c may be lower than or the same as an impurity concentration of the upper end portion 62b. Further, it is also possible to design such that the middle portion 62c has a conductivity type of, not the P-type, but the N-type, and it forms a PN junction with the upper end portion 62b. Further, when the semiconductor substrate 12 is a P-type substrate, the formation of the P-well 13 may be omitted. A planar shape of the semiconductor nanowire 62 may be, for example, a circular shape, an elliptical shape, a quadrangular shape, or a shape extending in one direction like the semiconductor nanosheet 44.

On side surfaces of each of the semiconductor nanowires 62, a gate electrode 22 is formed via a gate insulating film 21. In the present embodiment, the gate electrode 22 for the plural semiconductor nanowires 62 is formed as a conductive film of one layer as a whole. Note that the gate insulating film 21 and the gate electrode 22 are formed simultaneously with a gate insulating film and a gate electrode for a transistor of the logic circuit 58, for example, and the formation thereof with respect to the VNW diodes and the dummy VNW diodes may also be omitted.

On the plural VNW diodes 61Aa, a top plate 23 of one layer being a conductive film of silicide, metal, or the like, is formed. The upper end portions 62b of the semiconductor nanowires 62 of the respective VNW diodes 61Aa are electrically connected to each other via the top plate 23. The top plate 23 is conducted to the respective VNW diodes 61Aa as a conductive film of one layer as a whole, for example. Note that in place of the top plate 23 of one layer connected to the plural VNW diodes 61Aa, it is also possible to provide plural top plates each connected to each of the VNW diodes 61Aa by corresponding to the individual VNW diodes 61Aa. Further, it is also possible that the top plate 23 is not formed, and a local interconnect or a contact plug electrically connecting each of the VNW diodes 61Aa is formed.

On the other hand, a top plate which is connected to the upper end portion 62b is not formed on the dummy VNW diode 61C, and there is no electrical connection between the upper end portion 62b and another contact plug, wiring, or the like. Since the dummy VNW diode 61C has the upper end portion 62b which is not connected to the electric conductor as described above and thus is in an electrically isolated state, the dummy VNW diode 61C does not function as a diode.

On the top plate 23, plural contact plugs 64 are arranged in a matrix form in a plane view, and the respective contact plugs 64 are electrically connected to the top plate 23. The respective contact plugs 64 are arranged by being overlapped with the respective semiconductor nanowires 62 positioned below in a plane view. Note that the respective contact plugs 64 are sometimes arranged at positions displaced with respect to those of the respective semiconductor nanowires 62 positioned below in a plane view.

At the periphery of the outside of the VNW diode arrangement region 70, plural contact plugs 63 are arranged side by side along two sides extending in the X direction and two sides extending in the Y direction (only one side of the right end is illustrated in FIG. 29) in a plane view, so as to surround the VNW diode arrangement region 70. The contact plug 63 is brought into contact with the silicide layer 16 at the bottom surface, and is electrically connected to the lower end portion 62a via the silicide layer 16 and the bottom region 15. On the contact plugs 63 arranged along the two sides along the X direction in a plane view, out of the plural contact plugs 63, local interconnectors 65 connected to these contact plugs 63 extend along the two sides, respectively, extending in the X direction. On the contact plugs 63 arranged along the two sides extending in the Y direction in a plane view, contact plugs 66 are respectively formed. Note that although the contact plugs 63 and the local interconnectors 65 thereon are formed separately, they may also be integrally formed. Further, in the other embodiments and various modified examples, it is also possible that the contact plugs and the local interconnects are separately formed.

On the contact plugs 64, a Pad wiring 57 is formed. On the local interconnectors 65 and the contact plugs 66, a VDD power supply wiring 56 is formed. Each of the Pad wiring 57 and the Vdd power supply wiring 56 may be arranged in a linear form (band form) in a manner that they are arranged to be parallel to each other in a plane view, for example (parallel in the Y direction in FIG. 29, for example). Each of the Pad wiring 57 and the Vdd power supply wiring 56 may also be arranged in a manner that, for example, they wind or a part thereof intersects in a plane view via a different wiring layer.

Note that when VNW diodes and dummy VNW diodes are provided in the second diode region 53B similarly to the first diode region 53A, the Pad wiring 57 is provided instead of the Vdd power supply wiring 56, and a Vss power supply wiring 55 is provided instead of the Pad wiring 57 in FIG. 29.

The Pad wiring 57 is electrically connected to the respective contact plugs 64. The Pad wiring 57 includes a wiring portion 57a and via portions 57b which are integrally formed, and has a dual damascene structure. The via portions 57b are brought into contact with the contact plugs 64. The Vdd power supply wiring 56 is electrically connected to the respective contact plugs 65, 66. The Vdd power supply wiring 56 includes not-illustrated wiring portion and via portions which are integrally formed, and has a dual damascene structure. The via portions are brought into contact with the contact plugs 65, 66. Note that it is also possible to employ a single damascene structure in a manner that the respective wiring portion 57a and via portions 57b are separately formed. In this case, the wiring portion 57a and the via portion 57b may be formed with mutually different materials. Besides, the respective wiring portion and via portions of the Vdd power supply wiring 56 may also employ a single damascene structure, and may also be formed with different materials, in a similar manner.

The VNW diodes 61Aa, the dummy VNW diodes 61C, and the contact plugs 63 are formed in the insulating film 31 and the interlayer insulating films 32, 33. The top plate 23, and the contact plugs 64, 65, 66 are formed in the interlayer insulating film 34. The Vdd power supply wiring 56 and the Pad wiring 57 (and the Vss power supply wiring 55) are formed in the interlayer insulating film 35.

In the present embodiment, in the VNW diode arrangement region 70, the plural VNW diodes 61Aa which actually function as diodes are provided on the inner side in a plane view, and the dummy VNW diodes 61C are provided on the outer side in a plane view so as to surround these VNW diodes 61Aa. In the VNW diode arrangement region in which the plural VNW diodes are aggregated, the VNW diodes positioned at a peripheral part of the region have different dimensions, different impurity profiles, and the like due to a manufacturing variation when compared to the VNW diodes positioned on the inner side of the VNW diode arrangement region, resulting in that various characteristics of the VNW diodes vary. In the present embodiment, the dummy VNW diodes 61C are arranged at positions along the outer periphery in the VNW diode arrangement region 70. For this reason, because of the presence of the dummy VNW diodes 61C, the variation in dimensions, impurity profiles, and the like of the VNW diodes 61Aa during a manufacturing process, is suppressed. Consequently, the variation in characteristics of the VNW diodes 61Aa is suppressed.

Note that in the present embodiment, the conductivity types of the bottom region 15 and the lower end portion 62a are set to the N-type, and the conductivity types of the upper end portion 62b and the middle portion 62c are set to the P-type, but, respectively opposite conductivity types may also be employed. In the present embodiment, an ESD current flows through the semiconductor nanowire 62 from the upper end portion 62b toward the lower end portion 62a. Meanwhile, when the opposite conductivity types are employed as described above, the ESD current flows through the semiconductor nanowire 62 from the lower end portion 62a toward the upper end portion 62b. In this case, the lower end portion 62a of the VNW diode 61Aa is electrically connected to the Pad wiring 57, and the upper end portion 62b of the VNW diode 61Aa is electrically connected to the Vdd power line 56. In like manner, in the diode 61C in FIG. 28C formed in the second diode region 53b, the lower end portion 62a is electrically connected to the Vss power line 55, and the upper end portion 62b is electrically connected to the Pad wiring 57.

Further, regarding the transistors provided in the protection circuit 52 being an object to be protected from a surge current, it is also possible to apply the VNW diodes and the dummy VNW diodes (or the VNS diodes and the dummy VNS diodes) of the first embodiment or the various modified examples thereof. Further, as diodes other than the diodes in the ESD protection circuit, the diodes of the present embodiment may also be applied.

Further, although the ESD protection diodes are exemplified as the VNW diodes in the present embodiment, it is also possible to use different kinds of VNW diodes other than the ESD protection diodes.

MODIFIED EXAMPLES

Hereinafter, various modified examples of the semiconductor device of the third embodiment will be described.

Modified Example 1

Figure 31:
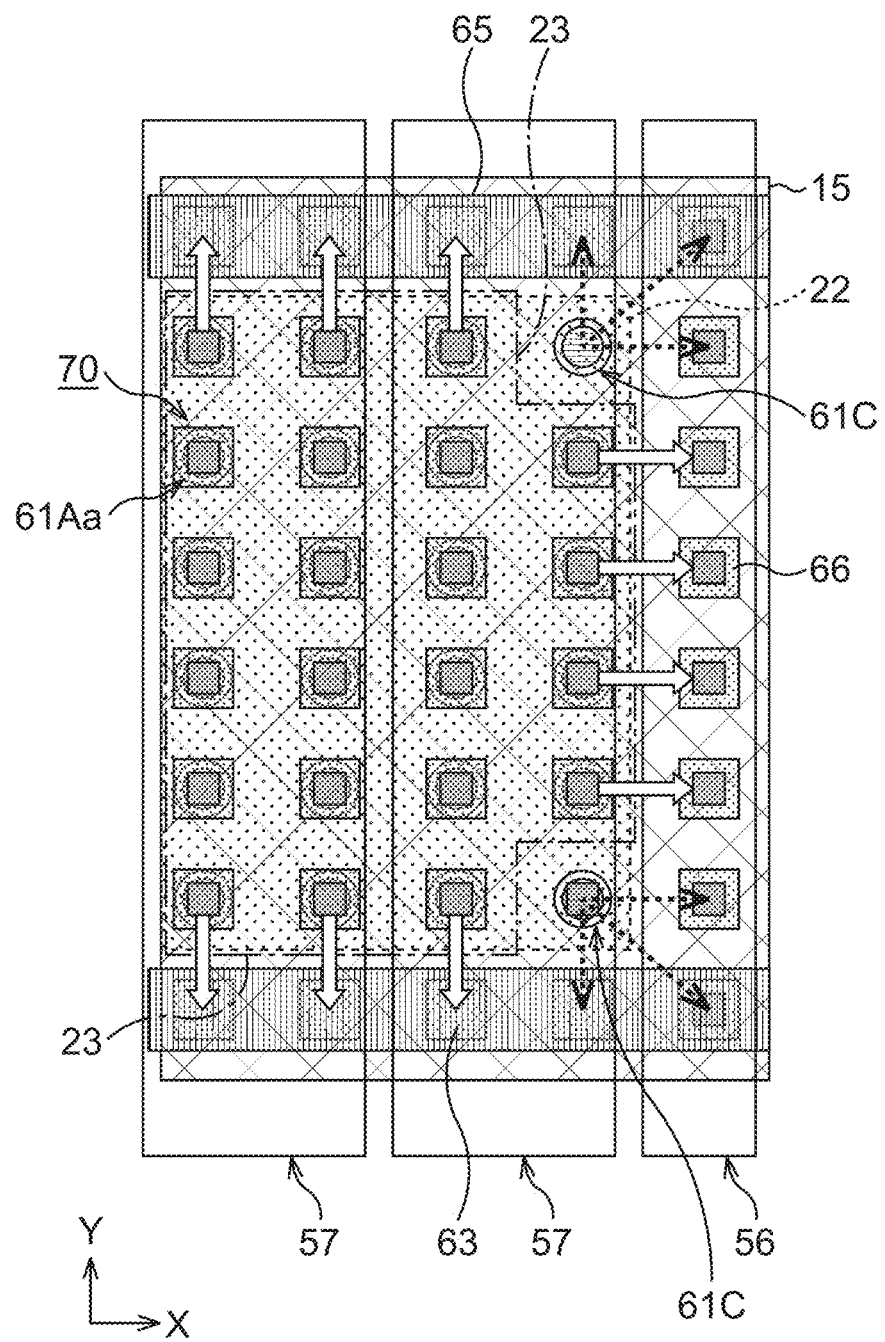
FIG. 31 is a plan view illustrating a part of a schematic configuration of a semiconductor device including VNW diodes according to a modified example 1 of the third embodiment.

FIG. 31 is a plan view illustrating a part of a schematic configuration of a semiconductor device including VNW diodes according to a modified example 1 of the third embodiment.

In the present example, in the VNW diode arrangement region 70, the dummy VNW diode 61C is arranged only on each of four corners (only two corners on the right side are illustrated in FIG. 31), and plural VNW diodes 61Aa arranged in a matrix form are surrounded by the four dummy VNW diodes 61C.

The Vdd power supply wiring 56 extends on the contact plugs 66 arranged in a line in the Y direction in a plane view and the local interconnectors 65 by being connected to these plugs and local interconnectors. Each of the Pad wirings 57 is connected onto the contact plugs 64 arranged in two lines in the Y direction in a plane view, and extend above the local interconnectors 65 while being separated therefrom.

In the semiconductor device of the present example, the configuration other than the above is similar to that of the third embodiment.

Each of a solid line arrow mark and a dotted line arrow mark in FIG. 31 indicates a path through which the ESD current flows. When, tentatively, four corners in the VNW diode arrangement region are used for the VNW diodes, the ESD current flowed via the Pad wirings 57 flows toward the contact plugs 63 at the outer periphery. At this time, since there are a large number of the contact plugs 63 arranged in the vicinity of the VNW diodes at the four corners, the ESD current that flows in the direction indicated by the dotted line arrow mark in FIG. 31, concentrates on the VNW diodes at the four corners, which may cause breakage of the VNW diodes. In the present embodiment, the dummy VNW diodes 61C are arranged at the four corners in the VNW diode arrangement region 70, the concentration of the ESD current on the VNW diodes 61Aa is suppressed.

In the present example, because of the presence of the dummy VNW diodes 61C, the variation in dimensions, impurity profiles, and the like of the VNW diodes 61Aa during a manufacturing process, is suppressed. Consequently, the variation in characteristics of the VNW diodes 61Aa is suppressed. Note that it is also possible to design such that in the VNW diode arrangement region 70, the dummy VNW diodes 61C are arranged at positions along the outer periphery, and at positions corresponding to four corners of the VNW diodes 61Aa on the inner side of the arranged dummy VNW diodes 61C, the dummy VNW diodes 61C are further arranged.

Modified Example 2

Figure 32:
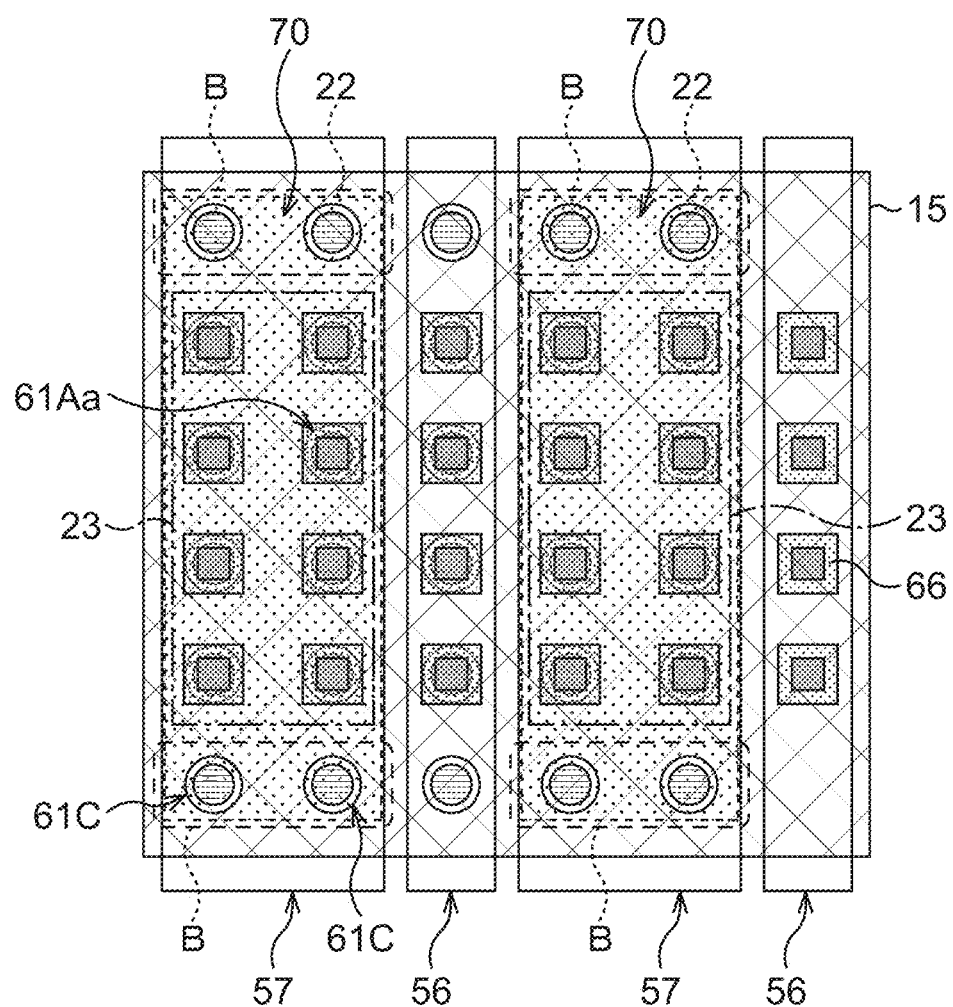
FIG. 32 is a plan view illustrating a part of a schematic configuration of a semiconductor device including VNW diodes according to a modified example 2 of the third embodiment.

FIG. 32 is a plan view illustrating a part of a schematic configuration of a semiconductor device including VNW diodes according to a modified example 2 of the third embodiment.

In the present example, plural VNW diode arrangement regions 70 are arranged in the X direction, for example. In each of the VNW diode arrangement regions 70, plural (eight in the example of FIG. 32) VNW diodes 61Aa are arranged in a matrix form, and on each of two sides along the X direction on the outside of these VNW diodes 61Aa, plural (two in the example of FIG. 32) dummy VNW diodes 61C are arranged. In FIG. 32, a part in which the dummy VNW diodes 61C are formed side by side is indicated by being surrounded by a dotted line frame B.

In each of the VNW diode arrangement region 70, the top plate 23 of one layer is formed on the plural VNW diodes 61Aa, and the top plate 23 is conducted to the respective VNW diodes 61Aa as a conductive film of one layer. On the other hand, a top plate which is connected to the upper end portion 62b is not formed on the dummy VNW diode 61C, and there is no electrical connection between the upper end portion 62b and another contact plug, wiring, or the like. Since the dummy VNW diode 61C has the upper end portion 62b which is in an electrically isolated state as described above, it does not function as a diode.

The Vdd power supply wiring 56 extends by being connected onto the contact plugs 66 arranged in a line in the Y direction in a plane view. The Pad wiring 57 is connected onto the contact plugs 64 arranged in two lines in the Y direction in a plane view, and extends above the dummy VNW diodes 61C while being separated therefrom.

In the semiconductor device of the present example, the configuration other than the above is similar to that of the third embodiment.

Note that also in the present example, it is also possible to provide plural dummy VNW diodes arranged along the Y direction, at predetermined positions of the left and right ends, similarly to the second embodiment.

In the present example, because of the presence of the dummy VNW diodes 61C, the variation in dimensions, impurity profiles, and the like of the VNW diodes 61Aa during a manufacturing process, is suppressed. Consequently, the variation in characteristics of the VNW diodes 61Aa is suppressed.

Fourth Embodiment

Figure 33:
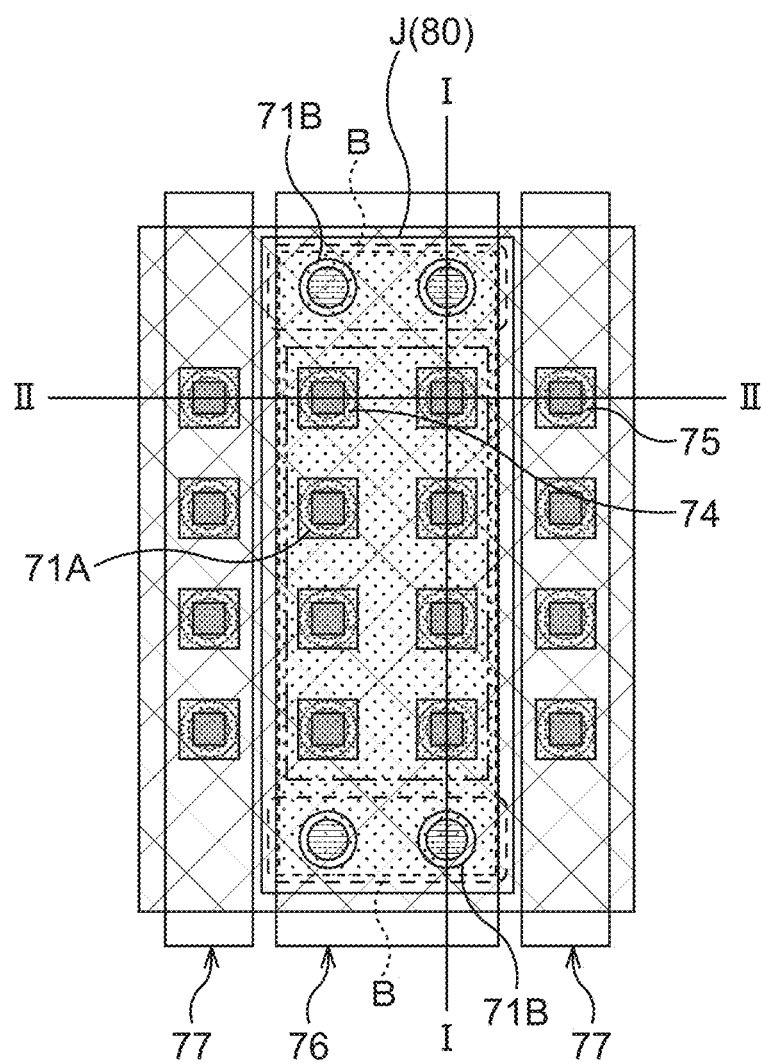
FIG. 33 is a plan view illustrating a part of a schematic configuration of a semiconductor device including VNW resistor elements according to a fourth embodiment.
Figure 34:
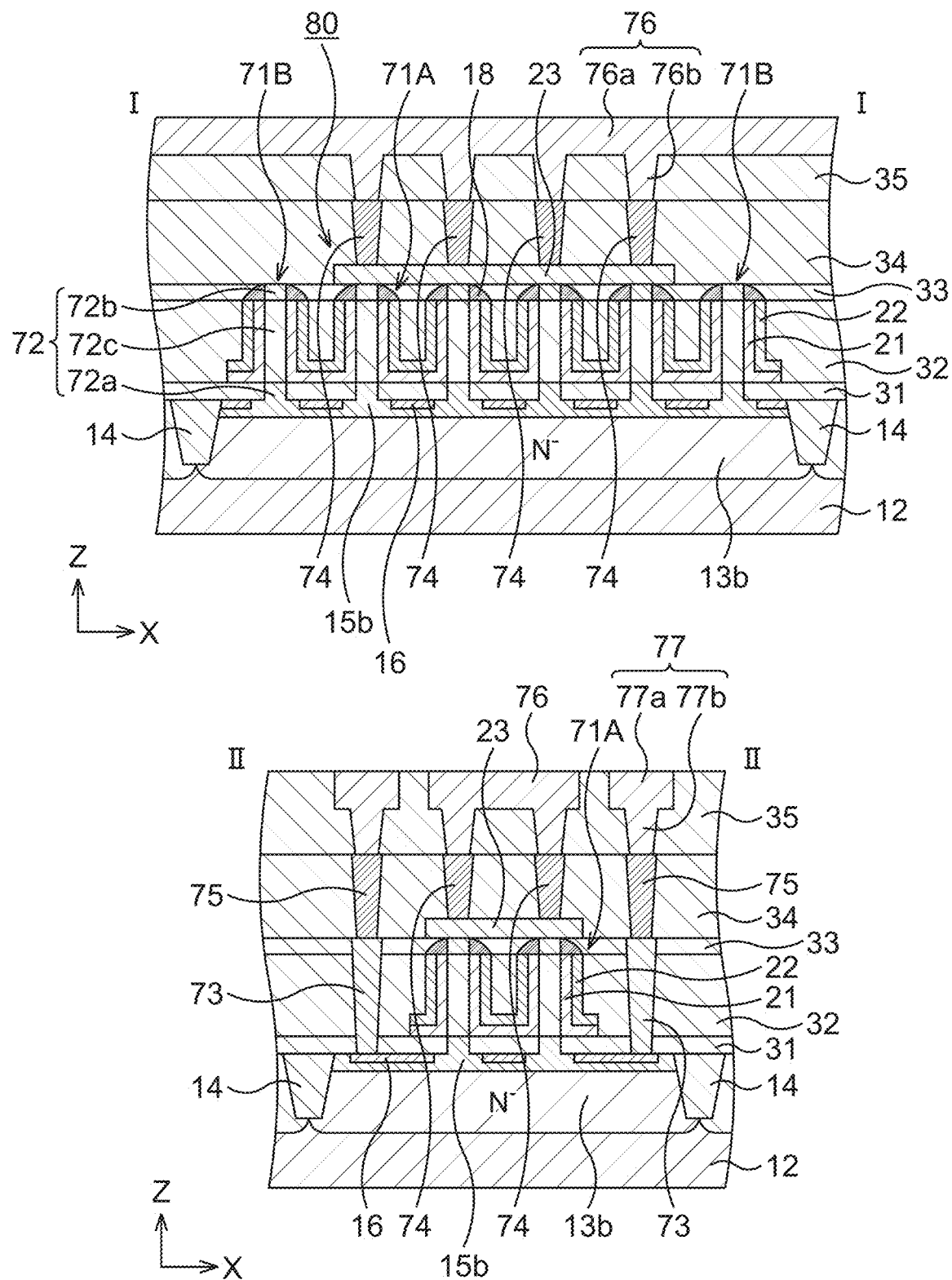
FIG. 34 is a sectional view illustrating a cross section taken along a line segment I-I and a line segment II-II in FIG. 33.

The present embodiment discloses a semiconductor device including VNW resistor elements as VNW elements. FIG. 33 is a plan view illustrating a part of a schematic configuration of a semiconductor device including VNW resistor elements according to a fourth embodiment. FIG. 34 is a sectional view illustrating a cross section taken along a line segment I-I and a line segment II-II in FIG. 33.

In the semiconductor device according to the present embodiment, a VNW resistor element arrangement region 80 is provided. The VNW resistor element arrangement region 80 is, for example, a rectangular region having a side extending in the X direction and a side extending in the Y direction in a plane view. The VNW resistor element arrangement region 80 is indicated by a solid line frame J in FIG. 33, for example. In the VNW resistor element arrangement region 80, plural (eight in the example of FIG. 33) VNW resistor elements 71A are arranged in a matrix form, and on each of two sides along the X direction on the outside of these VNW resistor elements 71A, plural (two in the example of FIG. 33) dummy VNW resistor elements 71B are arranged. In FIG. 33, a part in which the dummy VNW resistor elements 71B are formed side by side is indicated by being surrounded by a dotted line frame B. Note that in the VNW resistor element group 80, the VNW resistor elements 71A and the dummy VNW resistor elements 71B at the periphery of the VNW resistor elements 71A may also be arranged in a form other than the matrix form in a plane view. The number of the VNW resistor elements 71A and the dummy VNW resistor elements 71B to be arranged may also be different from the above-described number.

As illustrated in FIG. 34, in a region of a semiconductor substrate 12 demarcated by an STI element isolation region 14, a well 13b having a conductivity type of N-type, for example, is formed. On an upper part of the N-well 13b, a bottom region 15b having a conductivity type of P-type is formed. On the surface of the semiconductor substrate 12, which is also an upper part of the bottom region 15b, a silicide layer 16 is formed.

On the semiconductor substrate 12, plural projecting semiconductor nanowires 72 are formed vertically from the surface of the semiconductor substrate 12. As illustrated in FIG. 33, the plural semiconductor nanowires 72 are arranged in a matrix form in a plane view. Each of the plural semiconductor nanowires 72 is formed with a VNW resistor element having a lower end portion 72a, an upper end portion 72b, and a middle portion 72c between the lower end portion 72a and the upper end portion 72b. The plural VNW resistor elements are made as the VNW resistor elements 71A and the dummy VNW resistor elements 71B on the two sides at the periphery of the VNW resistor elements 71A, as described above. Each of the lower end portion 72a, the upper end portion 72b, and the middle portion 72c has a conductivity type of P-type, and the lower end portion 72a is electrically connected to the bottom region 15b. On side surfaces of the upper end portion 72b, a sidewall 18 of an insulating film is formed. The lower end portions 72a of the plural semiconductor nanowires 72 are electrically connected to each other by the bottom region 15b. Note that a P-type impurity concentration of the middle portion 72c may be lower than or the same as an impurity concentration of the lower end portion 72a and the upper end portion 72b. Further, it is also possible to form the bottom region, and the lower end portions, the upper end portions, and the middle portions of the semiconductor nanowires so that all of them have N-type conductivity types. Further, when the semiconductor substrate 12 is an N-type substrate, the formation of the N-well 13b may be omitted. A planar shape of the semiconductor nanowire 72 may be, for example, a circular shape, an elliptical shape, a quadrangular shape, or a shape extending in one direction.

On side surfaces of each of the semiconductor nanowires 72, a gate electrode 22 is formed via a gate insulating film 21. In the present embodiment, the gate electrode 22 for the plural semiconductor nanowires 72 is formed as a conductive film of one layer as a whole. Note that the gate insulating film 21 and the gate electrode 22 are formed simultaneously with a gate insulating film and a gate electrode for a transistor formed in another region of the semiconductor device, for example, and the formation thereof with respect to VNW resistor elements and dummy VNW resistor elements may also be omitted.

On the plural VNW resistor elements 71A, a top plate 23 of one layer being a conductive film of silicide, metal, or the like, is formed. The upper end portions 72b of the semiconductor nanowires 72 of the respective VNW resistor elements 71A are electrically connected to each other via the top plate 23. The top plate 23 is conducted to the respective VNW resistor elements 71A as a conductive film of one layer as a whole, for example. Note that in place of the top plate 23 of one layer connected to the plural VNW resistor elements 71A, it is also possible to provide plural top plates each connected to each of the VNW resistor elements 71A by corresponding to the individual VNW resistor elements 71A.

On the other hand, a top plate which is connected to the upper end portion 72b is not formed on the dummy VNW resistor element 71B, and there is no electrical connection between the upper end portion 72b and another contact plug, wiring, or the like. Since the dummy VNW resistor element 71B has the upper end portion 72b which is not connected to the electric conductor as described above and thus is in an electrically isolated state, the dummy VNW resistor element 71B is in an electrically floating state and does not function as a resistor element.

On the top plate 23, plural contact plugs 74 are arranged in a matrix form in a plane view, and the respective contact plugs 74 are electrically connected to the top plate 23. The respective contact plugs 74 are arranged by being overlapped with the respective semiconductor nanowires 72 positioned below in a plane view. Note that the respective contact plugs 74 are sometimes arranged at positions displaced with respect to those of the respective semiconductor nanowires 72 positioned below in a plane view.

At the periphery of the VNW resistor element arrangement region 80, plural contact plugs 73 are arranged side by side along two sides extending in the Y direction in a plane view. The contact plug 73 is brought into contact with the silicide layer 16 at the bottom surface, and is electrically connected to the lower end portion 72a via the silicide layer 16 and the bottom region 15b. On the contact plugs 73, contact plugs 75 are respectively formed.

On the contact plugs 74, a wiring 76 is formed. On the contact plugs 75, a wiring 77 is formed. Each of the wiring 76 and the wiring 77 may be arranged in a linear form (band form) in a manner that they are arranged to be parallel to each other in a plane view, for example (parallel in the Y direction in FIG. 33, for example). Each of the wiring 76 and the wiring 77 may also be arranged in a manner that, for example, they wind or a part thereof intersects via an insulating film.

The wiring 76 is electrically connected to the respective contact plugs 74. The wiring 76 includes a wiring portion 76a and via portions 76b which are integrally formed, and has a dual damascene structure. The via portions 76b are brought into contact with the contact plugs 74. The wiring 77 is electrically connected to the respective contact plugs 75. Note that it is also possible to employ a single damascene structure in a manner that the respective wiring portion 76a and via portions 76b are separately formed. In this case, the wiring portion 76a and the via portion 76b may be formed with mutually different materials. The wiring 77 includes a wiring portion 77a and via portions 77b which are integrally formed, and has a dual damascene structure. The via portions 77b are brought into contact with the contact plugs 75. The respective wiring portion 77a and via portions 77b of the wiring 77 may also employ a single damascene structure, and may also be formed with different materials, in a similar manner.

The VNW resistor elements 71A, 71B, and the contact plugs 73 are formed in the insulating film 31 and the interlayer insulating films 32, 33. The top plate 23, and the contact plugs 74, 75 are formed in the interlayer insulating film 34. The wirings 76, 77 are formed in the interlayer insulating film 35.

In the present embodiment, in the VNW resistor element arrangement region 80, the plural VNW resistor elements 71A which actually function as resistor elements are provided on the inner side, and the dummy VNW resistor elements 71B are provided on the outer side so as to surround these VNW resistor elements 71A. In the VNW resistor element arrangement region in which the plural VNW resistor elements are aggregated, the VNW resistor elements positioned at a peripheral part of the region have different dimensions, different impurity profiles, and the like due to a manufacturing variation when compared to the VNW resistor elements positioned on the inner side of the VNW resistor element group, resulting in that various characteristics of the VNW resistor elements vary. In the present embodiment, the dummy VNW resistor elements 71B are arranged on the outer side part in the VNW resistor element arrangement region 80. For this reason, because of the presence of the dummy VNW resistor elements 71B, the variation in dimensions, impurity profiles, and the like of the VNW resistor elements 71A during a manufacturing process, is suppressed. Consequently, the variation in characteristics of the VNW resistor elements 71A is suppressed.

Note that in the present embodiment, the wiring 76 is arranged by being sandwiched by two wirings 77, but, it is also possible to arrange the wiring 77 only on one side of the wiring 76.

Further, although the present embodiment exemplifies a case where one VNW resistor element arrangement region 80 is arranged, it is also possible that plural VNW resistor element arrangement regions 80 are arranged side by side in the X direction, for example, in accordance with a required resistance value and the like.

Note that it is also possible to realize a semiconductor device including two kinds, three kinds, or all of four kinds selected from the VNW transistors and the dummy VNW transistors in the first and second embodiments and the various modified examples thereof, the VNW diodes and the dummy VNW diodes in the third embodiment and the various modified examples thereof, and the VNW resistor elements and the dummy VNW resistor elements in the fourth embodiment. Further, it is also possible to provide dummies for elements using VNW other than the above, for example, capacitor elements, and so on, similarly to the respective embodiments and the various modified examples.

It should be noted that the first to fourth embodiments and the various modified examples thereof merely illustrate concrete examples of implementing the present invention, and the technical scope of the present invention is not to be construed in a restrictive manner by these embodiments and various modified examples thereof. That is, the present invention may be implemented in various forms without departing from the technical spirit or main features thereof.

According to the above-described examples, a semiconductor device capable of suppressing variation in characteristics of functional elements each of which is provided with a projection having a semiconductor material, is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
a semiconductor substrate;
a functional element provided with a first projection formed on the semiconductor substrate, having a semiconductor material, and having a lower end and an upper end;
a contact plug;
a dummy functional element provided with a second projection formed on the semiconductor substrate, having a semiconductor material, having a lower end and an upper end that are electrically connected via the contact plug, and arranged side by side with the first projection in a plane view; and
a first wiring formed above the first projection and above the second projection, electrically connected to the upper end of the first projection, and electrically isolated from the upper end of the second projection.

2. The semiconductor device according to claim 1, further comprising:
a first conductive film connected between the upper end of the first projection and the first wiring, wherein the first conductive film is not connected to the upper end of the second projection.

3. The semiconductor device according to claim 1, further comprising:
a first conductive film connected between the upper end of the first projection and the first wiring; and
a second conductive film connected to the upper end of the second projection and electrically isolated from the first conductive film.

4. The semiconductor device according to claim 1, further comprising:
a first electrode formed on side surfaces of the first projection; and
a second electrode integrally formed with the first electrode, on side surfaces of the second projection.

5. The semiconductor device according to claim 1, wherein:
a projection arrangement region in which a plurality of the first projections and the second projection are arranged, is provided;
a plurality of the first projections have the upper ends which are electrically connected to each other, and the lower ends which are electrically connected to each other, and a plurality of the first projections are arranged by being adjacent to each other in a plane view; and
the second projection is arranged at a position which is a periphery of the first projections and which is along an outer periphery of the projection arrangement region in a plane view.

6. The semiconductor device according to claim 5, wherein:
the projection arrangement region has a rectangular shape in a plane view;
a plurality of the second projections are arranged at positions along four sides of the projection arrangement region in a plane view; and
a plurality of the first projections are arranged by being surrounded by a plurality of the second projections in a plane view.

7. The semiconductor device according to claim 5, wherein:
the projection arrangement region has a rectangular shape in a plane view;
a plurality of the second projections are arranged along facing two sides out of four sides of the projection arrangement region in a plane view; and
a plurality of the first projections are arranged between a plurality of the second projections arranged along the two sides in a plane view.

8. The semiconductor device according to claim 5, wherein:
the projection arrangement region has a rectangular shape in a plane view;
the second projections are arranged at positions of corners of the projection arrangement region in a plane view; and
a plurality of the first projections are arranged by being adjacent to the second projections arranged at the positions of the corners, on four sides of the projection arrangement region.

9. The semiconductor device according to claim 1, wherein the functional element is at least one kind selected from a transistor, a diode, and a resistor element.

10. A semiconductor device, comprising:
a semiconductor substrate;
a functional element provided with a first projection formed on the semiconductor substrate, having a semiconductor material, and having a lower end and an upper end;
a dummy functional element provided with a second projection formed on the semiconductor substrate, having a semiconductor material, having a lower end and an upper end, and arranged side by side with the first projection in a plane view;
a first wiring formed above the first projection and above the second projection, electrically connected to the upper end of the first projection, and electrically isolated from the upper end of the second projection;
a first electrode formed on side surfaces of the first projection; and
a second electrode formed on side surfaces of the second projection, and electrically isolated from the first electrode,
wherein the upper end of the second projection and the lower end of the second projection of the dummy functional element, and the second electrode are electrically connected.

11. The semiconductor device according to claim 10, further comprising:
a first conductive film connected between the upper end of the first projection and the first wiring, wherein the first conductive film is not connected to the upper end of the second projection.

12. The semiconductor device according to claim 10, further comprising:
a first conductive film connected between the upper end of the first projection and the first wiring; and
a second conductive film connected to the upper end of the second projection and electrically isolated from the first conductive film.

13. The semiconductor device according to claim 10, wherein:
- a projection arrangement region in which a plurality of the first projections and the second projection are arranged, is provided;
- a plurality of the first projections have the upper ends which are electrically connected to each other, and the lower ends which are electrically connected to each other, and a plurality of the first projections are arranged by being adjacent to each other in a plane view; and
- the second projection is arranged at a position which is a periphery of the first projections and which is along an outer periphery of the projection arrangement region in a plane view.

14. The semiconductor device according to claim 13, wherein:
- the projection arrangement region has a rectangular shape in a plane view;
- a plurality of the second projections are arranged at positions along four sides of the projection arrangement region in a plane view; and
- a plurality of the first projections are arranged by being surrounded by a plurality of the second projections in a plane view.

15. The semiconductor device according to claim 13, wherein:
- the projection arrangement region has a rectangular shape in a plane view;
- a plurality of the second projections are arranged along facing two sides out of four sides of the projection arrangement region in a plane view; and
- a plurality of the first projections are arranged between a plurality of the second projections arranged along the two sides in a plane view.

16. The semiconductor device according to claim 13, wherein:
- the projection arrangement region has a rectangular shape in a plane view;
- the second projections are arranged at positions of corners of the projection arrangement region in a plane view; and
- a plurality of the first projections are arranged by being adjacent to the second projections arranged at the positions of the corners, on four sides of the projection arrangement region.

17. The semiconductor device according to claim 10, wherein the functional element is at least one kind selected from a transistor, a diode, and a resistor element.

* * * * *